United States Patent
Hakii et al.

(10) Patent No.: US 10,355,236 B2
(45) Date of Patent: Jul. 16, 2019

(54) TRANSPARENT ELECTRODE AND ELECTRONIC DEVICE

(71) Applicant: Konica Minolta, Inc., Tokyo (JP)

(72) Inventors: Takeshi Hakii, Sagamihara (JP); Kazuhiro Yoshida, Hachioji (JP)

(73) Assignee: KONICA MINOLTA, INC., Tokyo (JP)

(*) Notice: Subject to any disclaimer, the term of this patent is extended or adjusted under 35 U.S.C. 154(b) by 436 days.

(21) Appl. No.: 14/353,591

(22) PCT Filed: Oct. 25, 2012

(86) PCT No.: PCT/JP2012/077615
§ 371 (c)(1),
(2) Date: Apr. 23, 2014

(87) PCT Pub. No.: WO2013/073356
PCT Pub. Date: May 23, 2013

(65) Prior Publication Data
US 2014/0272398 A1   Sep. 18, 2014

Related U.S. Application Data

(63) Continuation of application No. PCT/JP2012/077615, filed on Oct. 25, 2012.

(30) Foreign Application Priority Data

Nov. 17, 2011   (JP) .................. 2011-252003

(51) Int. Cl.
H01L 51/52     (2006.01)
B32B 15/04     (2006.01)
H05B 33/28     (2006.01)

(52) U.S. Cl.
CPC .......... H01L 51/5234 (2013.01); B32B 15/04 (2013.01); H01L 51/5215 (2013.01);
(Continued)

(58) Field of Classification Search
None
See application file for complete search history.

(56) References Cited

U.S. PATENT DOCUMENTS

2007/0128465 A1* 6/2007 Liu .................. H01L 51/5048
   428/689
2009/0009101 A1* 1/2009 Kang .................. H01L 27/3209
   315/250
(Continued)

FOREIGN PATENT DOCUMENTS

JP    2002-015623    1/2002
JP    2006-164961    6/2006
(Continued)

OTHER PUBLICATIONS

English Translation of Katakura et al. (JP 2010/251675), dated Nov. 2010.*

(Continued)

*Primary Examiner* — Ronak C Patel
(74) *Attorney, Agent, or Firm* — Lucas & Mercanti, LLP

(57) ABSTRACT

Provided is a transparent electrode having both sufficient conductivity and light transmittance, as well as an electronic device whose performance is improved by using the transparent electrode. A transparent electrode (1) includes: a nitrogen-containing layer (1a) formed by using a compound containing nitrogen atom; and an electrode layer (1b) formed adjacent to the nitrogen-containing layer (1a) by using silver or an alloy having silver as a main component.

12 Claims, 3 Drawing Sheets

(52) U.S. Cl.
CPC .......... *H05B 33/28* (2013.01); *B32B 2457/00* (2013.01); *Y10T 428/265* (2015.01); *Y10T 428/31678* (2015.04)

(56) References Cited

U.S. PATENT DOCUMENTS

| | | | |
|---|---|---|---|
| 2009/0039769 A1* | 2/2009 | Matsunami | H01L 51/0056 313/504 |
| 2010/0072884 A1 | 3/2010 | Saint Gobain | |
| 2010/0225227 A1* | 9/2010 | Tchakarov | C03C 17/36 313/504 |
| 2010/0225229 A1* | 9/2010 | Hosoda | B82Y 20/00 313/504 |
| 2011/0057920 A1 | 3/2011 | Matsuura et al. | |
| 2011/0309739 A1* | 12/2011 | Song | H01L 51/5088 313/504 |

FOREIGN PATENT DOCUMENTS

| | | |
|---|---|---|
| JP | 2008-101114 A | 5/2008 |
| JP | 2009-15 963 | 7/2009 |
| JP | 2010-251675 A | 11/2010 |
| JP | 2011-054746 A | 3/2011 |
| JP | 2011-077028 A | 4/2011 |
| WO | WO2011046165 | 4/2011 |

OTHER PUBLICATIONS

English Translation of Kawabe et al. JP 2011-054419, dated Mar. 2011 (Year: 2011).*
Office Action dated Sep. 15, 2015 for corresponding JP Patent Appln. No. 2013-544201; with English translation.
European Search Report for corresponding EP Patent Appln. No. 12848860, dated Oct. 23, 2015.
Office Action dated Jul. 16, 2018 from corresponding European Application No. 12848860.8.

* cited by examiner

TRANSPARENT ELECTRODE AND ELECTRONIC DEVICE

CROSS REFERENCE TO RELATED APPLICATION

This Application is a 371 of PCT/JP2012/077615 filed on Oct. 25, 2012 which, in turn, claimed the priority of Japanese Patent Application No. JP2011-252003 filed on Nov. 17, 2011 both applications are incorporated herein by reference.

TECHNICAL FIELD

The present invention relates to a transparent electrode and an electronic device, and more particularly, to a transparent electrode having electrical conductivity and light transmissibility, and an electronic device using such a transparent electrode.

BACKGROUND ART

An organic electroluminescence element (i.e., a so-called organic EL element) using electroluminescence (referred to as EL hereinafter) of an organic material is a thin-film type completely-solid element capable of emitting light at a low voltage of several volts to several tens volts, and has many excellent features such as high brightness, high luminous efficiency, thin in thickness, light in weight and the like. Therefore, recently the organic electroluminescence element has attracted attention as a backlight for various kinds of displays, a display board (such as a signboard, an emergency light or the like), and a planar light-emitting body such as a light source for a lighting fixture.

Such an organic electroluminescence element is configured by two layers of electrodes, and a light emitting layer formed of an organic material sandwiched between the two layers of electrodes; and the light emitted by the light emitting layer is transmitted through the electrode(s) and extracted to the outside. Thus, at least one of the two layers of electrodes is configured as a transparent electrode.

Generally, the transparent electrode is formed by an oxide semiconductor material, such as indium tin oxide ($SnO_2$—$In_2O_3$) or the like; however, there is also a proposal in which the transparent electrode is formed by laminating ITO and silver to reduce resistance (see, for example, Patent Documents 1 and 2). However, since ITO contains indium, which is a rare metal, the material cost goes up; and further, in order to reduce resistance, it is necessary to perform an annealing treatment at about 300° C. after film-formation. To solve such problem, there is proposal in which the transparent electrode has a configuration in which a metal material with high electrical conductivity, such as silver, is formed into a thin-film, or a configuration in which aluminum is mixed into silver to thereby form a film having a film-thickness less than that formed by silver only to ensure electrical conductivity (see, for example, Patent Document 3).

PRIOR ART DOCUMENTS

Patent Documents

[Patent Document 1] Japanese Unexamined Patent Application Publication No. 2002-15623
[Patent document 2] Japanese Unexamined Patent Application Publication No. 2006-164961
[Patent document 3] Japanese Unexamined Patent Application Publication No. 2009-151963

DISCLOSURE OF THE INVENTION

Problems to be Solved by the Invention

However, even the transparent electrode is configured by silver and/or aluminum which have high electrical conductivity, it is difficult to obtain sufficient electrical conductivity and light transmissibility at the same time.

In view of the aforesaid problems, it is an object of the present invention to provide a transparent electrode having sufficient electrical conductivity and light transmissibility, as well as an electronic device whose performance is improved by using the transparent electrode.

Means for Solving the Problems

The aforesaid object of the present invention is achieved by the following configurations.
1. Configuration 1 is a transparent electrode including: a nitrogen-containing layer formed by using a compound containing nitrogen atom; and an electrode layer formed adjacent to the nitrogen-containing layer by using silver or an alloy having silver as a main component.
2. Configuration 2 is a transparent electrode according to configuration 1, wherein the compound containing nitrogen atom has a heterocycle with a nitrogen atom as a hetero atom.
3. Configuration 3 is a transparent electrode according to configuration 1 or 2, wherein the compound containing nitrogen atom includes a pyridine group.
4. Configuration 4 is a transparent electrode according to any one of configurations 1 to 3, wherein the compound containing nitrogen atom contains a compound represented by General Formula (1), $$(Ar1)n1\text{-}Y1 \qquad \text{General Formula (1)}$$

where
n1 represents an integer of 1 or greater, Y1 represents a substituent if n1 is equal to 1, or a bond or an n1-valent linking group if n1 is equal to or greater than 2;
Ar1 represents a group represented by below-mentioned General Formula (A), and if n1 is equal to or greater than 2, a plurality of pieces of Ar1 may either be the same, or be different from each other;
the compound represented by General Formula (1) has, in the molecule, at least two condensed aromatic heterocycles each formed by condensing three or more rings,

[Chemical Formula 1]

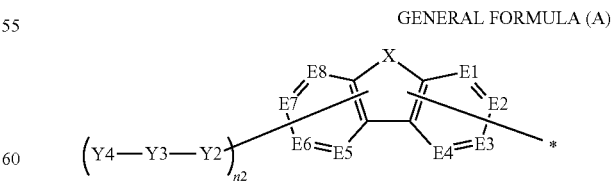

GENERAL FORMULA (A)

where
X represents —N(R)—, —O—, —S— or —Si(R)(R')—, and E1 to E8 each represent —C(R1)= or —N=, wherein R, R' and R1 each represent a hydrogen atom, a substituent or a linking site with Y1;

* represents a linking site with Y1, and Y2 represents a bond or a divalent linking group;

Y3 and Y4 each represent a group derived from a 5-membered or 6-membered aromatic ring, wherein at least one of Y3 and Y4 represents a group derived from an aromatic heterocycle containing a nitrogen atom as a ring constituent atom: and n2 represents an integer of 1 to 4.

5. Configuration 5 is a transparent electrode according to configuration 4, wherein the compound represented by General Formula (1) is a compound represented by General Formula (2),

[Chemical Formula 2]

GENERAL FORMULA (2)

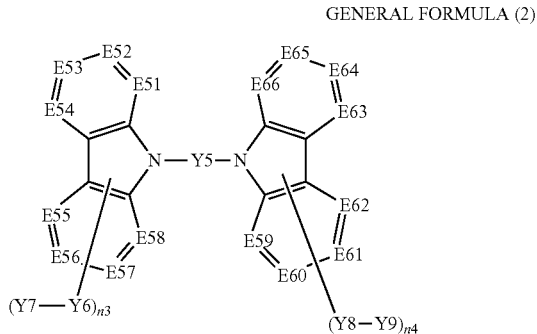

where

Y5 represents a divalent linking group which is an arylene group, a heteroarylene group or a combination of the arylene group and the heteroarylene group;

E51 to E66 each represent —C(R3)= or —N=, wherein R3 represents a hydrogen atom or a substituent; Y6 to Y9 each represent a group derived from an aromatic hydrocarbon ring or a group derived from an aromatic heterocycle, wherein at least one of Y6 and Y7 and at least one of Y8 and Y9 each represent a group derived from an aromatic heterocycle containing a nitrogen atom; and n3 and n4 each represent an integer of 0 to 4, wherein the sum of n3 and n4 is 2 or more 6. Configuration 6 is a transparent electrode according to configuration 5, wherein the compound represented by General Formula (2) is a compound represented by General Formula (3), where Y5 represents a divalent linking group which is an arylene group, a heteroarylene group or a combination of the arylene group and the heteroarylene group;

E51 to E66 and E71 to E88 each represent —C(R3)= or —N=, wherein R3 represents a hydrogen atom or a substituent, and wherein at least one of E71 to E79 and at least one of E80 to E88 each represent —N=; and n3 and n4 each represent an integer of 0 to 4, wherein the sum of n3 and n4 is 2 or more.

7. Configuration 7 is a transparent electrode according to any one of configurations 1 to 6, wherein the film-thickness of the electrode layer is in a range between 4 nm to 9 nm.

8. Configuration 8 is an electronic device comprising a transparent electrode described in any one of configurations 1 to 7.

9. Configuration 9 is an electronic device according to configuration 8, wherein the electronic device is an organic electroluminescence element.

The transparent electrode of the present invention configured in the aforesaid manner has a configuration in which the electrode layer formed of silver or an alloy having silver as a main component is formed adjacent to the nitrogen-containing layer. Thus, when forming the electrode layer adjacent to the nitrogen-containing layer, the silver atom which constitutes the electrode layer will interact with the compound which constitutes the nitrogen-containing layer and which contains nitrogen atom, so that diffusion distance of silver atom on the surface of the nitrogen-containing layer is reduced, so that aggregation of silver is inhibited. Therefore, the silver thin-film, which generally is formed in a manner in which the silver thin-film grows in a nuclear growth mode (Volumer-Weber (VW) mode) and thereby the silver thin-film is likely to be isolated into an island shape, will be formed in a manner in which the silver thin-film grows in a single-layer growth mode (Frank-van der Merwe (FV) mode). Thus, despite thin film-thickness, it becomes possible to obtain an electrode layer having a uniform film-thickness. As a result, it is possible to obtain a transparent electrode with thinner film-thickness whose light transmissibility is maintained and whose electrical conductivity is ensured.

Advantages of the Invention

As described above, according to the present invention, it is possible to improve both the electrical conductivity and

[Chemical Formula 3]

GENERAL FORMULA (3)

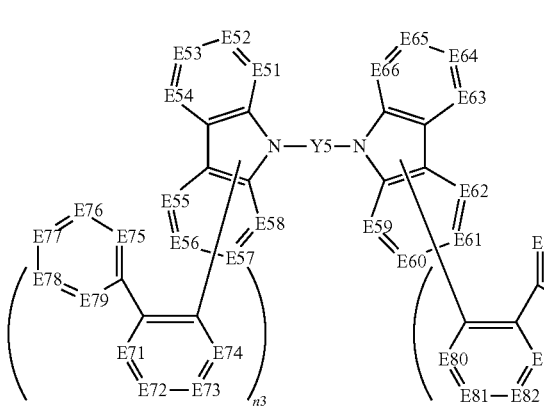

the light transmissibility of the transparent electrode at the same time, and it is possible to improve the performance of the electronic device by using the transparent electrode.

MODES FOR CARRYING OUT THE INVENTION

An embodiment of the present invention will be described in the following order with reference to the attached drawings.
1. Transparent Electrode
2. Applications of Transparent Electrode
3. First Example of Organic Electroluminescence Element
4. Second Example of Organic Electroluminescence Element
5. Third Example of Organic Electroluminescence Element
6. Applications of Transparent Electrode
7. Illumination Device 1
8. Illumination Device 2

<<1. Transparent Electrode>>

Figure 1:
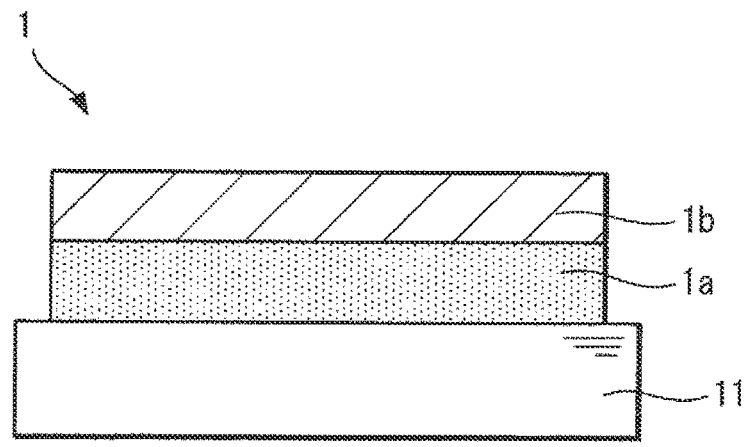
FIG. 1 is a view schematically showing a cross-sectional configuration of a transparent electrode according to the present invention.

FIG. 1 is a cross-sectional view schematically showing a configuration of a transparent electrode according to an embodiment of the present invention. As shown in FIG. 1, a transparent electrode 1 has a two-layer structure composed of a nitrogen-containing layer 1a and an electrode layer 1b, wherein the electrode layer 1b is formed adjacent to the nitrogen-containing layer 1a. The nitrogen-containing layer 1a and the electrode layer 1b are formed, in this order, on a base material 11, for example. The nitrogen-containing layer 1a is a layer formed by using a compound containing nitrogen atom, and the electrode layer 1b is a layer formed by using silver or an alloy having silver as a main component.

Next, detailed configurations of the base material 11 (on which the transparent electrode 1 having the aforesaid laminated structure is formed), the nitrogen-containing layer 1a and electrode layer 1b (both constituting the transparent electrode 1) will be described below in this order. Incidentally, the term "transparent" of the transparent electrode 1 of the present invention means that light transmittance of the transparent electrode 1 for light with a wavelength of 550 nm is 50% or higher.

<Base Material 11>

Examples of the base material 11, on which the transparent electrode 1 of the present invention is formed, include but not limited to glass, plastic and the like. Further, the base material 11 may be either transparent or non-transparent. However, in the case where the transparent electrode 1 of the present invention is applied to an electronic device in which the light is extracted from the side of the base material 11, the base material 11 is preferably transparent. Examples of the material favorably to be used as the transparent base material 11 include a glass, quartz, and a transparent resin film.

Examples of the glass include silica glass, soda-lime-silica glass, lead glass, borosilicate glass, alkali-free glass, and the like. From the viewpoint of durability, smoothness, and adhesiveness with the nitrogen-containing layer 1a, the surface of the aforesaid glass materials is subjected to a physical treatment such as polishing, and/or formed with an inorganic material coat, an organic material coat or a hybrid coat according to necessity, wherein the hybrid coat is obtained by combining the inorganic material coat and the organic material coat.

Examples of the material for the resin film include polyesters (such as polyethylene terephthalate (PET) and polyethylene naphthalate (PEN)), polyethylene, polypropylene, cellophane, cellulose esters and their derivatives (such as cellulose diacetate, cellulose triacetate, cellulose acetate butylate, cellulose acetate propionate (CAP), cellulose acetate phthalate (TAC), and cellulose nitrate), polyvinylidene chloride, polyvinylalcohol, polyethylenevinylalcohol, syndiotactic polystyrene, polycarbonate, norbornane resin, polymethylpentene, polyetherketone, polyimide, polyether sulfone (PES), polyphenylene sulfide, polysulfones, polyether imide, polyetherketone imide, polyamide, fluorine resin, nylon, polymethyl methacrylate, acryl or polyarylates, and cyclo-olefin resins (such as ARTON (trade name, manufactured by JSR Corp.) and APEL (trade name, manufactured by Mitsui Chemicals Inc.)).

The surface of the resin film may be formed with an inorganic material coat, an organic material coat or a hybrid coat, wherein the hybrid coat is obtained by combining the inorganic material coat and the organic material coat. It is preferred that the aforesaid coats and hybrid coat are each a barrier film having a water vapor permeability of 0.01 g/(m²·24 h) or less (at temperature of 25±0.5° C. and relative humidity of (90±2) % RH) measured by a method in conformity with JIS K 7129-1992. It is further preferred that the aforesaid coats and hybrid coat are each a high barrier film having an oxygen permeability of $1\times10^{-3}$ ml/(m²·24 h·atm) or less and a water vapor permeability of $1\times10^{-5}$ g/(m²·24 h) or less measured by a method in conformity with JIS K 7126-1987.

Any material capable of preventing penetration of substances that cause the element to degrade, such as moisture, oxygen and the like, may be used to form the aforesaid barrier film, and examples of such material include silicon oxide, silicon dioxide, silicon nitride and the like. Further, in order to reduce the fragility of the barrier film, it is more preferred that the barrier film has a laminated structure composed of the aforesaid inorganic layer and organic material layer (i.e., organic layer). There is no particular limitation on the order of laminating the inorganic layer and organic layer; however, it is preferred that the both layers are alternately laminated multiple times.

There is no particular limitation on the method of forming the barrier film. For example, the barrier film may be formed by a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, a coating method or the like; and it is particularly preferred that the barrier film is formed by an atmospheric pressure plasma polymerization method described in Japanese Unexamined Patent Application Publication No. 2004-68143.

On the other hand, in the case where the base material 11 is non-transparent, a metal plate (such as an aluminum plate, a stainless steel plate or the like), a film, a non-transparent resin substrate, a ceramic substrate or the like may be used as the base material 11.

<Nitrogen-Containing Layer 1a>

The nitrogen-containing layer 1a is a layer formed by using a compound containing nitrogen atom. In the case where the nitrogen-containing layer 1a is formed on the base material 11, the nitrogen-containing layer 1a may be formed by a method based on wet process (such as a coating method, an ink-jet method, a dipping method or the like), a method based on dry process (such as a deposition method (e.g., a resistance heating method, an EB method or the like), a sputtering method, a CVD method or the like) or the like. Among these methods, the deposition method is preferably used.

The compound containing nitrogen atom, which constitutes the nitrogen-containing layer 1a, is not particularly limited as long as it is a compound containing nitrogen atom in the molecule; however, it is preferred the compound containing nitrogen atom is a compound having a heterocycle with a nitrogen atom as a hetero atom. Examples of the heterocycle with a nitrogen atom as a hetero atom include aziridine, azirine, azetidine, azete, azolidine, azole, piperidine, pyridine, azepane, azepine, imidazole, pyrazole, oxazole, thiazole, imidazoline, pyrazine, morpholine, thiazine, indole, isoindole, benzimidazole, purine, quinoline, isoquinoline, quinoxaline, cinnoline, pteridine, acridine, carbazole, benzo-C-cinnoline, porphyrin, chlorine, choline, and the like.

Further, it is particularly preferred that the compound having the aforesaid heterocycle with a nitrogen atom as a hetero atom is a compound represented by each of General Formulas (1) to (3).

(Ar1)$n1$-Y1              General Formula (1)

In General Formula (1), n1 represents an integer of 1 or greater; Y1 represents a substituent if n1 is equal to 1, or a bond or an n1-valent linking group if n1 is equal to or greater than 2; Ar1 represents a group represented by below-mentioned General Formula (A), and if n1 is equal to or greater than 2, a plurality of pieces of Ar1 may either be the same, or be different from each other. However, the compound represented by General Formula (1) has, in the molecule, at least two condensed aromatic heterocycles each formed by condensing three or more rings.

Examples of the substituent represented by Y1 in General Formula (1) include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, a pentadecyl group and the like); a cycloalkyl group (for example, a cyclopentyl group, a cyclohexyl group and the like); an alkenyl group (for example, a vinyl group, an allyl group and the like); an alkynyl group (for example, an ethynyl group, a propargyl group and the like); an aromatic hydrocarbon group (also referred to as an aromatic carbon ring group, an aryl group or the like, and examples of the aromatic hydrocarbon group include a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenyryl group and the like); an aromatic heterocyclic group (for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl group, a carbolinyl group, a diazacarbazolyl group (which is formed by substituting any one of carbon atoms constituting a carboline ring of the aforesaid carbolinyl group with a nitrogen atom), a phtharazinyl group and the like); a heterocyclic group (for example, a pyrrolidyl group, an imidazolidyl group, a morpholyl group, an oxazolidyl group and the like); an alkoxy group (for example, a methoxy group, an ethoxy group, a propyloxy group, a pentyloxy group, an hexyloxy group, an octyloxy group, a dodecyloxy group and the like); a cycloalkoxy group (for example, a cyclopentyloxy group, a cyclohexyloxy group and the like); an aryloxy group (for example, a phenoxy group, a naphthyloxy group and the like); an alkylthio group (for example, a methylthio group, an ethylthio group, a propylthio group, a pentylthio group, a hexylthio group, an octylthio group, a dodecylthio group and the like); a cycloalkylthio group (for example, a cyclopentylthio group, a cyclohexylthio group and the like); an arylthio group (for example, a phenylthio group, a naphthylthio group and the like); an alkoxycarbonyl group (for example, a methyloxycarbonyl group, an ethyloxycarbonyl group, a butyloxycarbonyl group, an octyloxycarbonyl group, a dodecyloxycarbonyl group and the like); an aryloxycarbonyl group (for example, a phenyloxycarbonyl group, a naphthyloxycarbonyl group and the like); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, a 2-pyridylaminosulfonyl group and the like); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, a pyridylcarbonyl group and the like); an acyloxy group (for example, an acetyloxy group, an ethylcarbonyloxy group, a butylcarbonyloxy group, an octylcarbonyloxy group, a dodecylcarbonyloxy group, a phenylcarbonyloxy group and the like); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, a naphthylcarbonylamino group and the like); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, a 2-pyridylaminocarbonyl group and the like); an ureido group (for example, a methylureido group, an ethylureido group, a pentylureido group, a cyclohexylureido group, an octylureido group, a dodecylureido group, a phenylureido group, a naphthylureido group, a 2-pyridylaminoureido group and the like); a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, a 2-pyridylsulfinyl group and the like); an alkylsulfonyl group (for example, a methylsulfonyl group, an ethylsulfonyl group, a butylsulfonyl group, a cyclohexylsulfonyl group, a 2-ethylhexylsulfonyl group, a dodecylsulfonyl group and the like); an arylsulfonyl group or a heteroarylsulfonyl group (for example, a phenylsulfonyl group, a naphthylsulfonyl group, a 2-pyridylsulfonyl group and the like); an amino group (for example, an amino group, an ethylamino group, a dimethylamino group, a butylamino group, a cyclopentylamino group, a 2-ethylhexylamino, a dodecylamino group, an anilino group, a naphthylamino group, a 2-pyridylamino group, a piperidyl group (also referred to as a piperidinyl group), a 2,2,6,6-tetramethyl piperidinyl group and the like); a halogen atom (for example, a fluorine atom, a chlorine atom, a bromine atom and the like); a fluorohydrocarbon group (for example, a fluoromethyl group, a trifluoromethyl group, a pentafluoroethyl group, a pentafluorophenyl group and the like); a cyano group; a nitro group; a hydroxyl group; a mercapto group; a silyl group (for example, a trimethylsilyl group, a triisopropylsilyl group, a triphenylsilyl group, a phenyldiethylsilyl group and the like); a phosphate group (for example, dihexylphosphoryl group and the like); a phosphite group (for example, diphenylphosphinyl group and the like); a phosphono group, and the like.

Part of these substituents may be further substituted by the above-mentioned substituent. Further, a plurality of these substituents may be bonded to each other to form a ring.

Concrete examples of the n1-valent linking group represented by Y1 in General Formula (1) include a divalent linking group, a trivalent linking group, a tetravalent linking group and the like.

Examples of the divalent linking group represented by Y1 in General Formula (1) include: an alkylene group (for example, an ethylene group, a trimethylene group, a tetramethylene group, a propylene group, an ethylethylene group, a pentamethylene group, a hexamethylene group, a 2,2,4-trimethylhexamethylene group, a heptamethylene group, an octamethylene group, nonamethylene group, a decamethylene group, an undecamethylene group, a dodecamethylene group, a cyclohexylene group (for example, a 1,6-cyclohexanediyl group and the like), a cyclopenthylene group (for example, a 1,5-cyclopentanediyl group and the like) and the like); an alkenylene group (for example, a vinylene group, a propenylene group, a butenylene group, a pentenylene group, a 1-methylvinylene group, a 1-methylpropenylene group, a 2-methylpropenylene group, a 1-methylpentenylene group, a 3-methylpentenylene group, a 1-ethylvinylene group, a 1-ethylpropenylene group, a 1-ethylbutenylene group, a 3-ethylbutenylene group and the like); an alkynylene group (for example, an ethynylene group, a 1-propynylene group, a 1-butynylene group, a 1-pentynylene group, a 1-hexynylene group, a 2-butynylene group, a 2-pentynylene group, a 1-methylethynylene group, a 3-methyl-1-propynylene group, a 3-methyl-1-butynylene group and the like); an arylene group (for example, an o-phenylene group, a p-phenylene group, a naphthalenediyl group, an anthracenediyl group, a naphthacenediyl group, a pyrenediyl group, a naphthylnaphthalenediyl group, a biphenyldiyl group (for example, a [1,1'-biphenyl]-4,4'-diyl group, a 3,3'-biphenyldiyl group and, 3,6-biphenyldiyl group and the like), a terphenyldiyl group, a quaterphenyldiyl group, a quinquephenyldiyl group, a sexiphenyldiyl group, a septiphenyldiyl group, an octiphenyldiyl group, a nobiphenyldiyl group, a deciphenyldiyl group and the like); a heteroarylene group (for example, a divalent group derived from a group consisting of a carbazole group, a carboline ring, a diazacarbazole ring (also referred to as a monoazacarboline group, indicating a ring formed by substituting one of carbon atoms constituting a carboline ring with a nitrogen atom), a triazole ring, a pyrrole ring, a pyridine ring, a pyrazine ring, a quinoxaline ring, a thiophene ring, an oxadiazole ring, a dibenzofuran ring, a dibenzothiophene ring, an indole ring and the like), a chalcogen atom such as oxygen, sulfur or the like, a group derived from a condensed aromatic heterocycle formed by condensing three or more, and the like (herein, it is preferred that the condensed aromatic heterocycle formed by condensing three or more rings is a condensed aromatic heterocycle which contains a hetero atom selected from N, O and S as an element constituting a condensed ring; concrete examples of such condensed aromatic heterocycle include an acridine ring, a benzoquinoline ring, a carbazole ring, a phenazine ring, a phenanthridine ring, a phenanthroline ring, a carboline ring, a cycladine ring, a quindoline ring, a thebenidine ring, a quinindoline ring, a triphenodithiazine ring, a triphenodioxazine ring, a phenanthrazine ring, an anthrazine ring, a perimizine ring, a diazacarbazole ring (indicating a ring formed by substituting one of carbon atoms constituting a carboline ring with a nitrogen atom), a phenanthroline ring, a dibenzofuran ring, a dibenzothiophene ring, a naphthofuran ring, a naphthothiophene ring, a benzodifuran ring, a benzodithiophene ring, a naphthodifuran ring, a naphthodithiophene ring, an anthrafuran ring, an anthradifuran ring, an anthrathiophene ring, an anthradithiophene ring, a thianthrene ring, a phenoxathiin ring, a thiophanthrene ring (naphthothiophene ring) and the like).

Examples of the trivalent linking group represented by Y1 in General Formula (1) include an ethanetriyl group, a propanetriyl group, a butanetriyl group, a pentanetriyl group, a hexanetriyl group, a heptanetriyl group, an octanetriyl group, a nonanetriyl group, a decanetriyl group, an undecanetriyl group, a dodecanetriyl group, a cyclohexanetriyl group, a cyclopentanetriyl group, a benzenetriyl group, a naphthalenetriyl group, a pyridinetriyl group, a carbazoletriyl group and the like.

The tetravalent linking group represented by Y1 in General Formula (1) is a group having a linking group added to any one of the above-mentioned trivalent linking groups. Examples of the tetravalent linking group include a propandiylidene group, a 1,3-propandiyl-2-ylidene group, a butanediylidene group, a pentanediylidene group, a hexanediylidene group, a heptanediylidene group, an octanediylidene group, a nonanediylidene group, a decanediylidene group, an undecanediylidene group, a dodecanediylidene group, a cyclohexanediylidene group, a cyclopentanediylidene group, a benzenetetrayl group, a naphthalenetetrayl group, a pyridinetetrayl group, a carbazoletetrayl group and the like.

The aforesaid divalent, trivalent and tetravalent linking groups may each have a substituent represented by Y1 in General Formula (1).

In the compound represented by General Formula (1), it is preferred that Y1 represent a group derived from a condensed aromatic heterocycle formed by condensing three or more rings, and it is preferred that the condensed aromatic heterocycle formed by condensing three or more rings is a dibenzofuran ring or a dibenzothiophene ring. Further, it is preferred that n1 is 2 or more.

Further, the compound represented by General Formula (1) has, in the molecule, at least two condensed aromatic heterocycles each formed by condensing three or more rings.

When Y1 represents an n1-valent linking group, Y1 is preferably non-conjugated in order to keep the triplet excitation energy of the compound represented by General Formula (1) high, and is preferably constituted of aromatic rings (an aromatic hydrocarbon ring+an aromatic heterocycle) in order to improve Tg (also referred to as glass transition point or glass transition temperature).

Here, the "non-conjugated" indicates that a linking group cannot be expressed with alternation of single and double bonds, or that a conjugation of aromatic rings which constitute a linking group is sterically broken.

[Group Represented by General Formula (A)]

Ar1 of General Formula (1) is a group represented by the following General Formula (A).

[Chemical Formula 4]

GENERAL FORMULA (A)

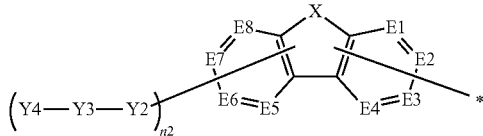

In General Formula (A), X represents —N(R)—, —O—, —S— or —Si(R)(R')—, and E1 to E8 each represent —C(R1)= or —N=, wherein R, R' and R1 each represent a hydrogen atom, a substituent or a linking site with Y1; * represents a linking site with Y1; Y2 merely represents a bond or a divalent linking group; Y3 and Y4 each represent a group derived from a 5-membered or 6-membered aromatic ring, wherein at least one of Y3 and Y4 represents a group derived from an aromatic heterocycle containing a nitrogen atom as a ring constituent atom; and n2 represents an integer of 1 to 4.

Here, the substituents represented by R, R' or R1 both in —N(R)— or —Si(R)(R')— represented by X and in —C(R1)= represented by each of E1 to E8 in General Formula (A) are each synonymous with the substituent represented by Y1 in General Formula (1).

Further, the divalent linking group represented by Y2 in General Formula (A) is synonymous with the divalent linking group represented by Y1 in General Formula (1).

Examples of the 5-membered or 6-membered aromatic ring used to form a group derived from a 5-membered or 6-membered aromatic ring represented by each of Y3 and Y4 in General Formula (A) include a benzene ring, an oxazole ring, a thiophene ring, a furan ring, a pyrrole ring, a pyridine ring, a pyridazine ring, a pyrimidine ring, a pyrazine ring, a diazine ring, a triazine ring, an imidazole ring, an isoxazole ring, a pyrazole ring, a triazole ring and the like.

At least one of the groups derived from 5-membered or 6-membered aromatic rings respectively represented by Y3 and Y4 is a group derived from an aromatic heterocycle containing a nitrogen atom as a ring constituent atom. Examples of the aromatic heterocycle containing a nitrogen atom as a ring constituent atom include an oxazole ring, a pyrrole ring, a pyridine ring, a pyridazine ring, a pyrimidine ring, a pyrazine ring, the diazine ring, a triazine ring, an imidazole ring, an isoxazole ring, a pyrazole ring, a triazole ring and the like.

(Preferred Group Represented by Y3)

In General Formula (A), the group represented by Y3 is preferably a group derived from the aforesaid 6-membered aromatic ring, and further preferably a group derived from a benzene ring.

(Preferred Group Represented by Y4)

In General Formula (A), the group represented by Y4 is preferably a group derived from the aforesaid 6-membered aromatic ring, and further preferably a group derived from the aromatic heterocycle containing a nitrogen atom as a ring constituent atom, and particularly preferably a group derived from a pyridine ring.

(Preferred Group Represented by General Formula (A))

The group represented by General Formula (A) is preferably a group represented by one of the following General Formulas (A-1), (A-2), (A-3) and (A-4).

[Chemical Formula 5]

GENERAL FORMULA (A-1)

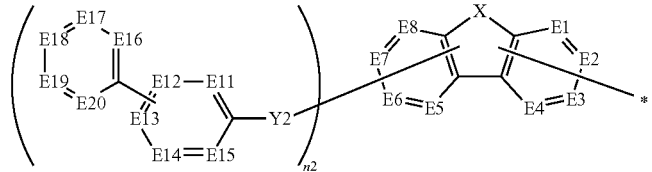

In General Formula (A-1), X represents —N(R)—, —O—, —S— or —Si(R)(R')—, and E1 to E8 each represent —C(R1)= or —N=, wherein R, R' and R1 each represent a hydrogen atom, a substituent or a linking site with Y1; Y2 merely represents a bond or a divalent linking group; E11 to E20 each represent —C(R2)= or —N=, wherein at least one of E11 to E20 represents —N=, and wherein R2 represents a hydrogen atom, a substituent or a linking site; wherein at least one of E11 and E12 represents —C(R2)=, where R2 represents a linking site; n2 represents an integer of 1 to 4; and * represents a linking site with Y1 in General Formula (1).

[Chemical Formula 6]

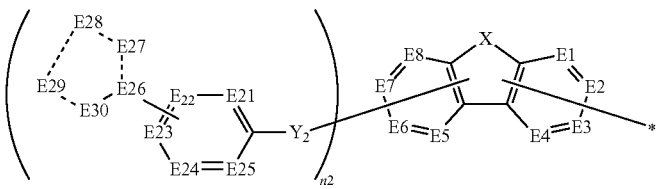

GENERAL FORMULA (A-2)

In General Formula (A-2), X represents —N(R)—, —O—, —S— or —Si(R)(R')—, and E1 to E8 each represent —C(R1)= or —N=, wherein R, R' and R1 each represent a hydrogen atom, a substituent or a linking site with Y1; Y2 merely represents a bond or a divalent linking group; E21 to E25 each represent —C(R2)= or —N=, and E26 to E30 each represent —C(R2)=, —N=, —O—, —S— or —Si(R3)(R4)-, wherein at least one of E21 to E30 represents —N=, and wherein R2 represents a hydrogen atom, a substituent or a linking site, and R3 and R4 each represent a hydrogen atom or a substituent; wherein at least one of E21 and E22 represents —C(R2)=, where R2 represents a linking site; n2 represents an integer of 1 to 4; and * represents a linking site with Y1 in General Formula (1).

[Chemical Formula 7]

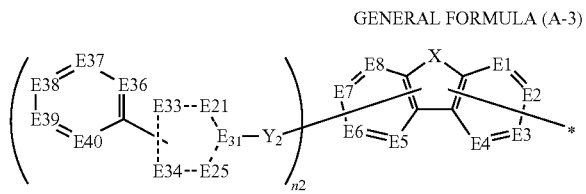

GENERAL FORMULA (A-3)

In General Formula (A-3), X represents —N(R)—, —O—, —S— or —Si(R)(R')—, and E1 to E8 each represent —C(R1)= or —N=, wherein R, R' and R1 each represent a hydrogen atom, a substituent or a linking site with Y1; Y2 merely represents a bond or a divalent linking group; E31 to E35 each represent —C(R2)=, —N=, —O—, —S— or —Si(R3)(R4)-, and E36 to E40 each represent —C(R2)= or —N=, wherein at least one of E31 to E40 represents —N=, and wherein R2 represents a hydrogen atom, a substituent or a linking site, and R3 and R4 each represent a hydrogen atom or a substituent; wherein at least one of E32 and E33 represents —C(R2)=, where R2 represents a linking site; n2 represents an integer of 1 to 4; and * represents a linking site with Y1 in General Formula (1).

[Chemical Formula 8]

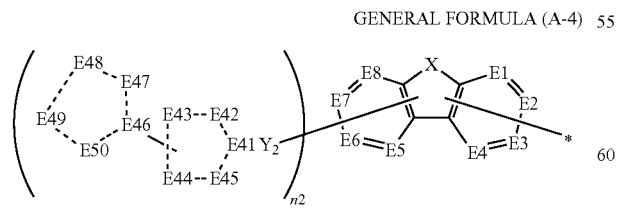

GENERAL FORMULA (A-4)

In General Formula (A-4), X represents —N(R)—, —O—, —S— or —Si(R)(R')—, and E1 to E8 each represent —C(R1)= or —N=, wherein R, R' and R1 each represent a hydrogen atom, a substituent or a linking site with Y1; Y2 merely represents a bond or a divalent linking group; E41 to E50 each represent —C(R2)=, —N=, —O—, —S— or —Si(R3)(R4)-, wherein at least one of E41 to E50 represents —N=, and wherein R2 represents a hydrogen atom, a substituent or a linking site, and R3 and R4 each represent a hydrogen atom or a substituent; wherein at least one of E42 and E43 represents —C(R2)=, where R2 represents a linking site; n2 represents an integer of 1 to 4; and * represents a linking site with Y1 in General Formula (1).

The group represented by any one of General Formulas (A-1) to (A-4) is described below.

The substituents represented by R, R' or R1 both in —N(R)— or —Si(R)(R')— represented by X and in —C(R1)=represented by each of E1 to E8 of the group represented by any one of General Formulas (A-1) to (A-4) are each synonymous with the substituent represented by Y1 in General Formula (1).

The divalent linking group represented by Y2 of the group represented by any one of General Formulas (A-1) to (A-4) is synonymous with the divalent linking group represented by Y1 in General Formula (1).

The substituent represented by R2 of —C(R2)=represented by each of E11 to E20 in General Formula (A-1), each of E21 to E30 in General Formula (A-2), each of E31 to E40 in General Formula (A-3) or each of E41 to E50 in General Formula (A-4) is synonymous with the substituent represented by Y1 in General Formula (1).

Further preferred compound represented by General Formula (1) will be described below.

[Compound Represented by General Formula (2)]

In the present invention, among the compounds represented by General Formula (1), a compound represented by General Formula (2) is preferable. The compound represented by General Formula (2) will be described below.

[Chemical Formula 9]

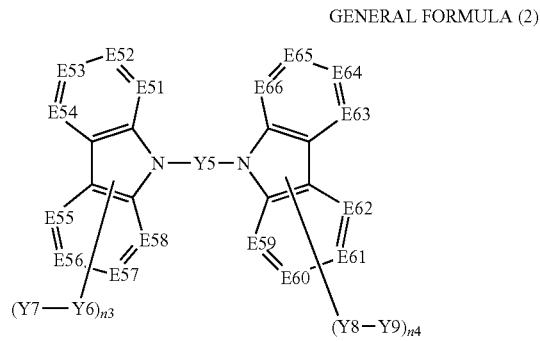

GENERAL FORMULA (2)

In General Formula (2), Y5 represents a divalent linking group which is an arylene group, a heteroarylene group or a combination of the arylene group and the heteroarylene group; E51 to E66 each represent —C(R3)= or —N=, wherein R3 represents a hydrogen atom or a substituent; Y6 to Y9 each represent a group derived from an aromatic hydrocarbon ring or a group derived from an aromatic heterocycle, wherein at least one of Y6 and Y7 and at least one of Y8 and Y9 each represent a group derived from an aromatic heterocycle containing a nitrogen atom; and n3 and n4 each represent an integer of 0 to 4, wherein the sum of n3 and n4 is 2 or more.

The arylene group and heteroarylene group represented by Y5 in General Formula (2) are respectively synonymous with the arylene group and heteroarylene group mentioned as an example of the divalent linking group represented by Y1 in General Formula (1).

It is preferred that the divalent linking group (which is an arylene group, a heteroarylene group or a combination thereof represented by Y5) contains, among the heteroarylene groups, a group derived from a condensed aromatic heterocycle formed by condensing three or more rings, and further, it is preferred that the group derived from the condensed aromatic heterocycle formed by condensing three or more rings is a group derived from a dibenzofuran ring or a group derived from a dibenzothiophene ring.

The substituent represented by R3 of —C(R3)= represented by each of E51 to E66 in General Formula (2) is synonymous with the substituent represented by Y1 in General Formula (1).

In General Formula (2), it is preferable that as groups represented by E51 to E66, six or more of E51 to E58 and six or more of E59 to E66 are each represented by —C(R3)=.

Examples of aromatic hydrocarbon ring used to form the group derived from an aromatic hydrocarbon ring represented by each of Y6 to Y9 in General Formula (2) include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, an anthranthrene ring and the like.

The aromatic hydrocarbon ring may have a substituent represented by Y1 in General Formula (1).

Examples of aromatic heterocycle used to form the group derived from an aromatic heterocycle represented by each of Y6 to Y9 include a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring naphthylidine ring, a carbazole ring, a carboline ring, a diazacarbazole ring (which is a ring formed by further substituting one of carbon atoms constituting a carboline ring with a nitrogen atom) and the like.

The aromatic hydrocarbon ring may have a substituent represented by Y1 in General Formula (1).

Examples of aromatic heterocycle containing a nitrogen atom used to form a group derived from an aromatic heterocycle containing a nitrogen atom represented by each of at least one of Y6 and Y7 and at least one of Y8 and Y9 in General Formula (2) include an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring, a naphthylidine ring, a carbazole ring, a carboline ring, a diazacarbazole ring (which is a ring formed by further substituting one of carbon atoms constituting a carboline ring with a nitrogen atom) and the like.

In General Formula (2), it is preferred that the groups represented by Y7 and Y9 are each a group derived from a pyridine ring.

In General Formula (2), it is preferred that the groups represented by Y6 and Y8 are each a group derived from a benzene ring.

Among the compounds represented by General Formula (2) according to the present invention, a further preferred compound will be described below.

[Compound Represented by General Formula (3)]

Among the compounds represented by General Formula (2), a compound represented by General Formula (3) is preferable. The compound represented by General Formula (3) will be described below.

[Chemical Formula 10]

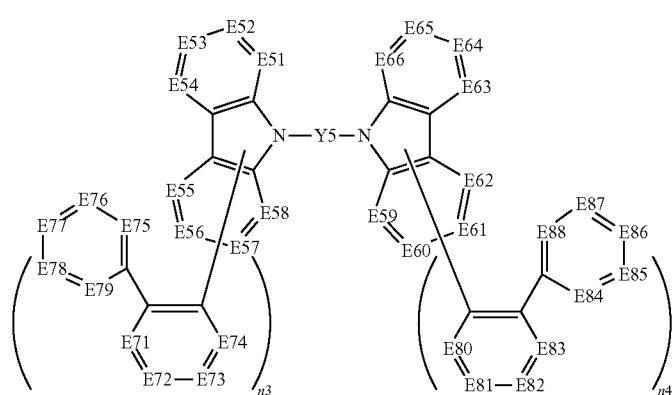

GENERAL FORMULA (3)

In General Formula (3), Y5 represents a divalent linking group which is an arylene group, a heteroarylene group or a combination of the arylene group and the heteroarylene group; E51 to E66 and E71 to E88 each represent —C(R3)= or —N=, wherein R3 represents a hydrogen atom or a substituent, and wherein at least one of E71 to E79 and at least one of E80 to E88 each represent —N=; and n3 and n4 each represent an integer of 0 to 4, wherein the sum of n3 and n4 is 2 or more.

The arylene group and heteroarylene group represented by Y5 in General Formula (3) are respectively synonymous with the arylene group and heteroarylene group mentioned as an example of the divalent linking group represented by Y1 in General Formula (1).

It is preferred that the divalent linking group (which is an arylene group, a heteroarylene group or a combination thereof represented by Y5) contains, among the heteroarylene groups, a group derived from a condensed aromatic heterocycle formed by condensing three or more rings, and further, it is preferred that the group derived from the condensed aromatic heterocycle formed by condensing three or more rings is a group derived from a dibenzofuran ring or a group derived from a dibenzothiophene ring.

The substituent represented by R3 of —C(R3)= represented by each of E51 to E66 and E71 to E88 in General Formula (3) is synonymous with the substituent represented by Y1 in General Formula (1).

In General Formula (3), it is preferable that six or more of E51 to E58 and six or more of E59 to E66 are each represented by —C(R3)=.

In General Formula (3), it is preferable that at least one of E75 to E79 and at least one of E84 to E88 each represent —N=.

In General Formula (3), it is preferable that any one of E75 to E79 and any one of E84 to E88 each represent —N=.

Further, in General Formula (3), it is preferable that E71 to E74 and E80 to E83 are each represented by —C(R3)=.

Further, in the compound represented by General Formula (2) or General Formula (3), it is preferred that E53 is represented by —C(R3)=, wherein R3 represents a liking site; and further, it is preferred that E61 is also represented by —C(R3)=, wherein R3 represents a liking site.

Furthermore, it is preferred that E75 and E84 are each represented by —N=, and E71 to E74 and E80 to E83 are each represented by —C(R3)=.

[Concrete Examples of Compound]

Concrete examples (1 to 112) of the compound represented by General Formula (1), (2) or (3) of the present invention will be described below; however, the present invention is not limited thereto.

[Chemical Formula 11]

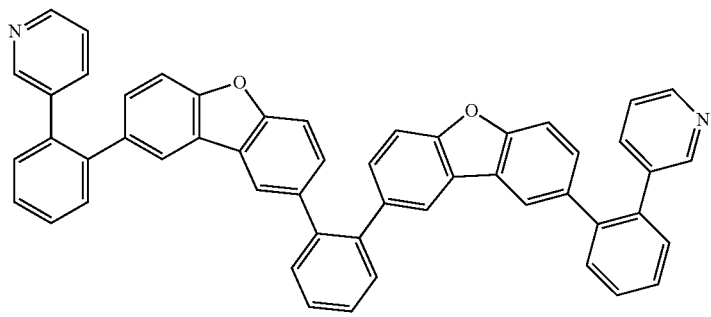

1

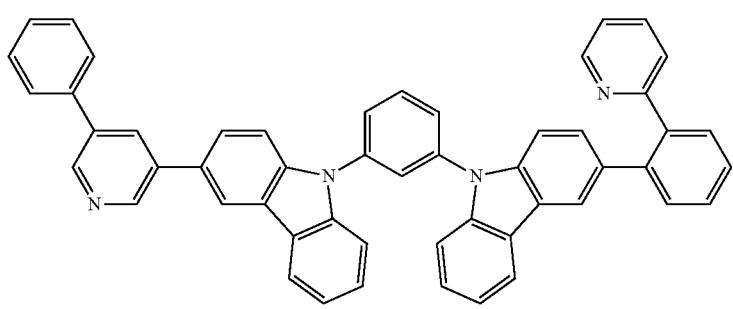

2

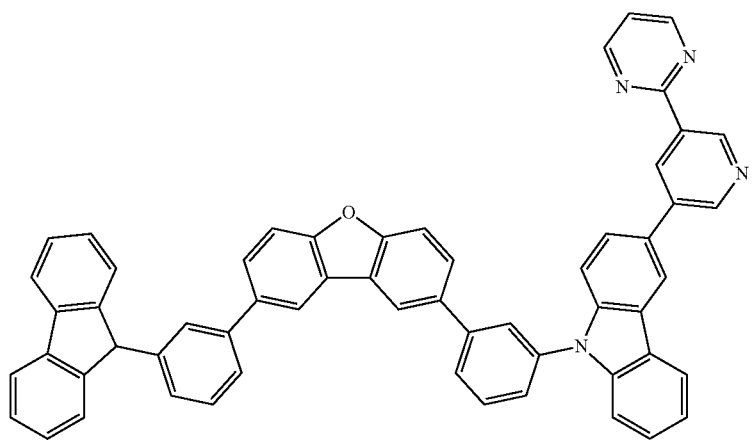
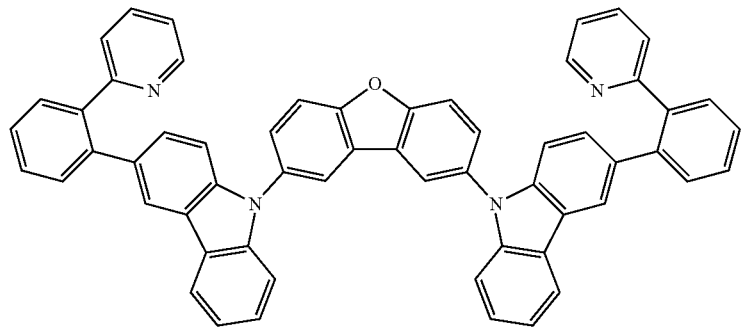
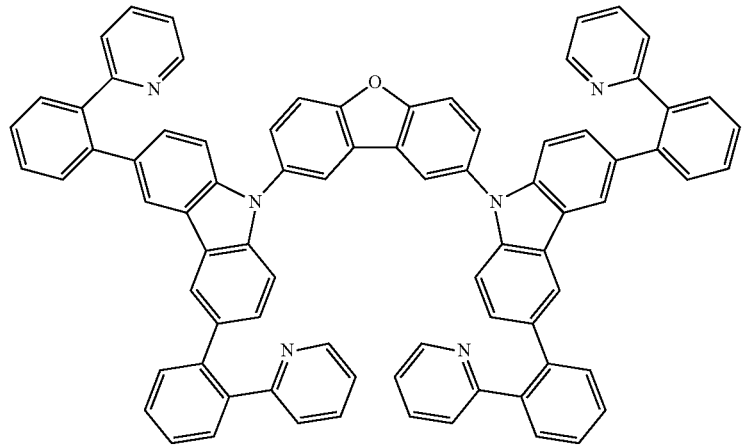
[Chemical Formula 12]
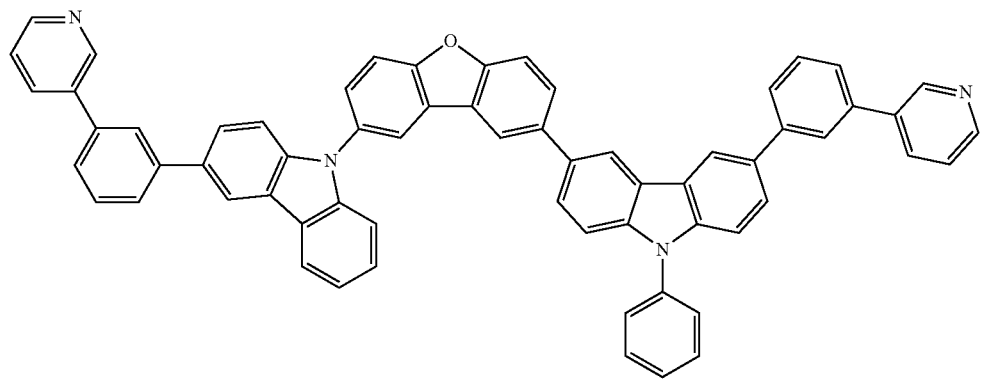

-continued
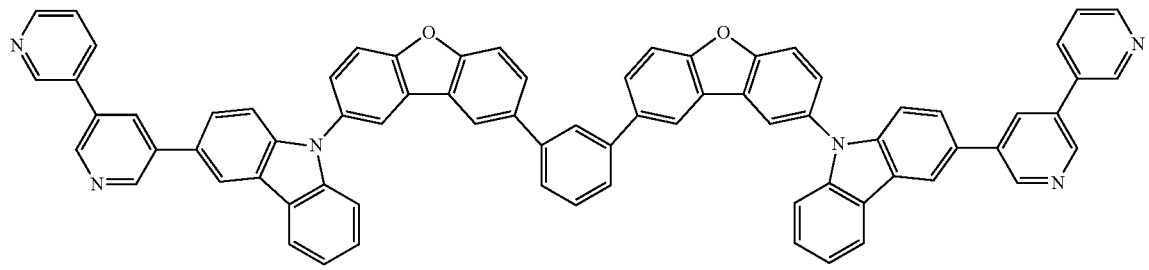
7
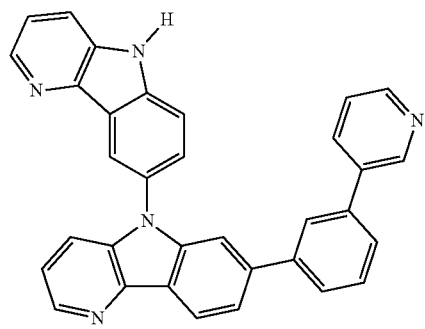
8
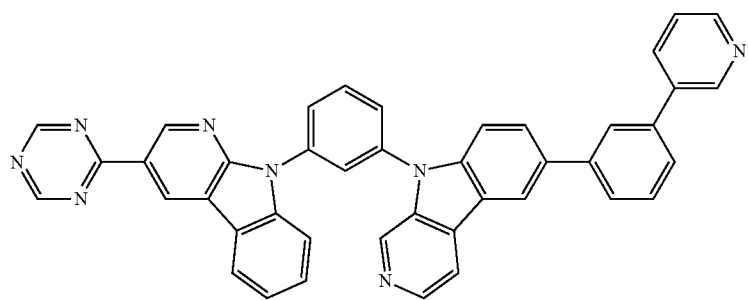
9
[Chemical Formula 13]
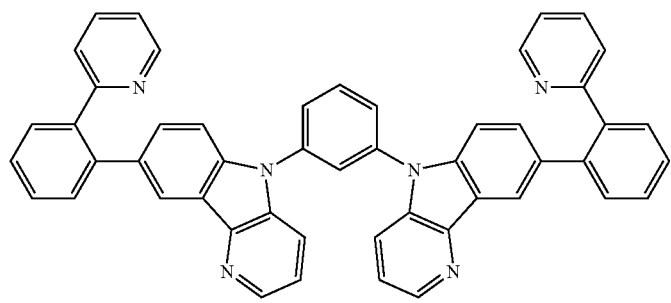
10

11
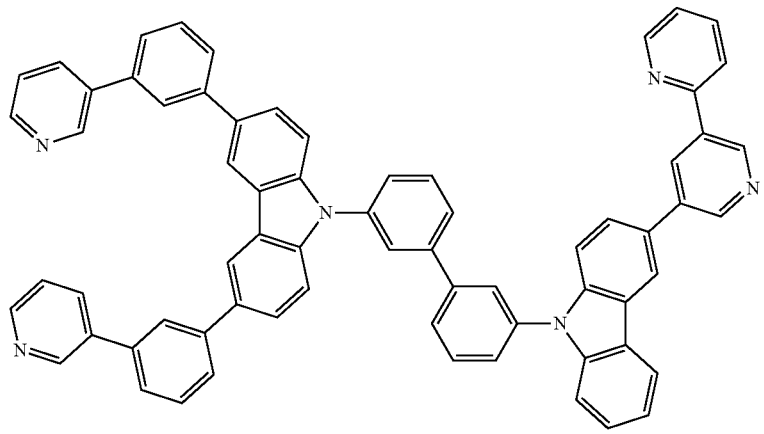
12
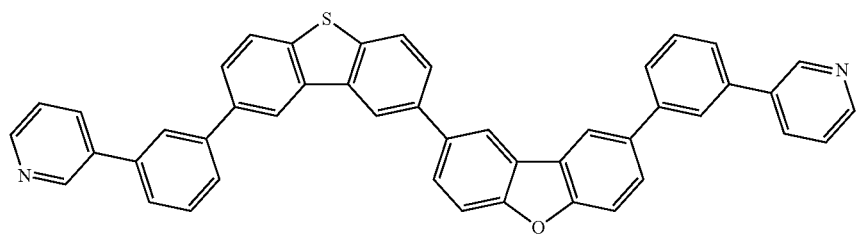
13
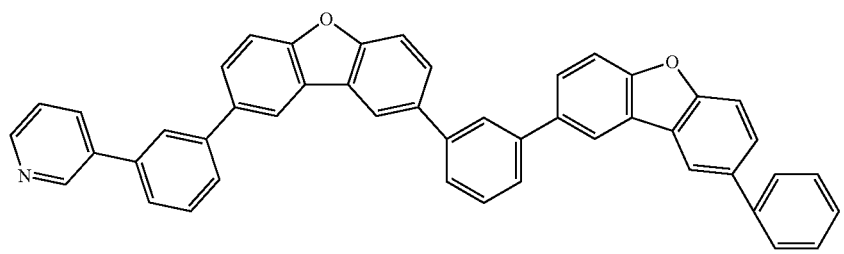
14
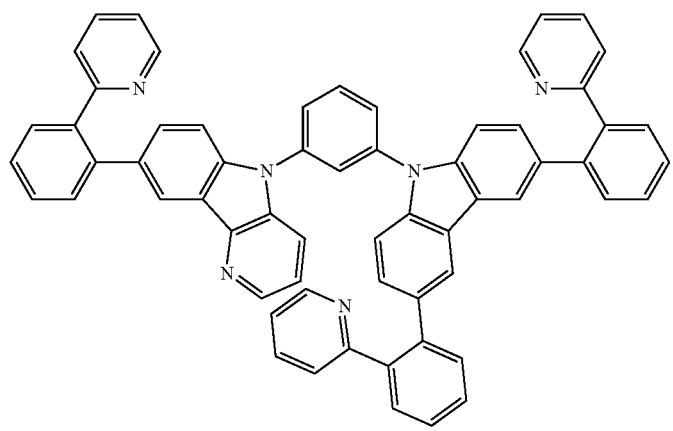

-continued
15
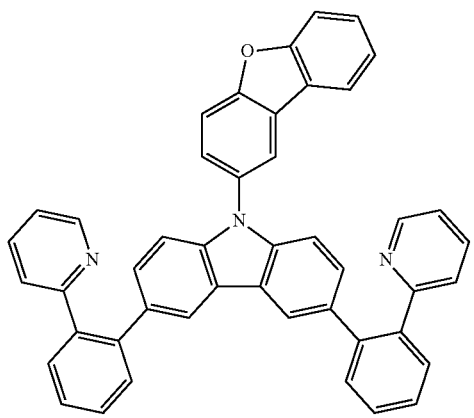
[Chemical Formula 14]
16
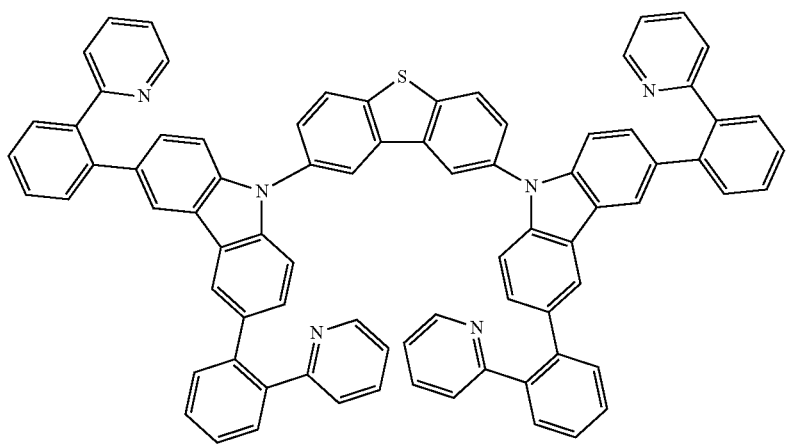
17
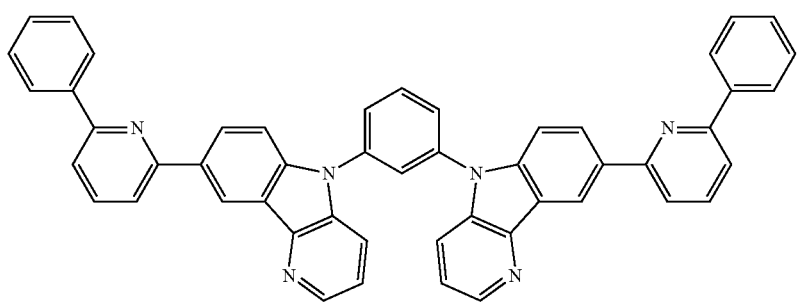

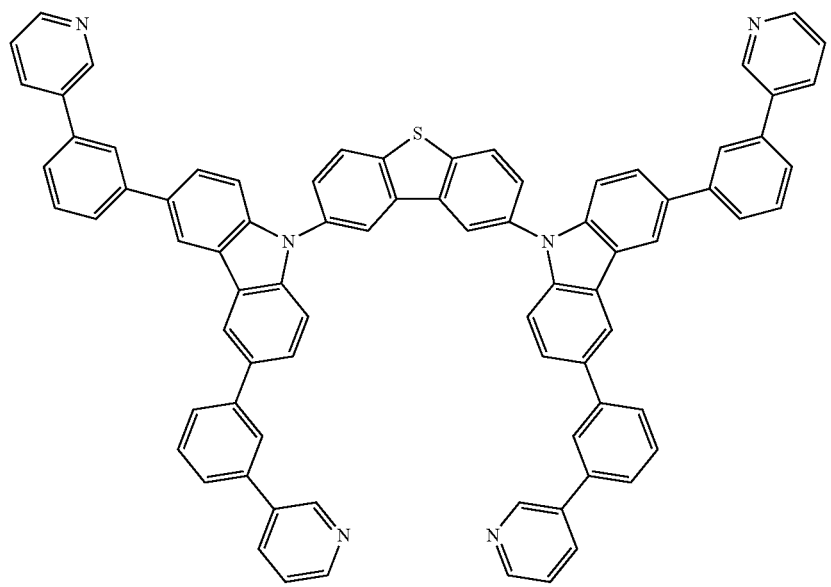
18
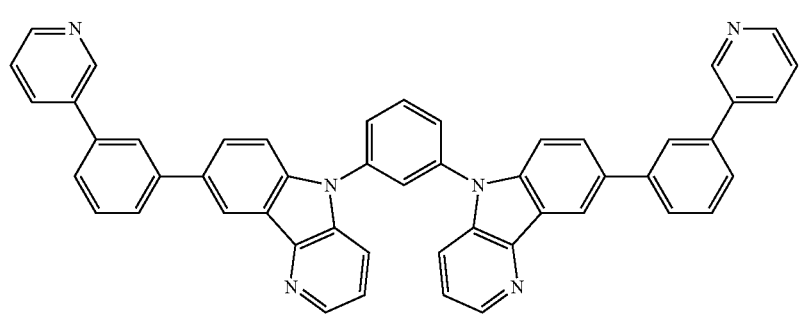
19
[Chemical Formula 15]
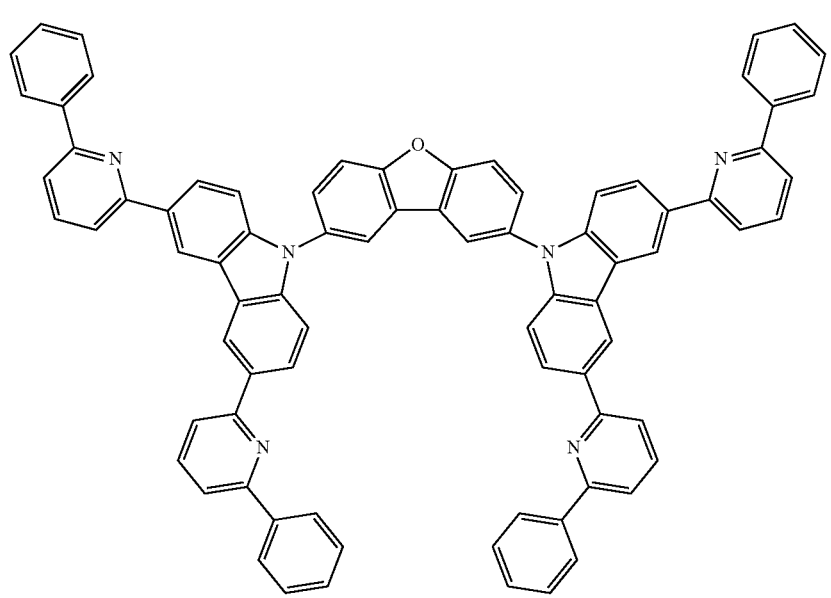
20

21
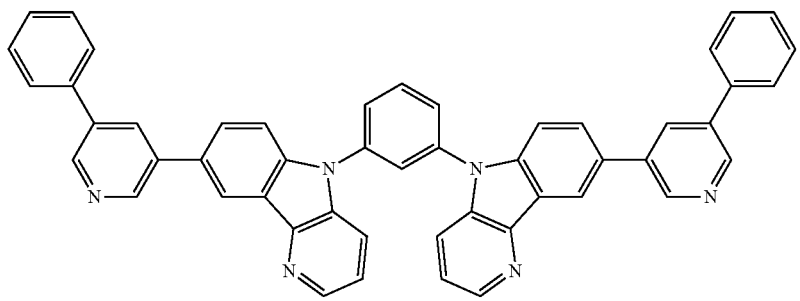
22
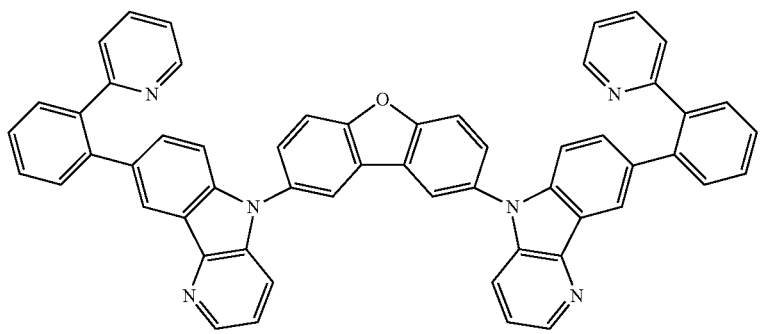
23
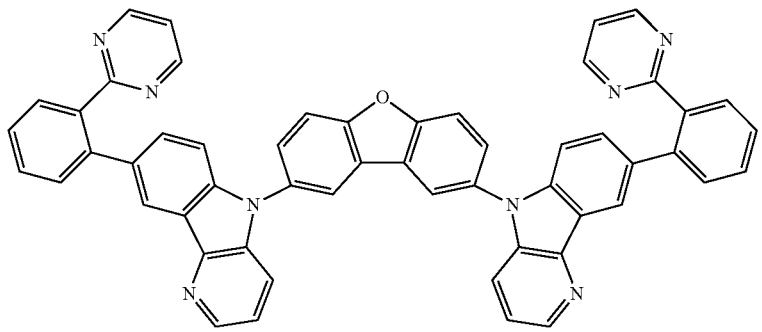
[Chemical Formula 16]
24
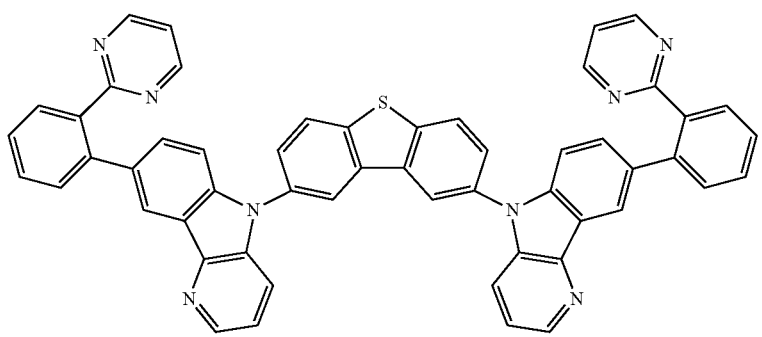

25
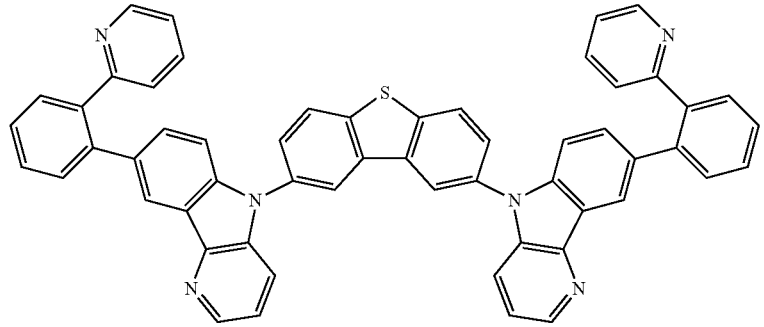
26
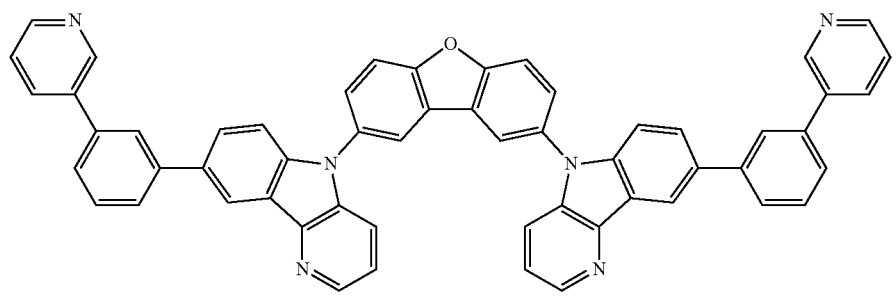
27
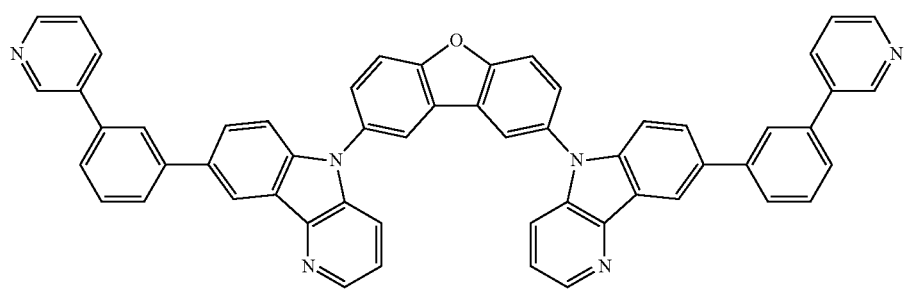
28
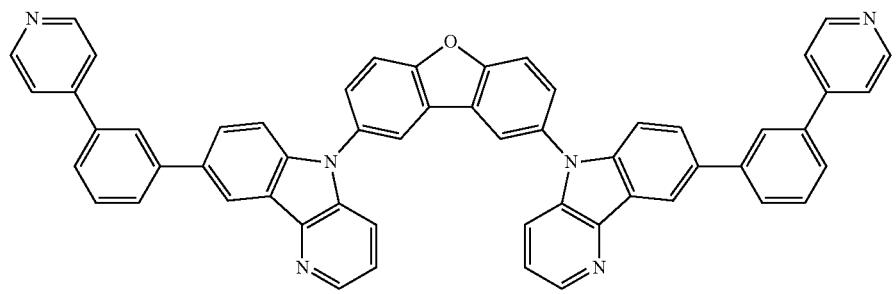
29
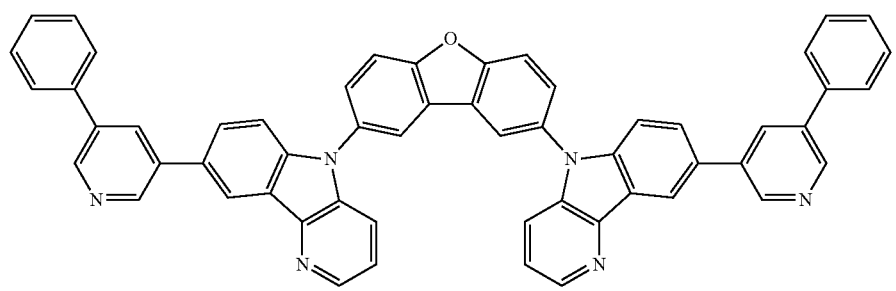
[Chemical Formula 17]

-continued
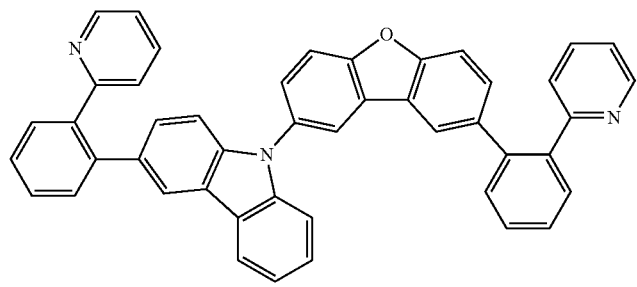
30
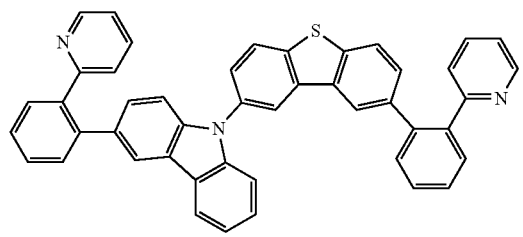
31
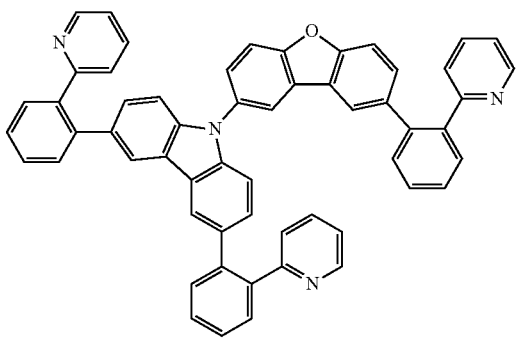
32
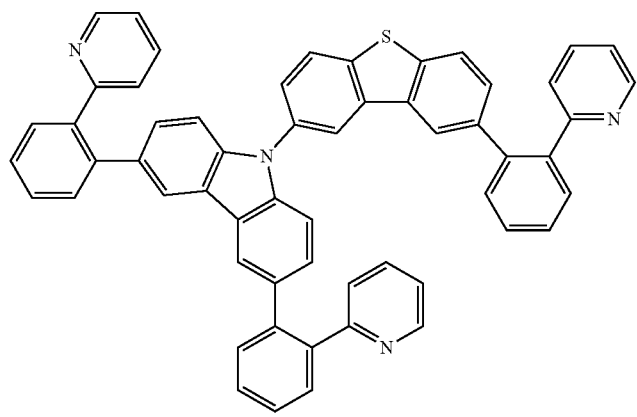
33
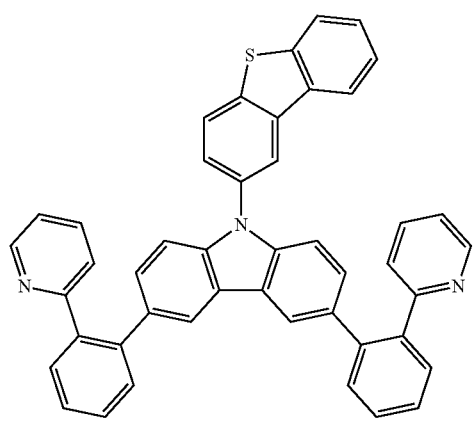
34

35
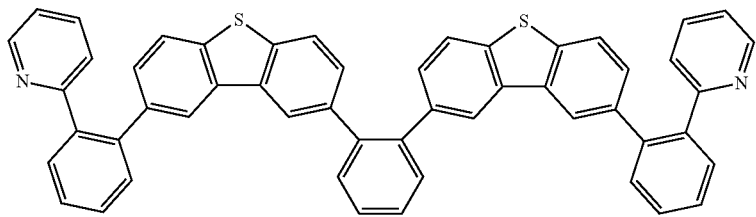
36
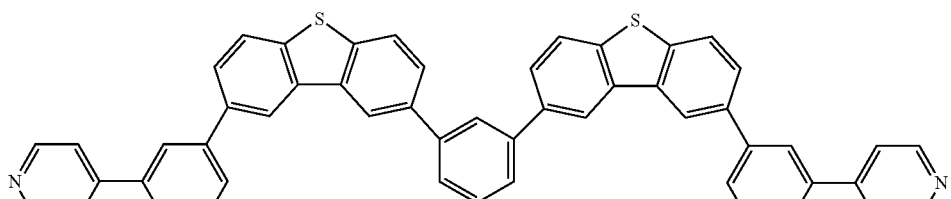
[Chemical Formula 18]
37
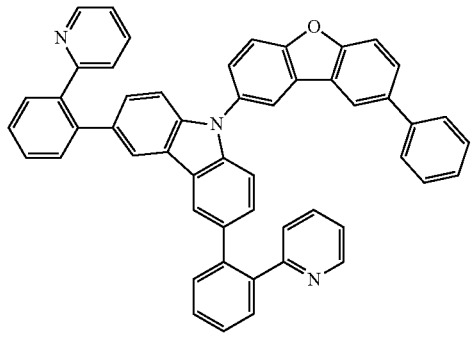
38
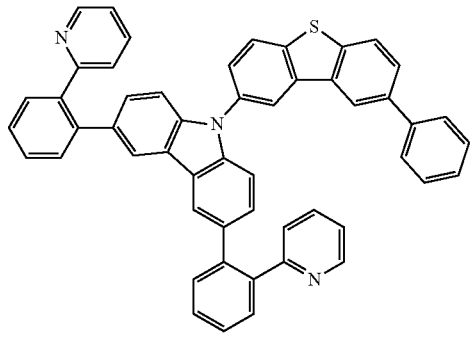
39
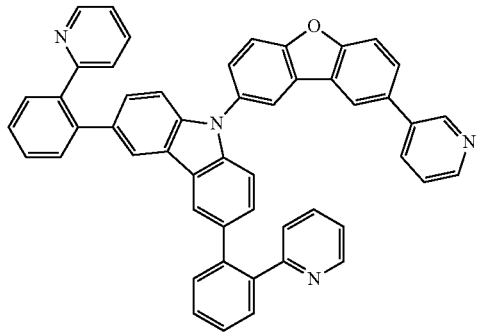
40
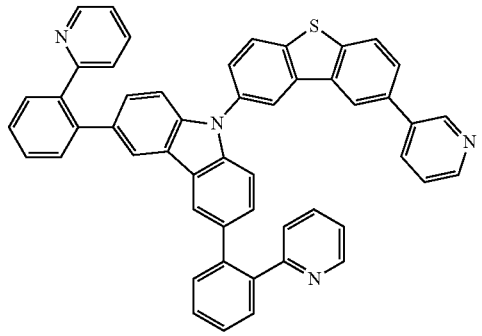
41
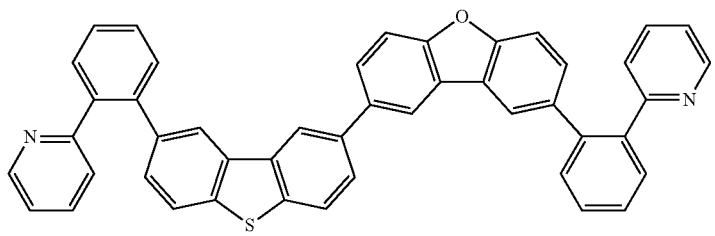

42
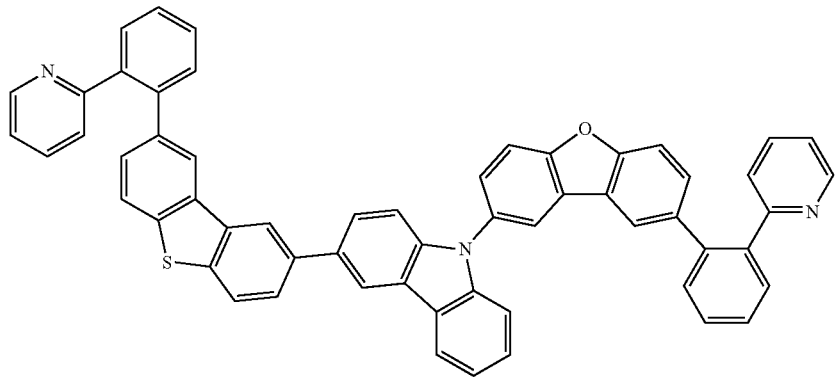
[Chemical Formula 19]
43
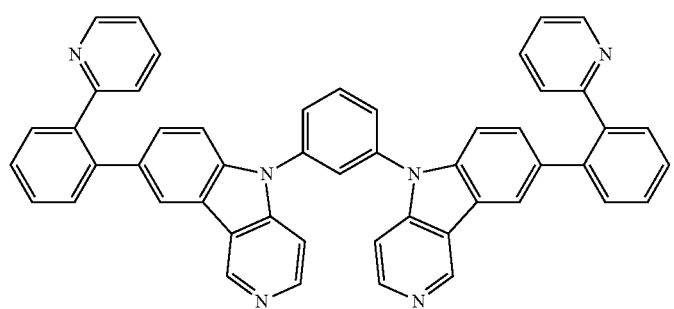
44
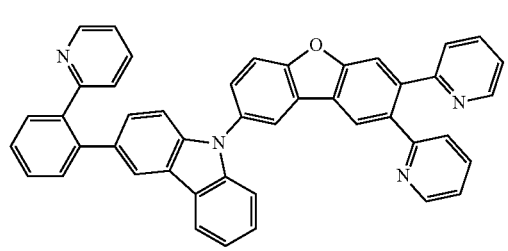
45
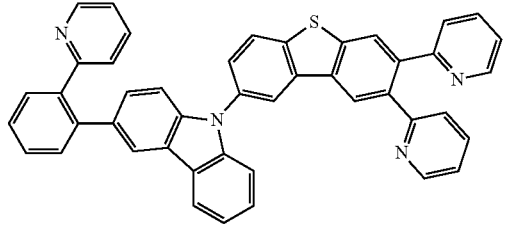
46
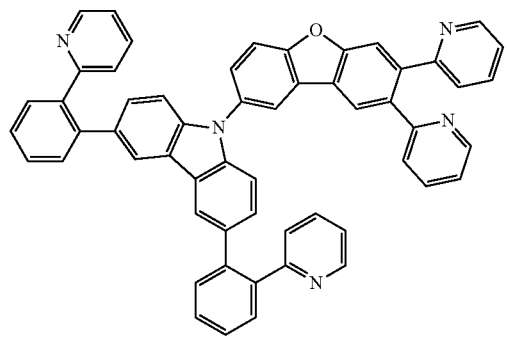
47
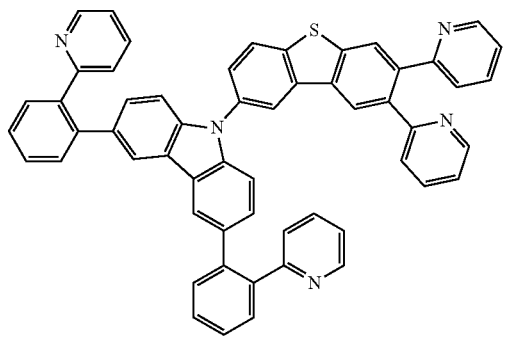
[Chemical Formula 20]

-continued
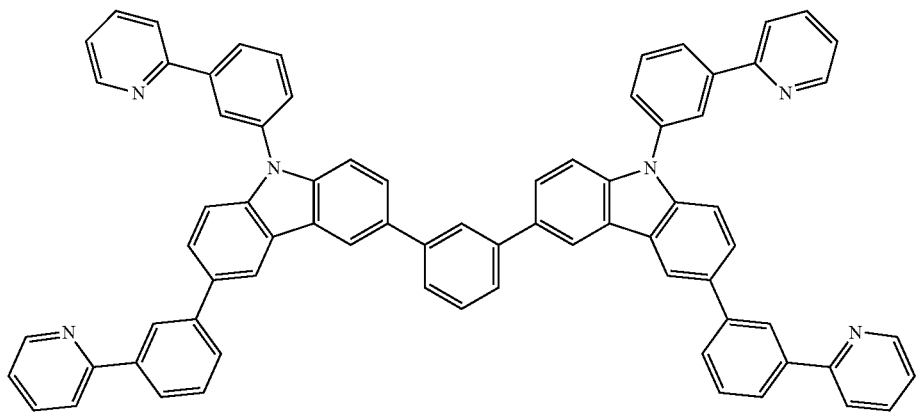
48
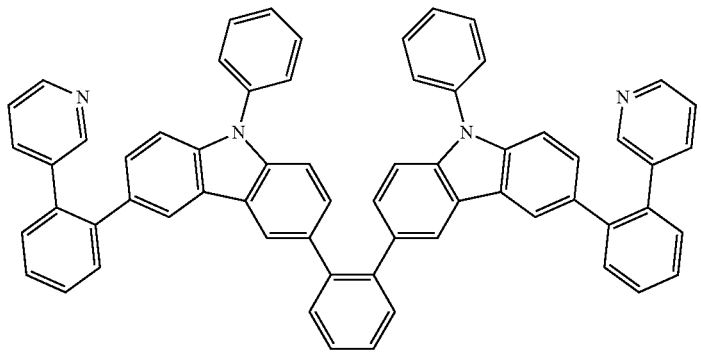
49
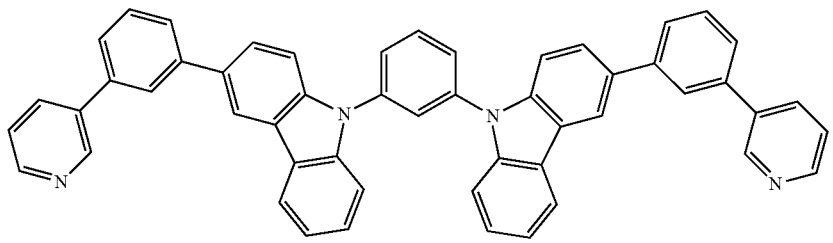
50
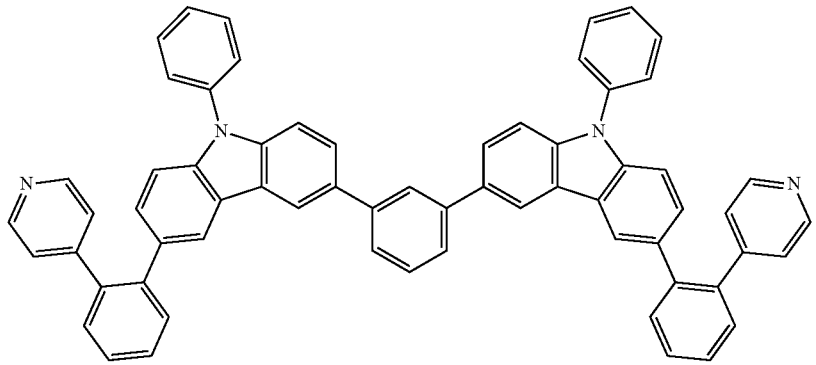
51
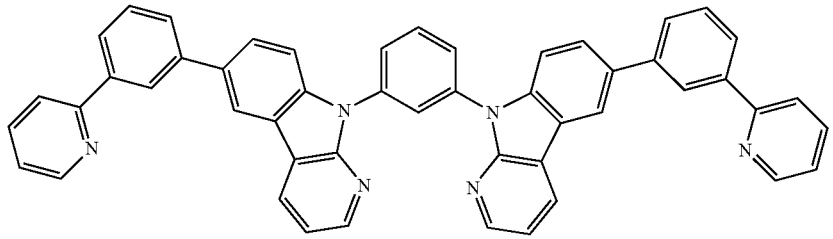
52

[Chemical Formula 21]
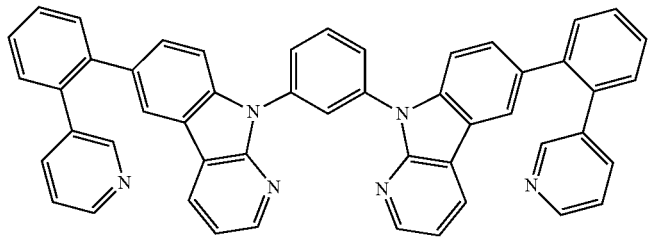
53
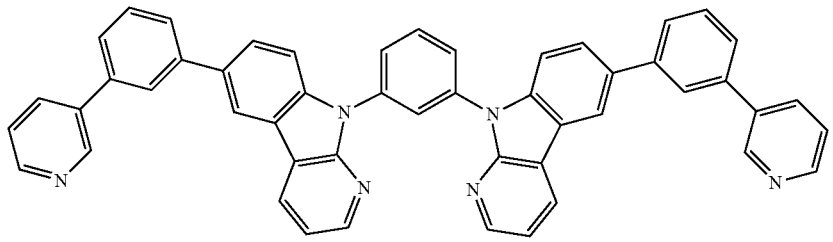
54
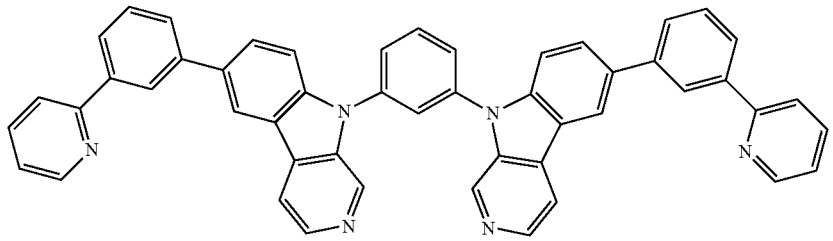
55
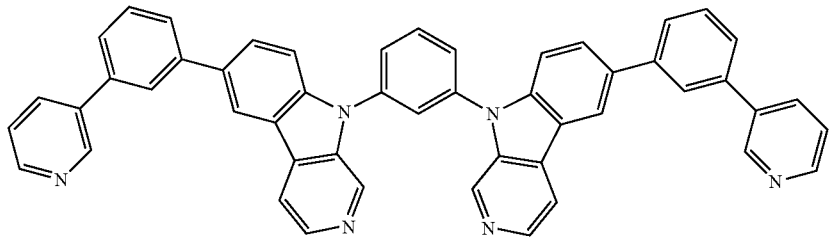
56
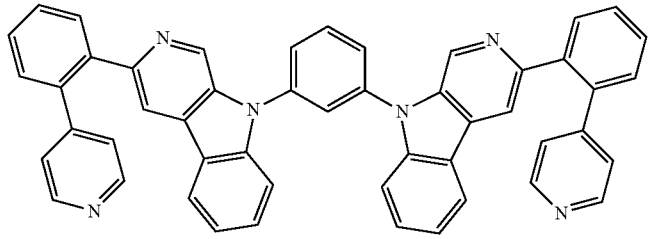
57
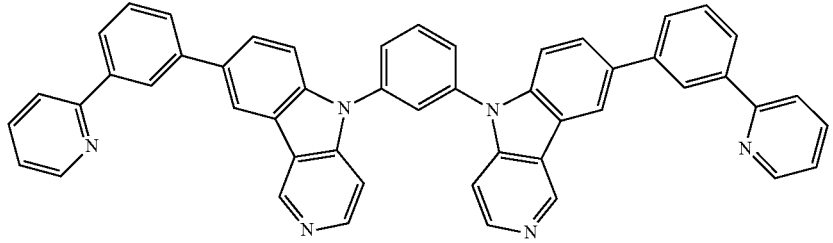
58
[Chemical Formula 22]

-continued
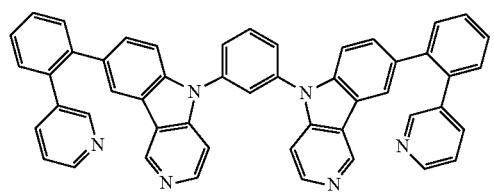
59
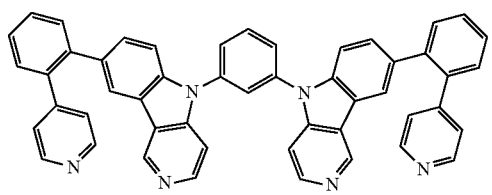
60
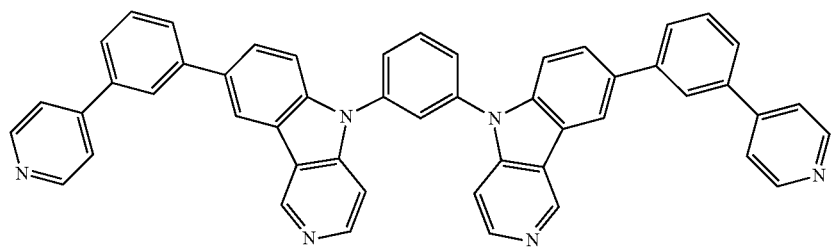
61
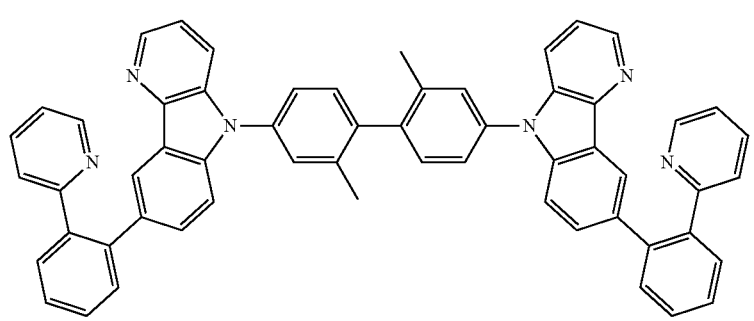
62
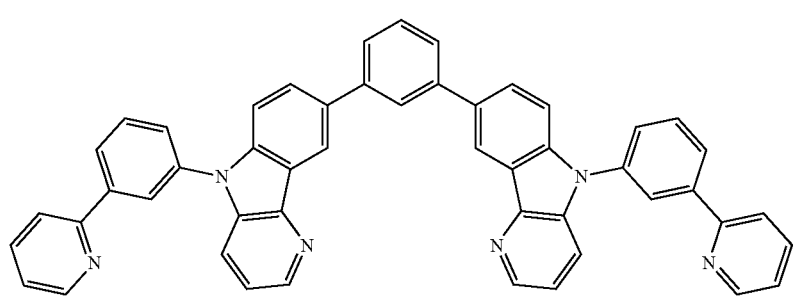
63
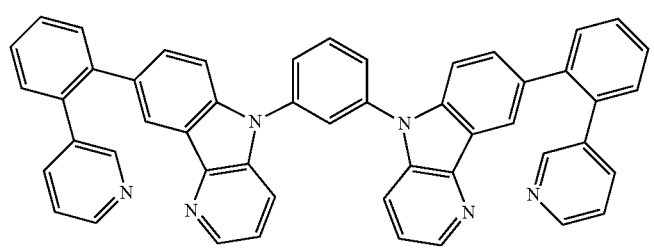
64
[Chemical Formula 23]

65
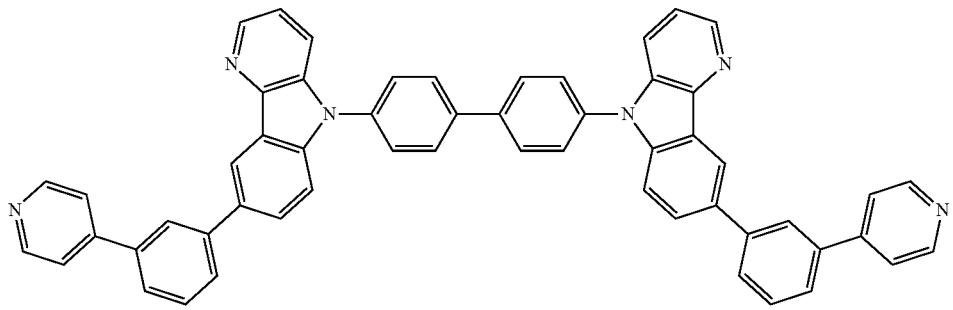
66
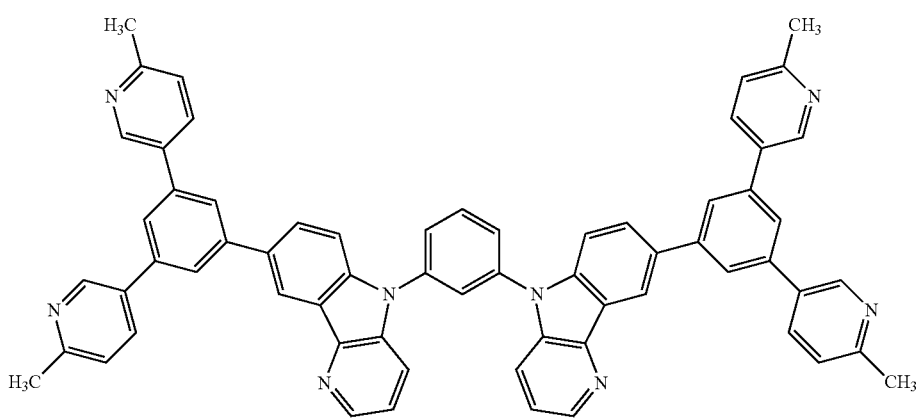
67
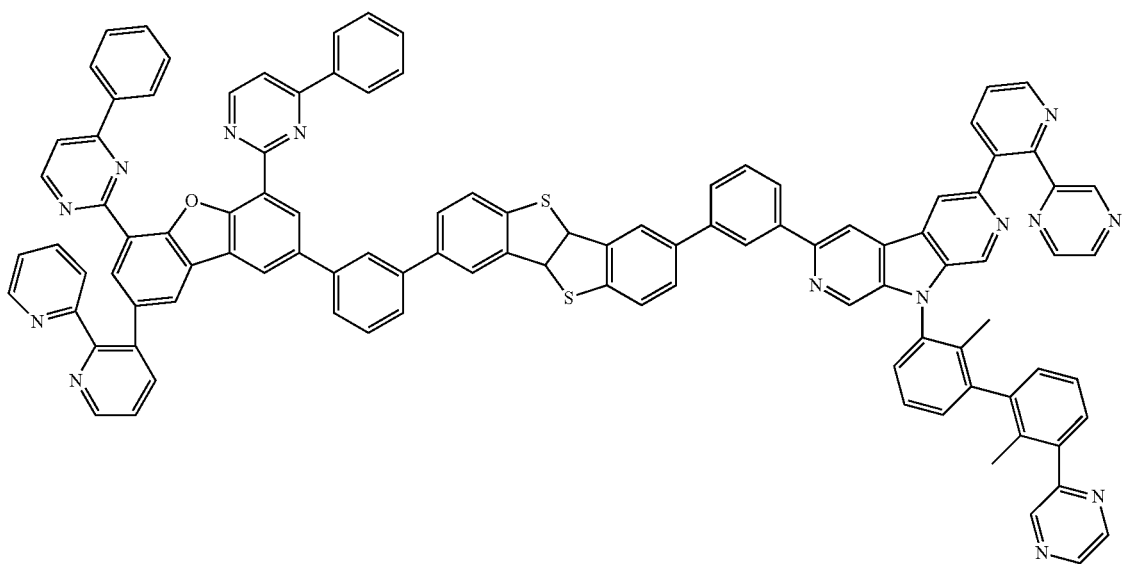
[Chemical Formula 24]

68
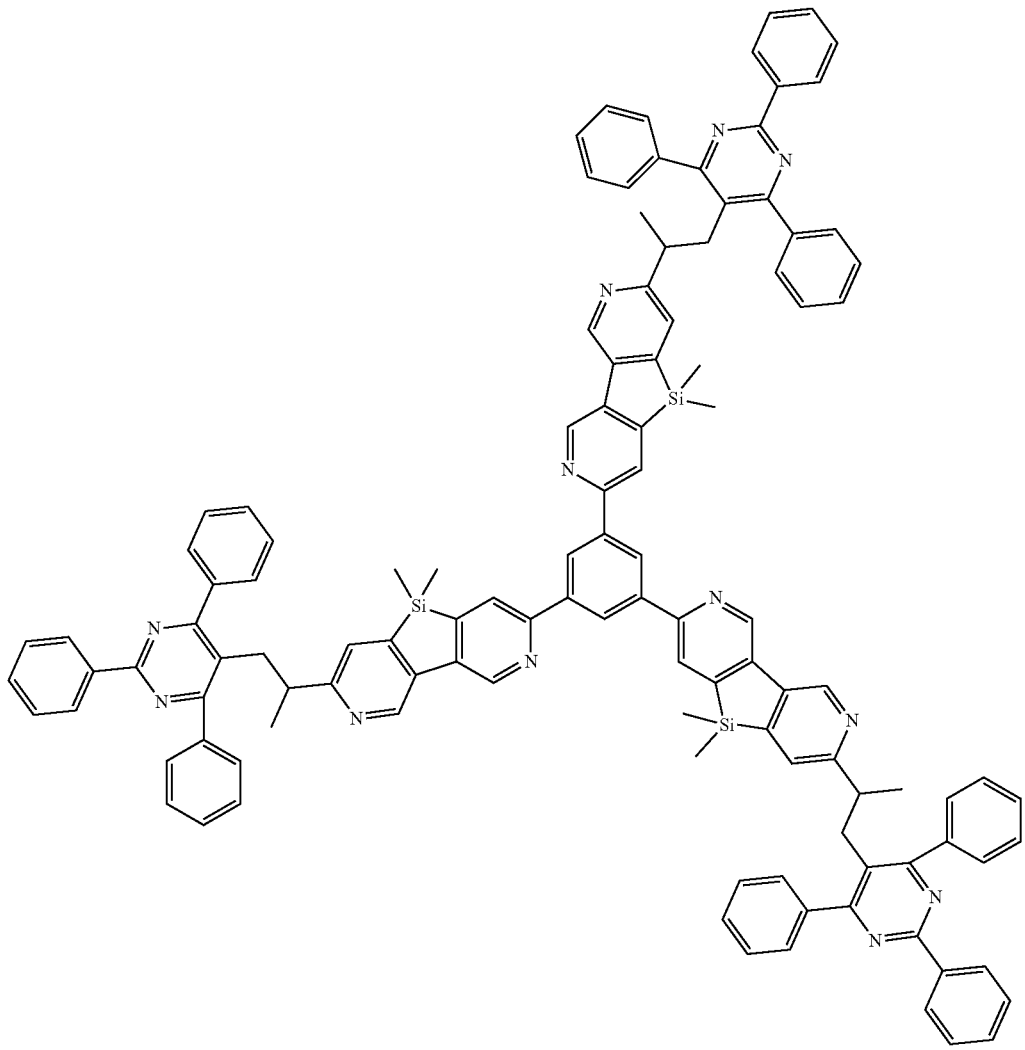
69
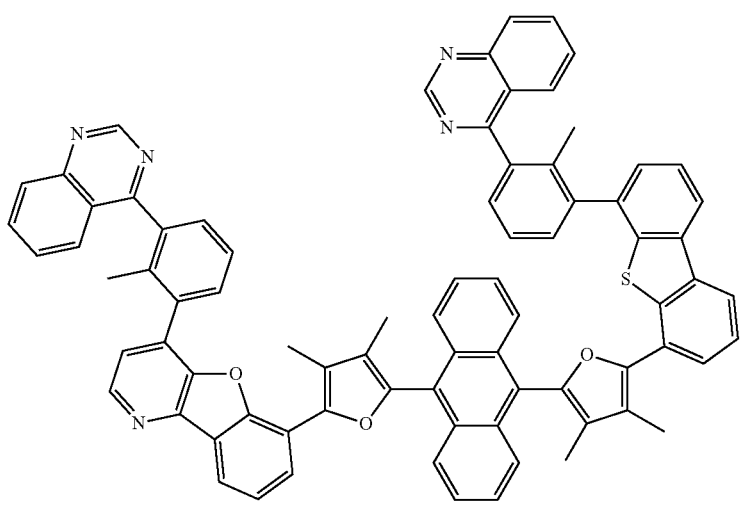
[Chemical Formula 25]

-continued
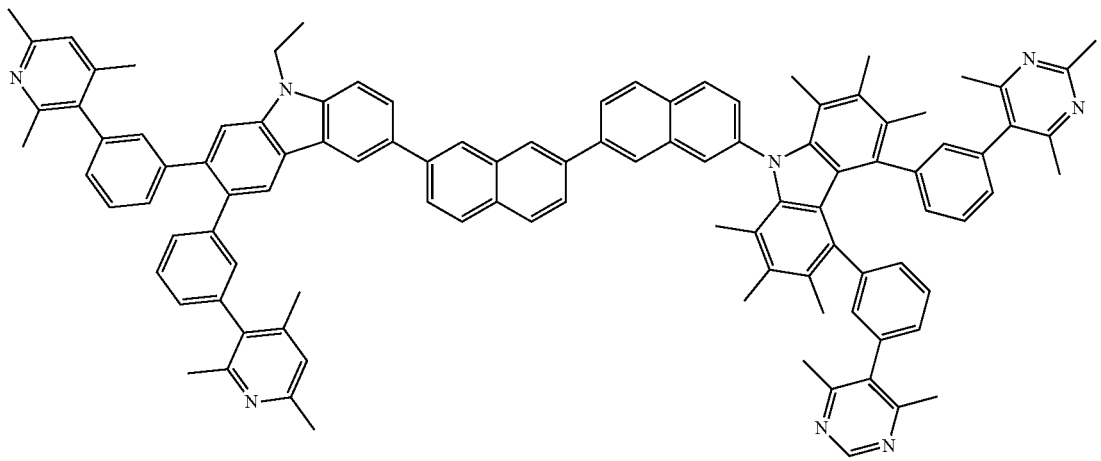
70
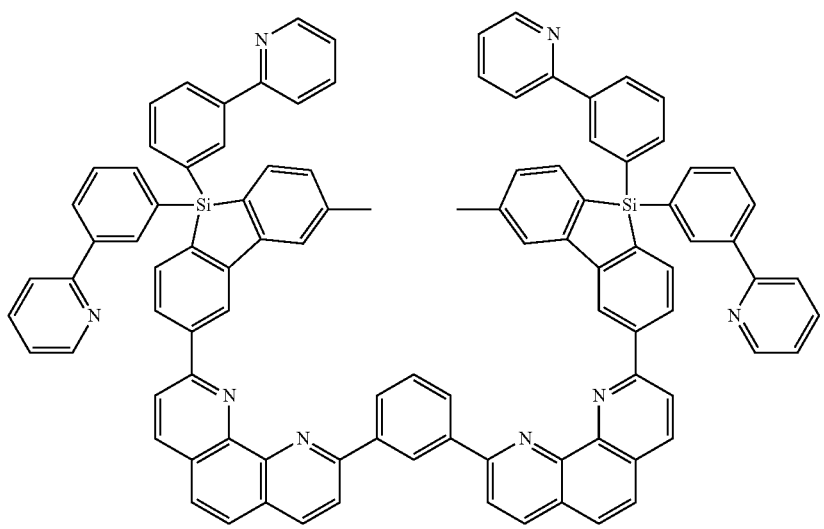
71
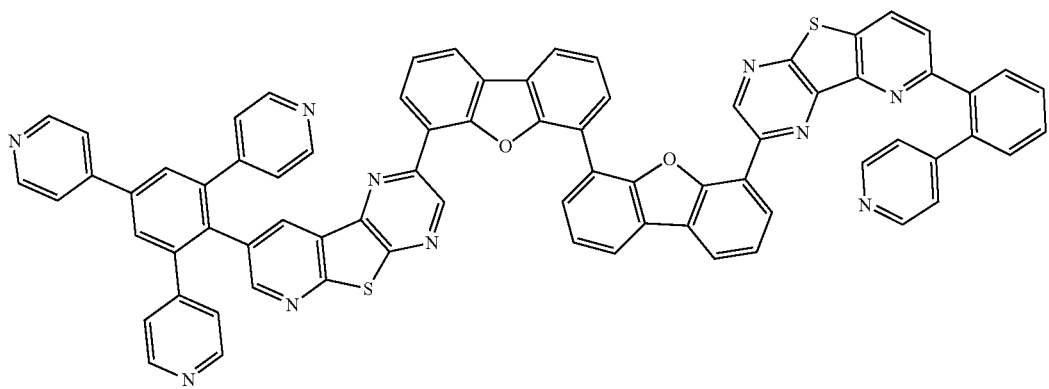
72
[Chemical Formula 26]

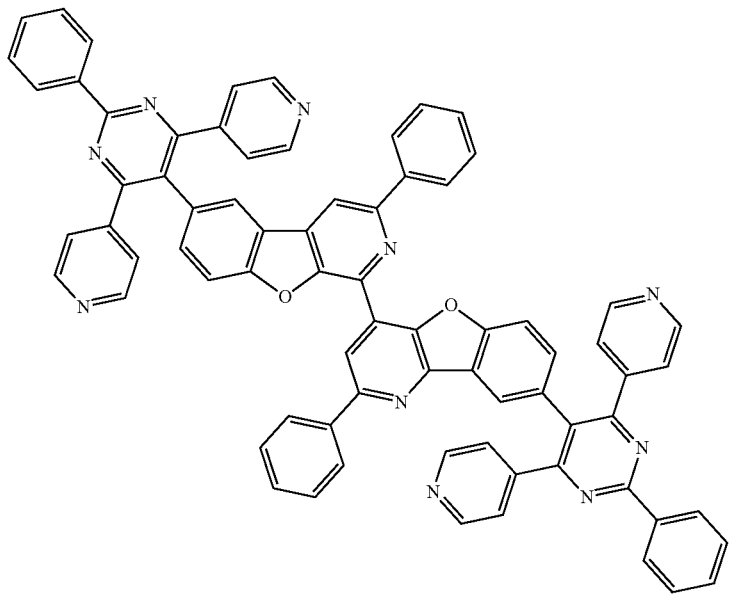
73
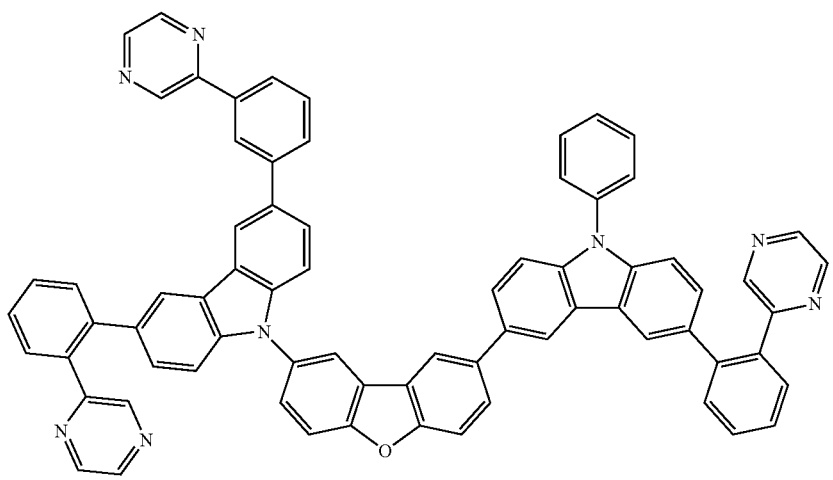
74

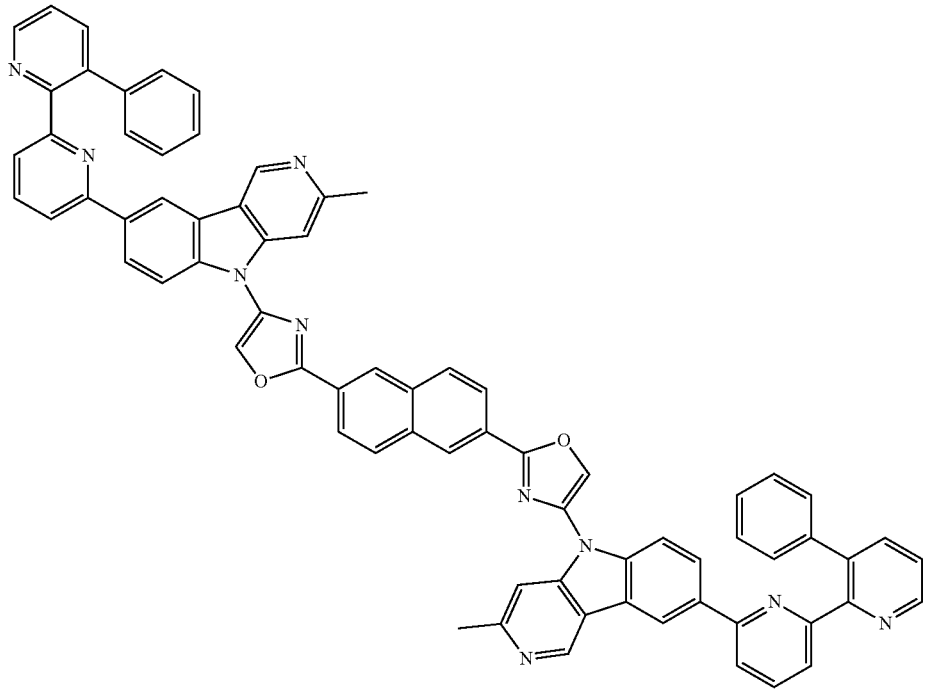
75
[Chemical Formula 27]
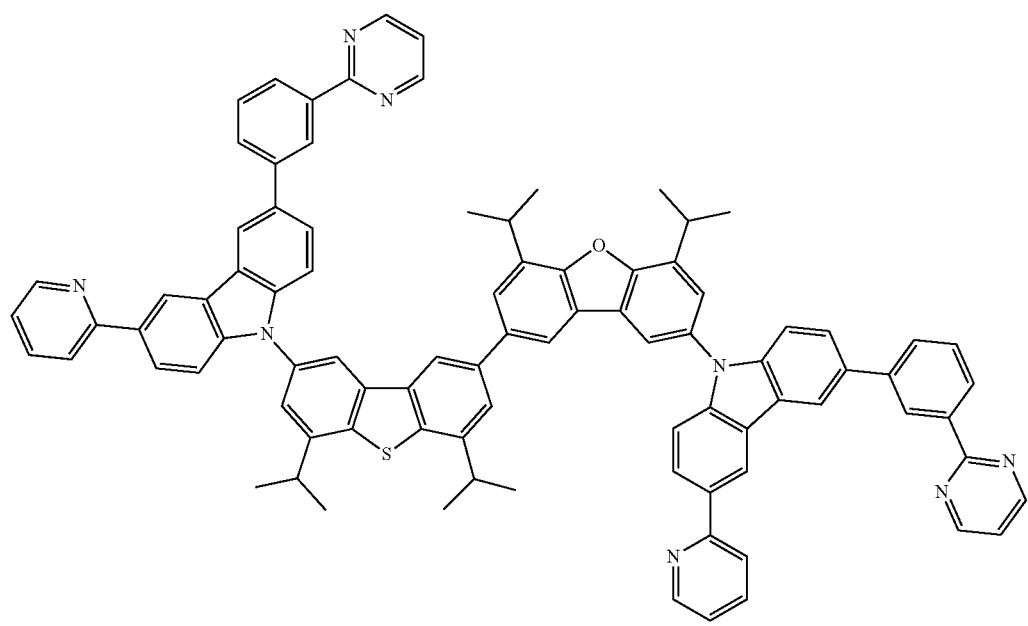
76

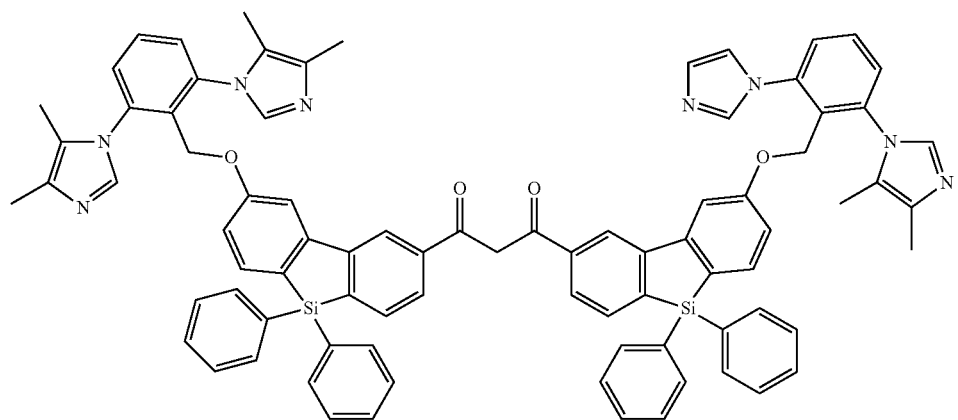
77
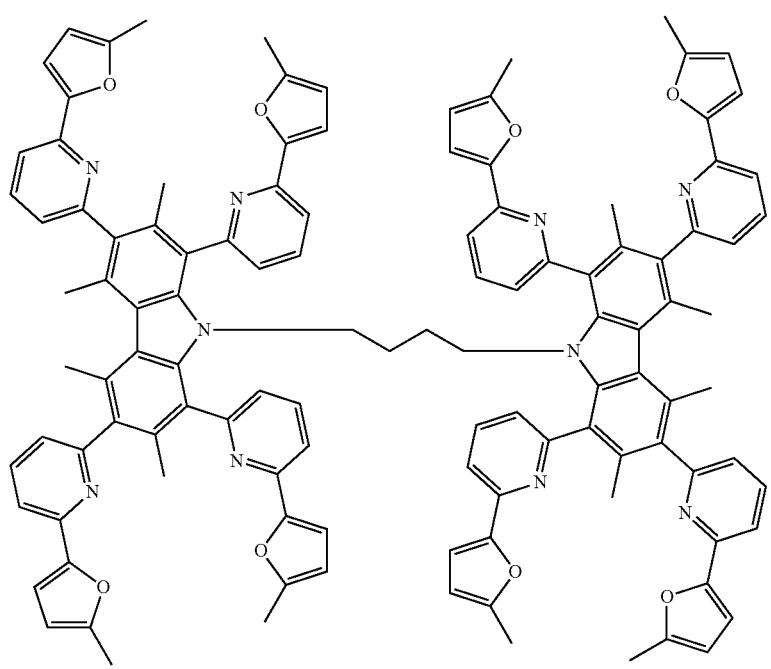
78
[Chemical Formula 28]

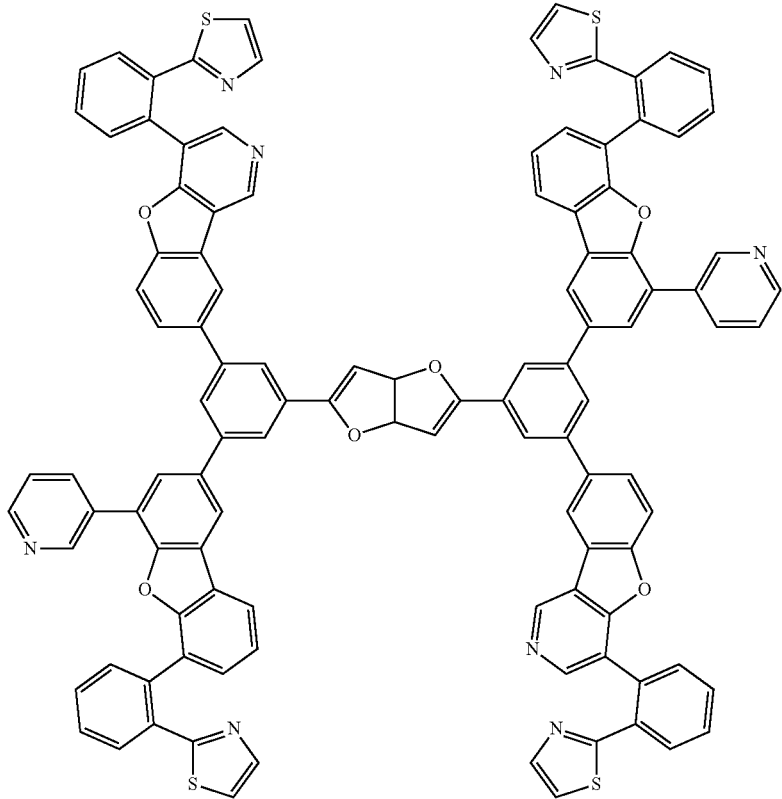
79
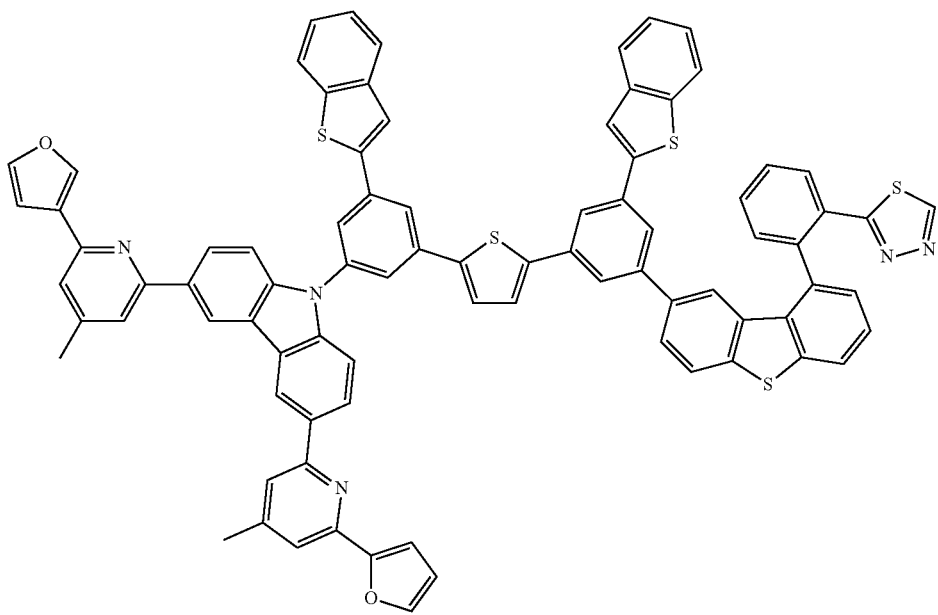
80
[Chemical Formula 29]

-continued
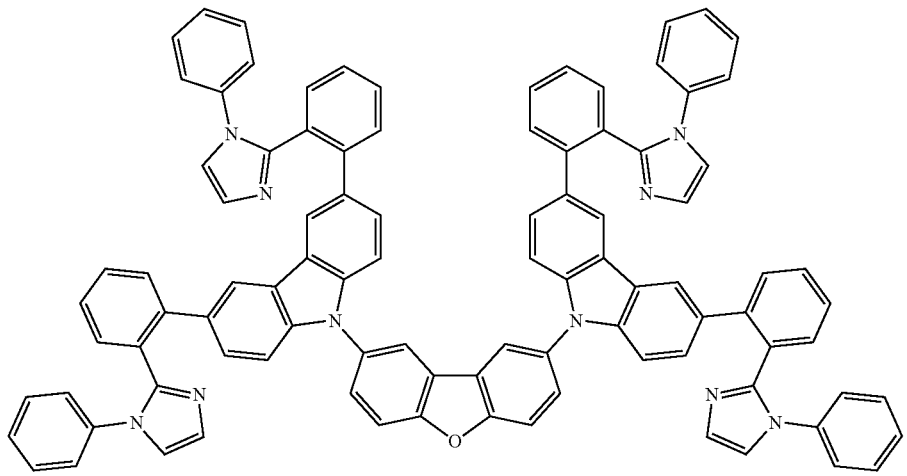
81
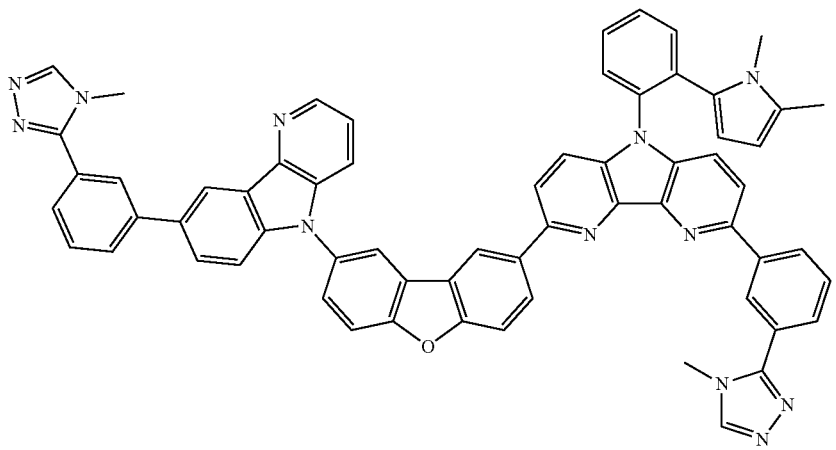
82

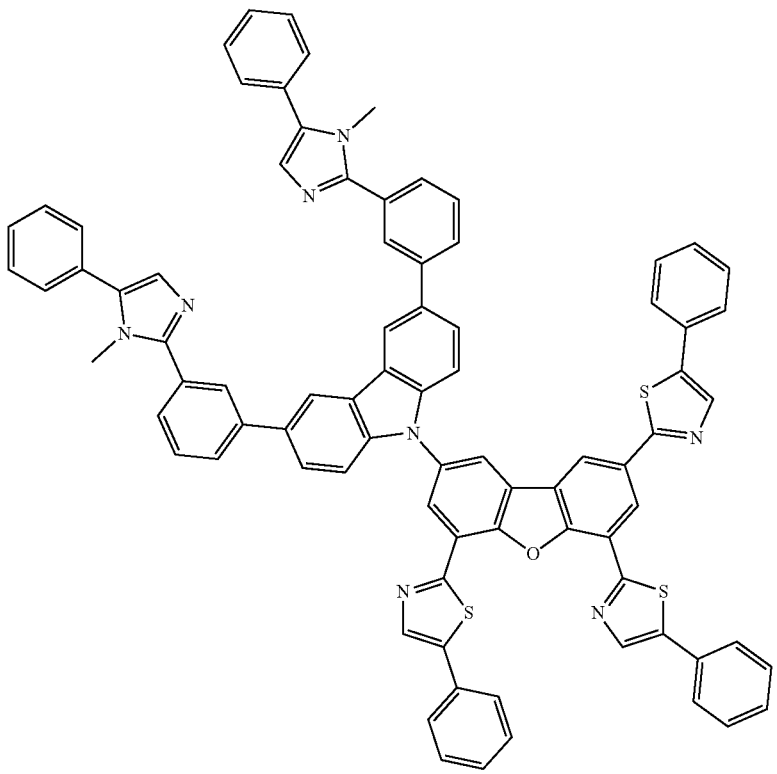
83
[Chemical Formula 30]
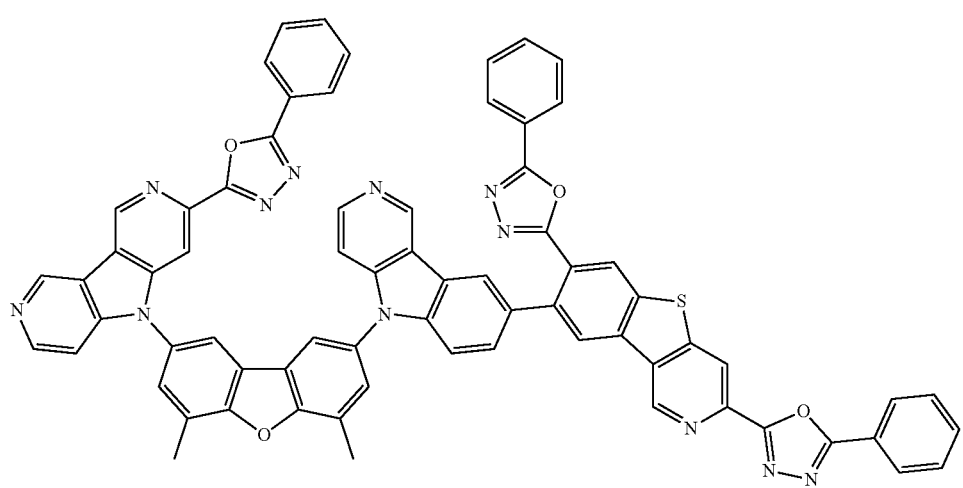
84

-continued
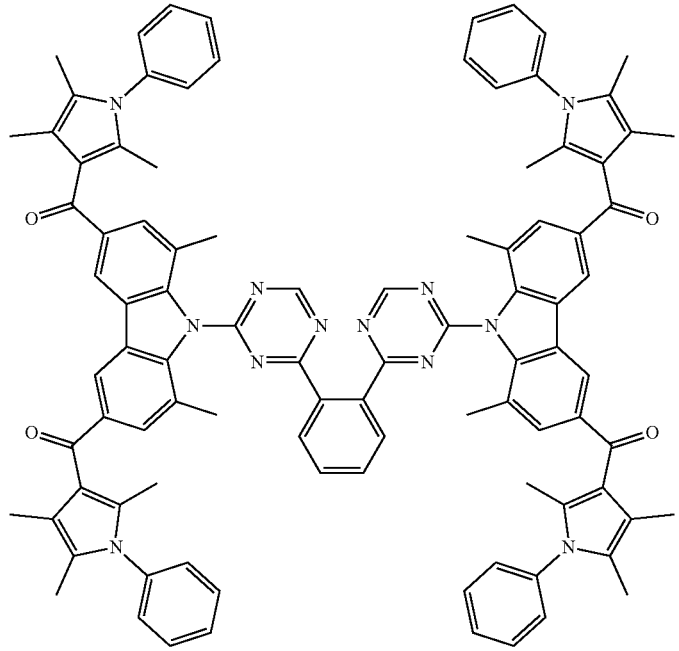
85
[Chemical Formula 31]
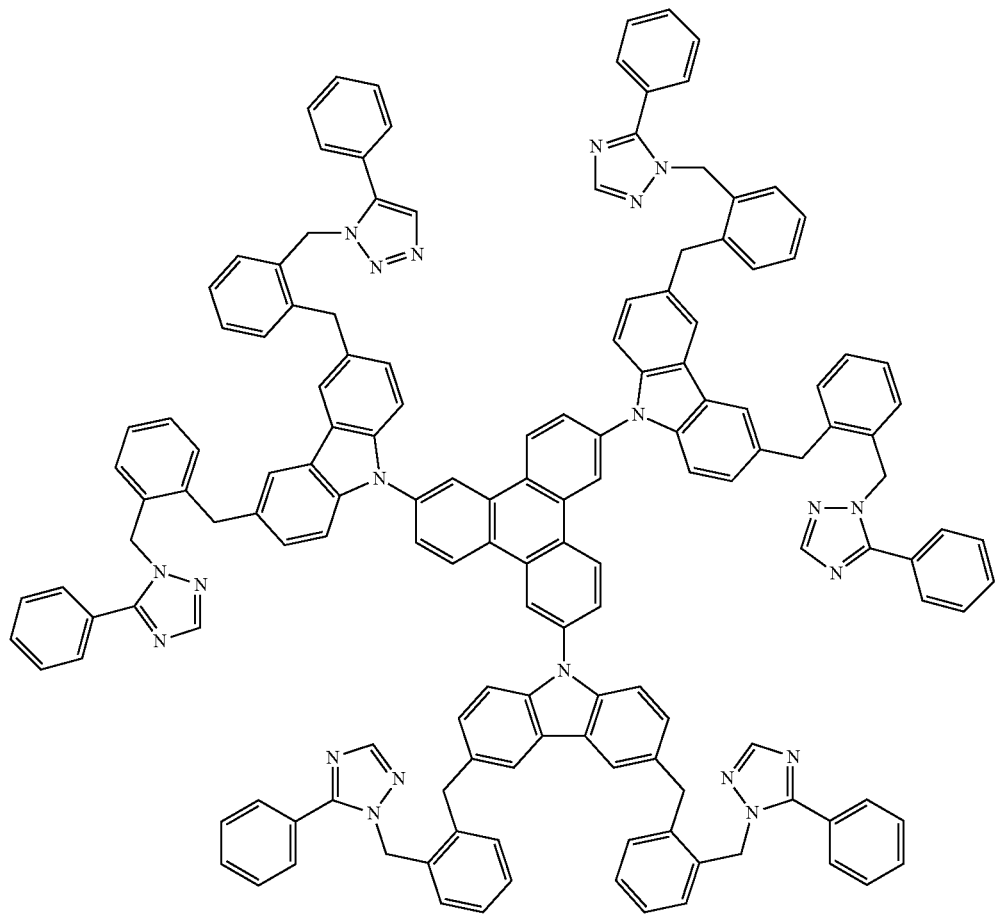
86

-continued
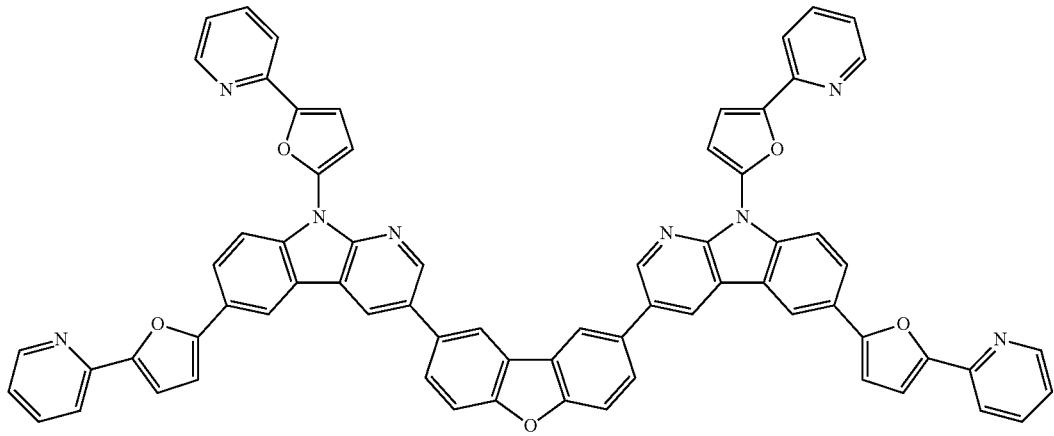
87
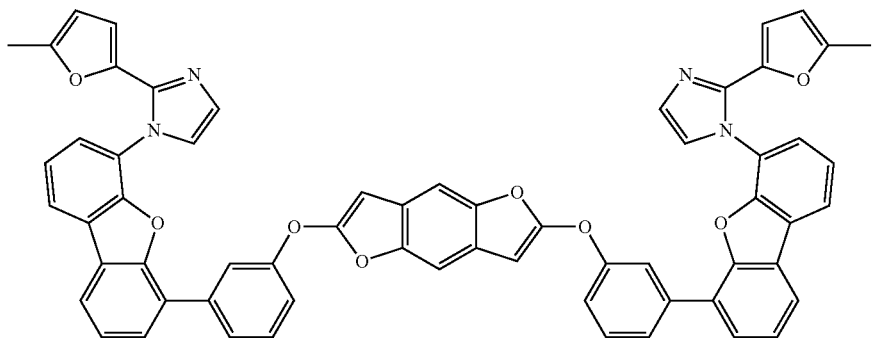
88
[Chemical Formula 32]
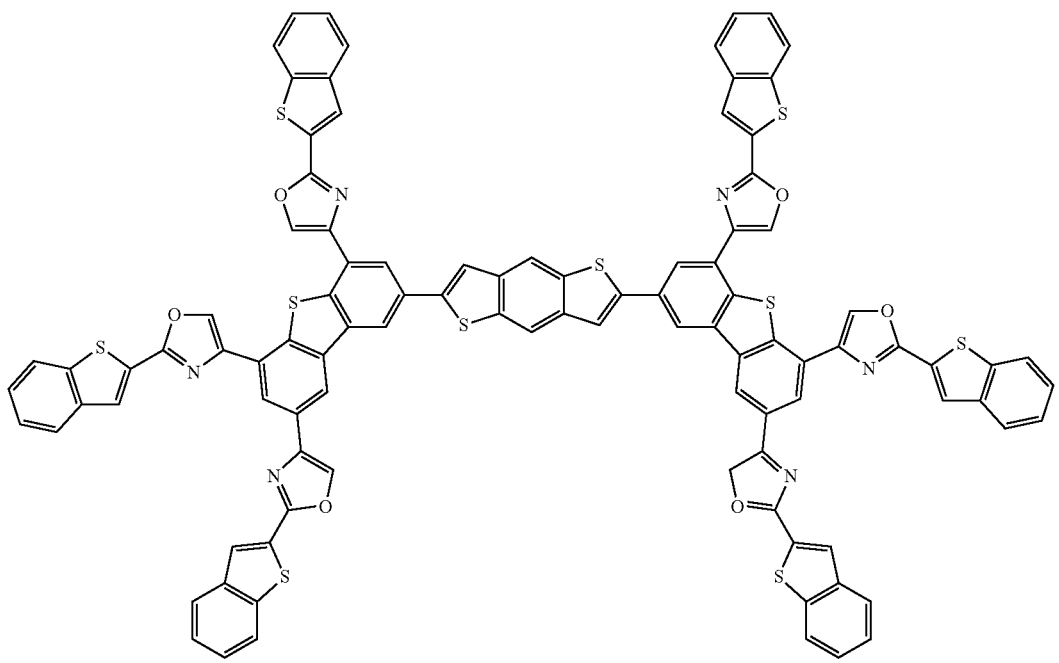
89

-continued
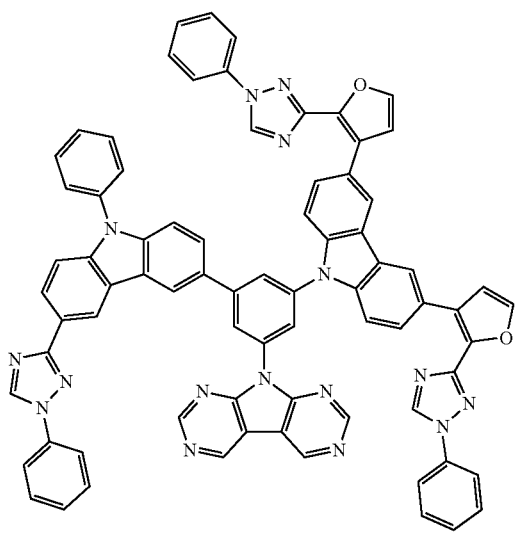
90
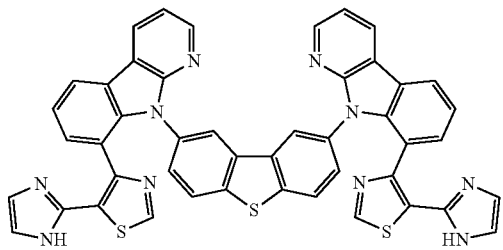
91
[Chemical Formula 33]
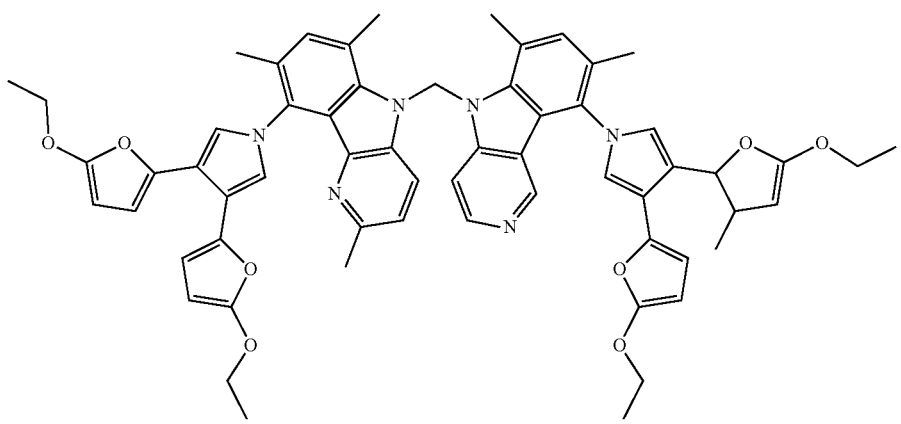
92
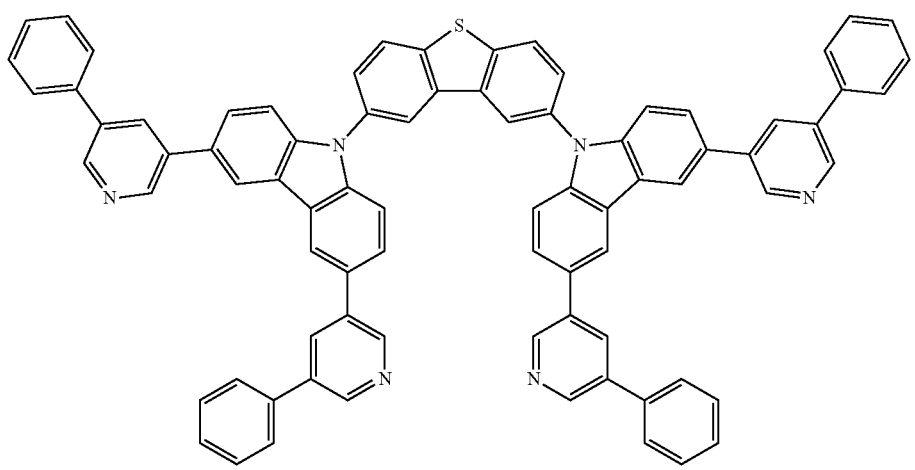
93

94
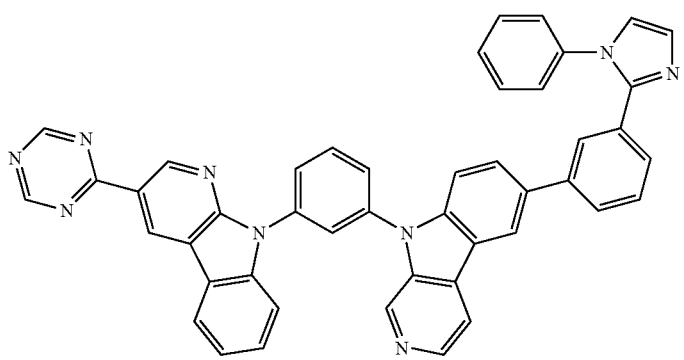
95
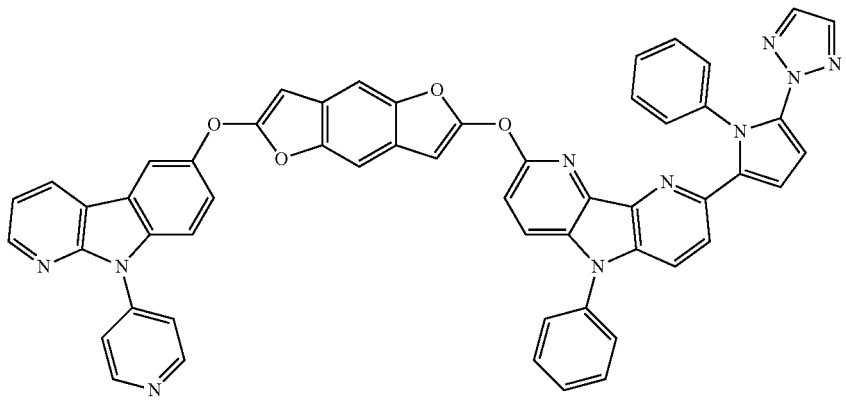
[Chemical Formula 34]
96
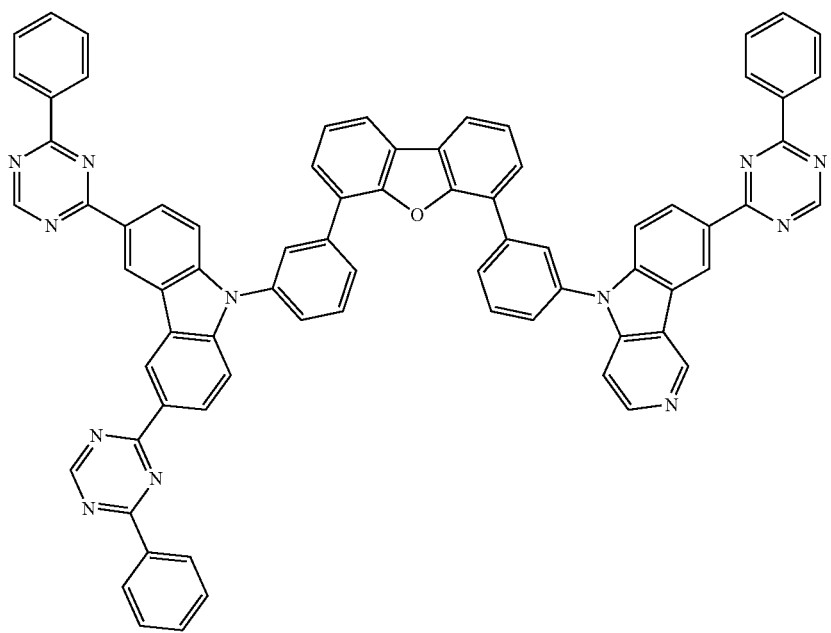

97
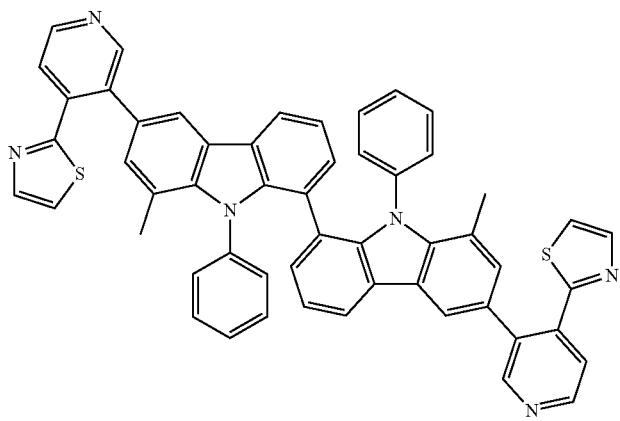
98
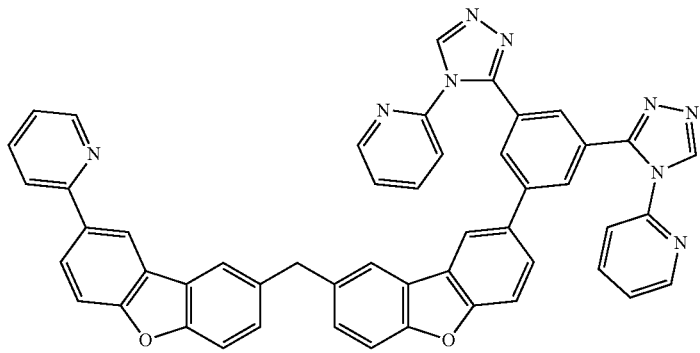
99
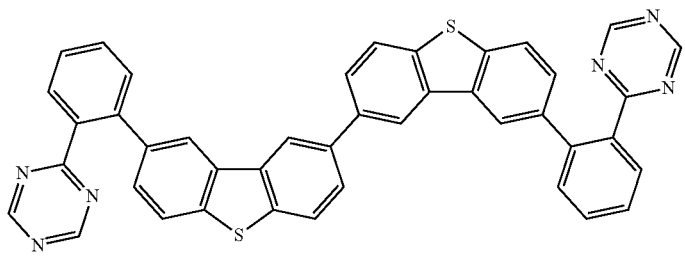
[Chemical Formula 35]
100
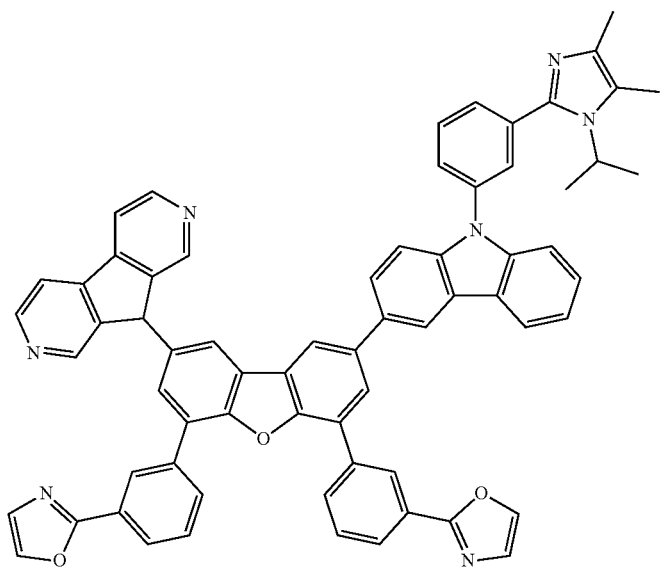

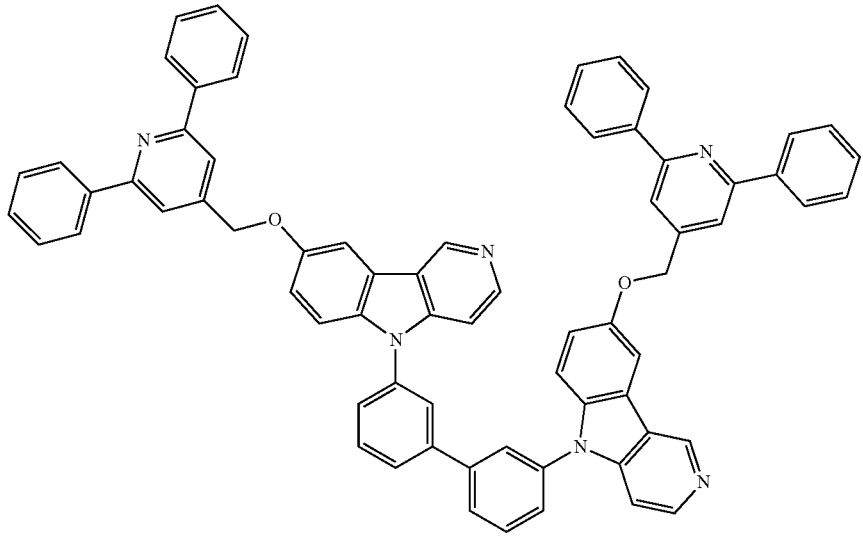
101
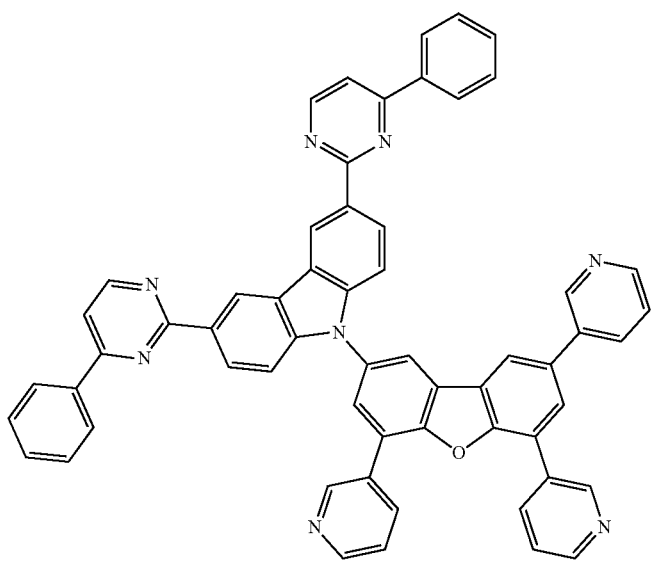
102
[Chemical Formula 36]
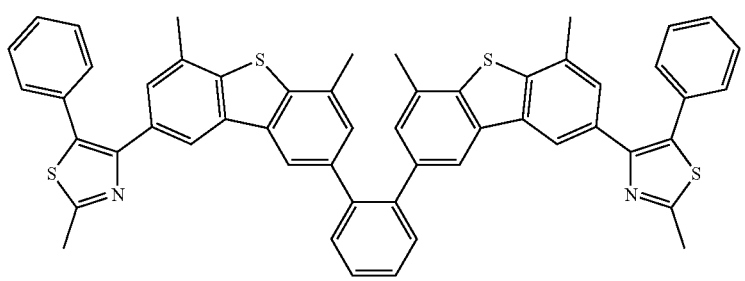
103

-continued
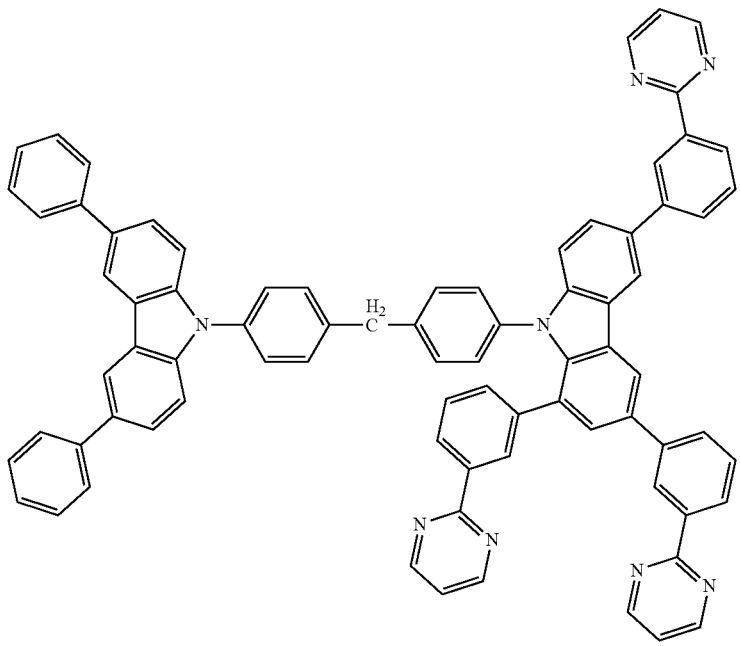
104
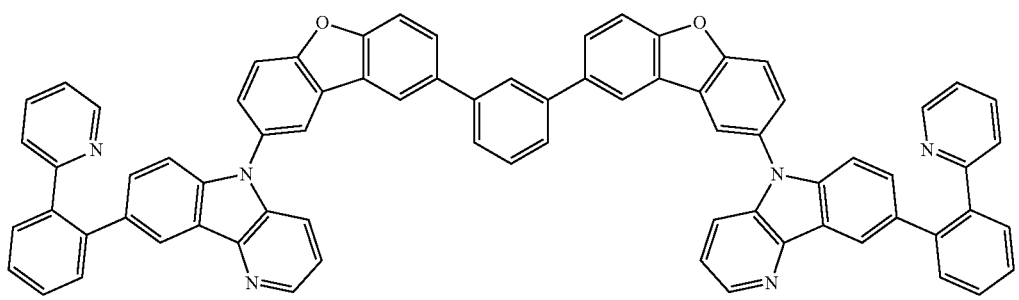
105
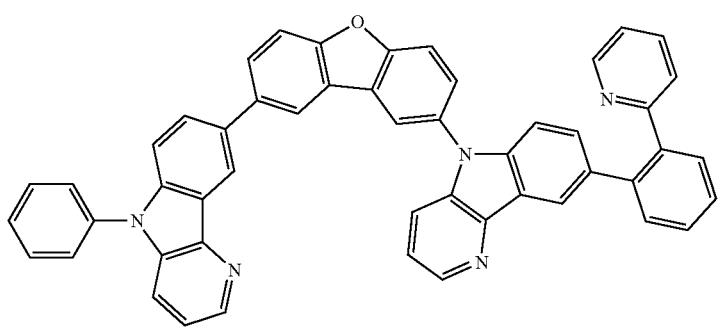
106
[Chemical Formula 37]

107
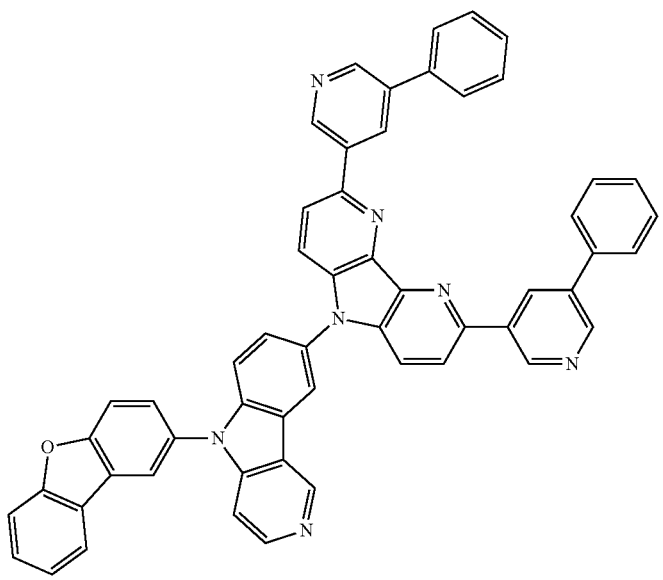
108
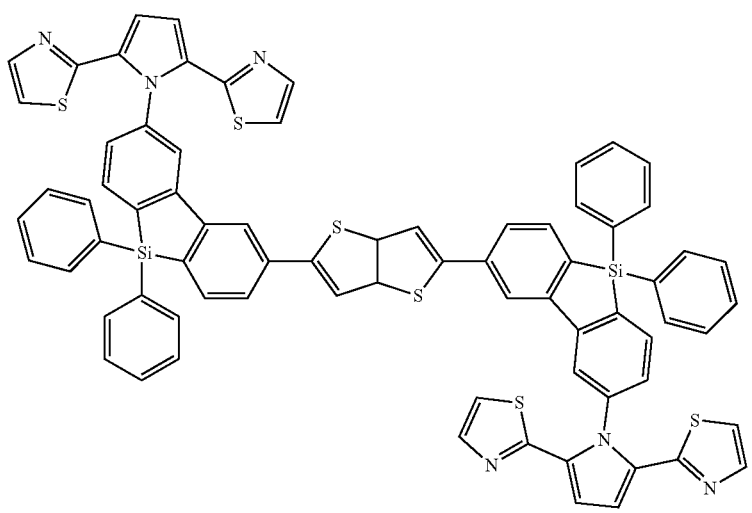
109
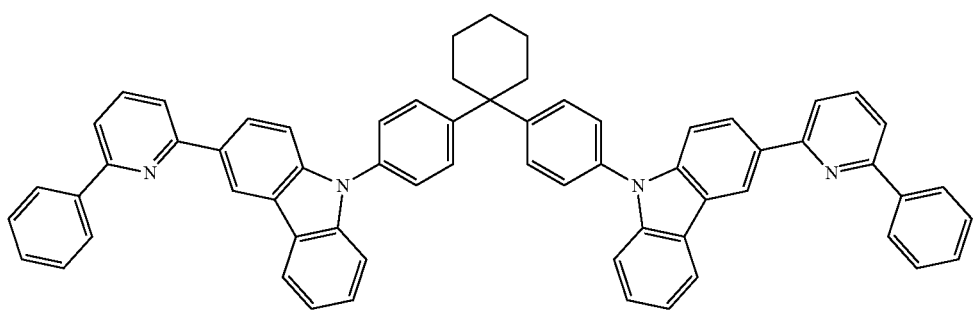
[Chemical Formula 38]

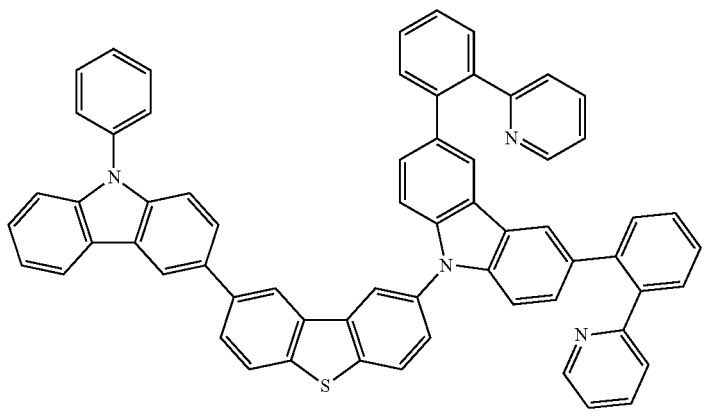
110
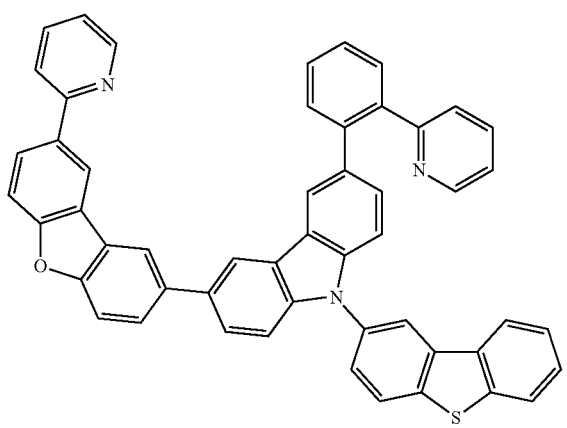
111
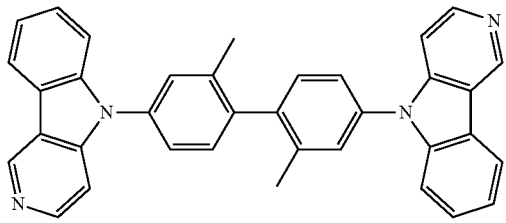
112
[Example of Synthesizing Compound]
As an example of synthesizing a typical compound, a concrete example of synthesizing a compound 5 is described below; however, the present invention is not limited thereto.
SYNTHESIS OF COMPOUND 5
[Chemical Formula 39]
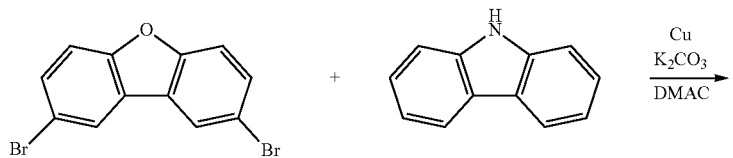

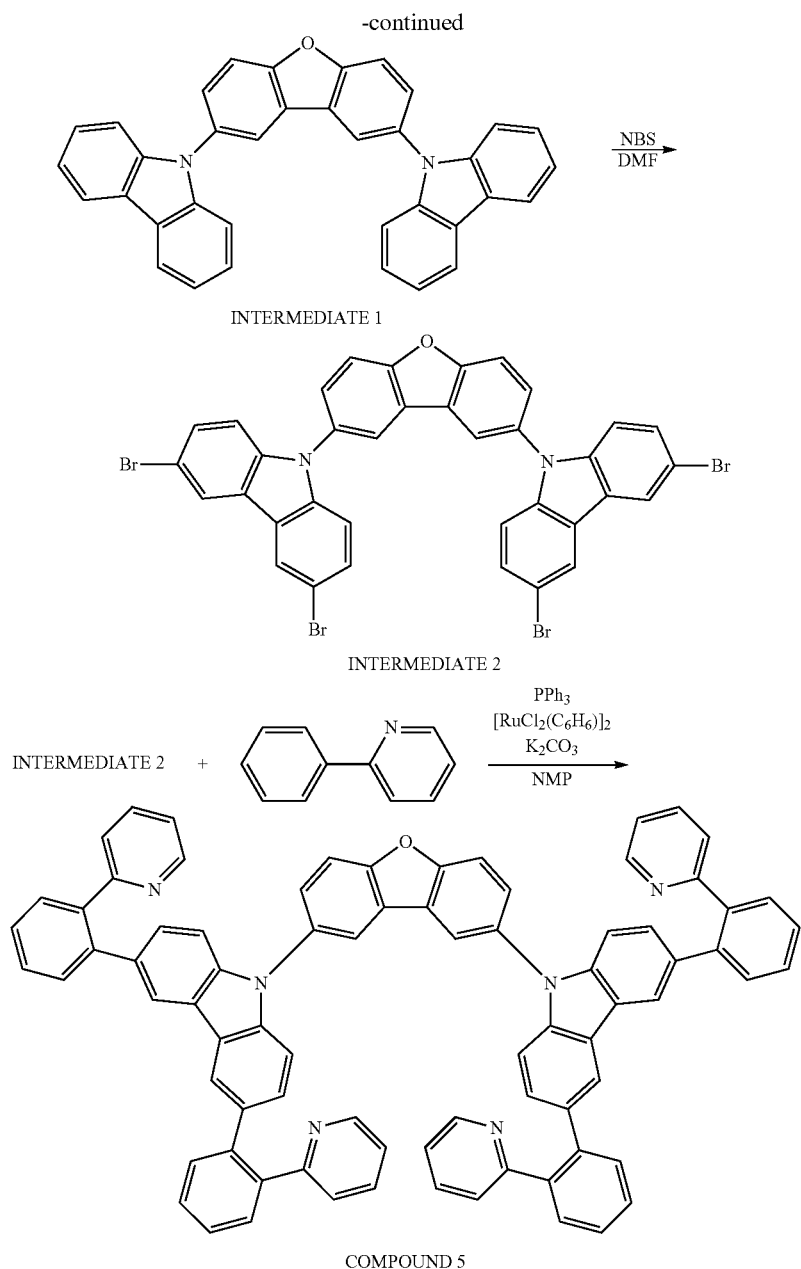

INTERMEDIATE 1

INTERMEDIATE 2

COMPOUND 5

Process 1: (Synthesis of Intermediate 1)

Under nitrogen atmosphere, 2,8-dibromodibenzofuran (1.0 mol), carbazole (2.0 mol), copper powder (3.0 mol) and potassium carbonate (1.5 mol) were mixed in 300 ml of DMAc (dimethylacetamide) and then stirred for 24 hours at 130° C. After the reaction liquid obtained in the above-described manner was cooled to room temperature, 1 liter of toluene was added to the reaction liquid, the resultant substance was washed three times with distilled water, the solvent was distilled off from the washed substance under a reduced pressure, and the residue was purified with silica gel flash chromatography (n-heptane:toluene=4:1 to 3:1) to obtain an intermediate 1 at a yield of 85%.

Process 2: (Synthesis of Intermediate 2)

At room temperature under atmospheric pressure, the intermediate 1 (0.5 mol) was dissolved into 100 ml of DMF (dimethylformamide), and 2.0 mol of NBS (N-bromosuccinimide) was added, and then the resultant liquid was stirred for one night at room temperature. The obtained precipitate was filtered and washed with methanol to obtain an intermediate 2 at a yield of 92%.

Process 3: (Synthesis of Compound 5)

Under nitrogen atmosphere, the intermediate 2 (0.25 mol), 2-phenylpyridine (1.0 mol), ruthenium complex [($\eta_6$-$C_6H_6$)$RuCl_2$]$_2$ (0.05 mol), triphenylphosphine (0.2 mol), and potassium carbonate (12 mol) were mixed in 3 liters of NMP (N-methyl-2-pyrrolidone), and then the mixture was stirred for one night at 140° C.

After the reaction liquid was cooled to room temperature, 5 liters of dichloromethane was added to the reaction liquid, and then the reaction liquid was filtered. Next, the solvent was distilled off from the filtrate under a reduced-pressure atmosphere (800 Pa, 80° C.), and the residue was purified with silica gel flash chromatography (CH$_2$Cl$_2$:Et=N=20:1 to 10:1).

After the solvent had been distilled off from the purified substance under the reduced-pressure atmosphere, the residue was dissolved again into dichloromethane and washed three times with water. The substance obtained by washing was dried with anhydrous magnesium sulfate, and the solvent was distilled off from the dried substance under the reduced-pressure atmosphere to thereby obtain the compound 5 at a yield of 68%.

<Electrode Layer 1b>

The electrode layer 1b is a layer formed adjacent to the nitrogen-containing layer by using silver or an alloy having silver as a main component. The electrode layer 1b may be formed by a method based on wet process, a method based on dry process or the like, wherein examples of the method based on wet process include a coating method, an ink-jet method, a dipping method and the like, and the method based on dry process include a deposition method (e.g., a resistance heating method, an EB method or the like), a sputtering method, a CVD method and the like). Among these methods, the deposition method is preferably used. The electrode layer 1b is characterized in that, by being formed adjacent to the nitrogen-containing layer 1a, a conductive layer thereof has sufficient electrical conductivity without performing high-temperature annealing or the like after film-formation; however, high-temperature annealing or the like may also be performed, according to necessity, after film-formation.

Examples of the alloy having silver as a main component, which constitutes the electrode layer 1b, include silver magnesium (AgMg), silver copper (AgCu), silver palladium (AgPd), silver palladium copper (AgPdCu), silver indium (AgIn) and the like.

Alternatively, in the electrode layer 1b described above, the layer of silver or an alloy having silver as a main component may include a plurality of layers, according to necessity, laminated one on another.

Further, it is preferred that the film-thickness of the electrode layer 1b is in a range between 4 nm and 9 nm. If the film-thickness is larger than 9 nm, absorption component or reflection component of the layer will increase, and therefore the transmittance of the transparent electrode will become lower, which is undesirable. While if the film-thickness is smaller than 4 nm, the electrical conductivity of the layer will be insufficient, which is also undesirable.

Alternatively, the aforesaid transparent electrode 1, which has a laminated structure composed of the nitrogen-containing layer 1a and the electrode layer 1b formed adjacent to the nitrogen-containing layer 1a, may have a protective film coated on the upper face of the electrode layer 1b or have another conductive layer laminated on the upper face of the electrode layer 1b. In such a case, it is preferred that that the protective film and the conductive layer have light transmissibility so that the light transmissibility of the transparent electrode 1 is not impaired. Further, layer(s) may be provided between the nitrogen-containing layer 1a and the base material 11 according to necessity.

<Effect of Transparent Electrode 1>

The aforesaid transparent electrode 1 is configured by forming the electrode layer 1b adjacent to the nitrogen-containing layer 1a, wherein the nitrogen-containing layer 1a is formed by using a compound containing nitrogen atom, and the electrode layer 1b is formed of silver or an alloy having silver as a main component. Thus, when forming the electrode layer 1b adjacent to the nitrogen-containing layer 1a, the silver atom (which constitutes the electrode layer 1b) will interact with the compound containing nitrogen atom (which constitutes the nitrogen-containing layer 1a), so that diffusion distance of silver atom on the surface of the nitrogen-containing layer 1a is reduced, and therefore aggregation of silver is inhibited.

Generally, in the film-formation of the electrode layer 1b having silver as a main component, since thin-film grows in a nuclear growth mode (Volumer-Weber (VW) mode), silver particles are likely to be isolated into an island shape, it is difficult to obtain electrical conductivity if the film-thickness is small, and therefore the sheet resistance is high. Thus, it is necessary to increase the film-thickness to ensure necessary electrical conductivity; however, if the film-thickness is increased, the light transmittance will decrease, and therefore increasing film-thickness is not favorable for the transparent electrode.

However, with the transparent electrode 1 of the present invention, aggregation of silver on the surface of the nitrogen-containing layer 1a is inhibited as described above. Therefore, in the film-formation of the electrode layer 1b having silver as a main component, thin-film grows in a single-layer growth mode (Frank-van der Merwe (FV) mode).

Here, the term "transparent" of the transparent electrode 1 of the present invention means that the light transmittance for light having a wavelength of 550 nm is 50% or higher; the above-mentioned materials used for forming the nitrogen-containing layer 1a have sufficient light transmissibility compared with the electrode layer 1b having silver as a main component. On the other hand, the electrical conductivity of the transparent electrode 1 is mainly ensured by the electrode layer 1b. Therefore, as described above, the electrical conductivity of the electrode layer 1b having silver as a main component is ensured with thinner film-thickness, and thereby it becomes possible to improve both the electrical conductivity and the light transmissibility of the transparent electrode 1.

<<2. Applications of Transparent Electrode>>

The transparent electrode 1 having the aforesaid configuration can be used in various kinds of electronic devices. Examples of the electronic devices include organic electroluminescence elements, LED (Light Emitting Diode), liquid crystal elements, solar cells, touch panels and the like; and the transparent electrode 1 can be used as an electrode member of each of these electronic devices wherein the electrode member needs to have light transmissibility.

As an example of the application, an embodiment of the organic electroluminescence element using the transparent electrode will be described below.

<<3. First Example of Organic Electroluminescence Element>>

<Configuration of Organic Electroluminescence Element EL-1>

Figure 2:
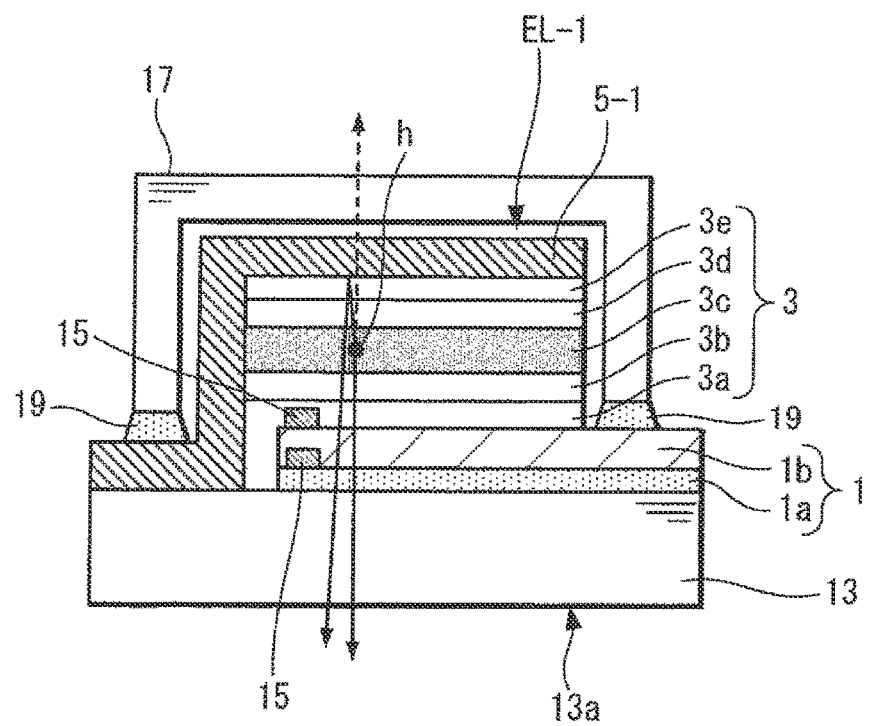
FIG. 2 is a view showing a cross-sectional configuration of a first example of an organic electroluminescence element that uses the transparent electrode according to the present invention.

As an example of the electronic device of the present invention, FIG. 2 shows a cross-sectional configuration of a first example of an organic electroluminescence element that uses the aforesaid transparent electrode 1. The configuration of the organic electroluminescence element will be described below with reference to FIG. 2.

An organic electroluminescence element EL-1 shown in FIG. 2 is arranged on a transparent substrate 13, and is formed by laminating a transparent electrode 1, a light-emitting functional layer 3 and an opposite electrode 5-1, in this order, from the side of the transparent substrate 13, wherein the light-emitting functional layer 3 is formed by using an organic material and the like. It is characterized that the aforesaid transparent electrode 1 according to the present invention is used as the transparent electrode 1 of the organic electroluminescence element EL-1. Thus, in the organic electroluminescence element EL-1, the emitted light (referred to as "emitted light h" hereinafter) is extracted at least from the side of the transparent substrate 13.

Further, the layer-structure of the organic electroluminescence element EL-1 is not particularly limited, but may be a generic layer-structure. Here, it is assumed that the transparent electrode 1 functions as an anode, and the opposite electrode 5-1 functions as a cathode. In such a case, for example, the light-emitting functional layer 3 is formed by laminating a hole injecting layer 3*a*/a hole transporting layer 3*b*/a light emitting layer 3*c*/an electron transporting layer 3*d*/an electron injecting layer 3*e*, in this order, from the side of the transparent electrode 1 (i.e., the anode); among these layers, at least the light emitting layer 3*c* formed by using an organic material is indispensable. The hole injecting layer 3*a* and the hole transporting layer 3*b* may be formed as a single hole transporting/injecting layer. The electron transporting layer 3*d* and the electron injecting layer 3*e* may be formed as a single electron transporting/injecting layer. Further, among the aforesaid layers of the light-emitting functional layer 3, the electron injecting layer 3*e*, for example, may also be formed of an inorganic material.

In addition to the aforesaid layers, the light-emitting functional layer 3 may have other layer(s), such as a hole blocking layer, an electron blocking layer and/or the like, laminated on required place(s) according to necessity. Further, the light emitting layer 3*c* may include a plurality of emitting layers each emit light of different wavelength range, and the plurality of emitting layers are laminated one on another with a non-luminescent intermediate layer interposed between each two layers. The intermediate layer may function as a hole blocking layer or an electron blocking layer. Further, the opposite electrode 5-1 (i.e., the cathode) may also have a laminated structure according to necessity. In such a configuration, only a part where the light-emitting functional layer 3 is sandwiched by the transparent electrode 1 and the opposite electrode 5-1 is a light-emitting region of the organic electroluminescence element EL-1.

In the aforesaid layer-structure, in order to reduce the resistance of the transparent electrode 1, an auxiliary electrode 15 may be provided in contact with the electrode layer 1*b* of the transparent electrode 1.

In order to prevent the deterioration of the light-emitting functional layer 3, which is formed by using an organic material and the like, the organic electroluminescence element EL-1 having the aforesaid configuration is sealed by a sealing material 17 (which is to be described later) on the transparent substrate 13. The sealing material 17 is fixed to the side of the transparent substrate 13 through an adhesive 19. However, the end portions of both the transparent electrode 1 and the opposite electrode 5-1 are exposed from the sealing material 17 in a state where the transparent electrode 1 and the opposite electrode 5-1 are insulated from each other by the light-emitting functional layer 3 on the transparent substrate 13.

The details of the main layers which constitute the aforesaid organic electroluminescence element EL-1 will be described below in the following order: the transparent substrate 13, the transparent electrode 1, the opposite electrode 5-1, the light emitting layer 3*c* of the light-emitting functional layer 3, the other layers of the light-emitting functional layer 3, the auxiliary electrode 15, and the sealing material 17. Thereafter, a production method of the organic electroluminescence element EL-1 will be described.

[Transparent Substrate 13]

The transparent substrate 13 is the base material 11 described before on which the transparent electrode 1 of the present invention is formed; and among the examples of the base material 11 described before, the transparent base material 11 having light transmissibility is used as the transparent substrate 13.

[Transparent Electrode 1 (Anode)]

The transparent electrode 1 is the transparent electrode 1 of the present invention described before; and is configured by forming a nitrogen-containing layer 1*a* and an electrode layer 1*b*, in this order, from the side of the transparent substrate 13. Particularly, herein the transparent electrode 1 functions as an anode, and the electrode layer 1*b* is substantive anode.

[Opposite Electrode 5-1 (Cathode)]

The opposite electrode 5-1 is an electrode film functioning as a cathode that supplies electrons to the light-emitting functional layer 3; and is formed by using a metal, an alloy, an organic or inorganic conductive compound, or a mixture of these materials. To be specific, the opposite electrode 5-1 is formed by using aluminum, silver, magnesium, lithium, a magnesium/copper mixture, a magnesium/silver mixture, a magnesium/aluminum mixture, a magnesium/indium mixture, indium, a lithium/aluminum mixture, a rare earth metal, an oxide semiconductor (such as ITO, ZnO, Tio2, SnO2 and the like) or the like.

The opposite electrode 5-1 can be formed by forming a thin-film with one of the aforesaid conductive materials by a method such as deposition, sputtering or the like. The sheet resistance of the opposite electrode 5-1 is preferably several hundred Q/sq. or less; and the film-thickness of the opposite electrode 5-1 is generally within a range from 5 nm to 5 μm, preferably within a range from 5 nm to 200 nm.

Incidentally, in the case where the organic electroluminescence element EL-1 is to be configured so that the emitted light h is also extracted from the side of the opposite electrode 5-1, the opposite electrode 5-1 may be formed by using a material with good light transmissibility selected from the aforesaid conductive materials.

[Light Emitting Layer 3*c*]

The light emitting layer 3*c* used in the present invention contains a phosphorescent compound as a light emitting material.

The light emitting layer 3*c* is a layer where electrons injected from the electrode or the electron transporting layer 3*d* and holes injected from the hole transporting layer 3*b* are recombined to emit light; and light emitting portion may be either the inside of the light emitting layer 3*c* or an interface between the light emitting layer 3*c* and its adjacent layer.

The structure of the light emitting layer 3*c* is not particularly limited as long as the light emitting material contained therein satisfies light emitting requirements. Further, the light emitting layer 3*c* may also include a plurality layers having the same emission spectrum and/or emission maximum wavelength. In such a case, it is preferable that a non-luminescent intermediate layer (not shown) is provided between each two adjacent light emitting layers 3*c*.

The total film-thickness of the light emitting layers 3*c* is preferably within a range from 1 nm to 100 nm and, and more preferably within a range from 1 nm to 30 nm because a lower driving voltage can be obtained in such range. Incidentally, the total film-thickness of the light emitting layers 3*c* is, if the non-luminescent intermediate layer is provided between each two adjacent light emitting layers 3*c*, the total film-thickness including the film-thickness of the intermediate layer(s).

In the case where the light emitting layer 3c has a configuration in which a plurality of layers are laminated one on another, the film-thickness of each emitting layer is preferably to be adjusted to a range from 1 nm to 50 nm, and further preferably to be adjusted to a range from 1 nm to 20 nm. In the case where the plurality of laminated light emitting layers respectively correspond to emission color of blue, emission color of green and emission color of red, the relationship between the film-thickness of the light emitting layer of blue, the film-thickness of the light emitting layer of green and the film-thickness of the light emitting layer of red is not particularly limited.

The aforesaid light emitting layer 3c can be formed by forming a thin film of a light emitting material or a host compound (which are to be described later) using a known thin film forming method such as a vacuum deposition method, a spin coating method, a casting method, an LB method, an ink-jet method or the like.

The light emitting layer 3c may be formed of a plurality of materials in mixture; or a phosphorescent material and a fluorescent material (also referred to as "fluorescent dopant" or "fluorescent compound") may be used in mixture in the same light emitting layer 3c.

It is preferred that the light emitting layer 3c contains a host compound (also referred to as light-emitting host or the like) and a light emitting material (also referred to as light-emitting dopant compound), and light is emitted by the light emitting material.

(Host Compound)

It is preferred that the host compound contained in the light emitting layer 3c is a compound whose phosphorescence quantum yield preferably is, when emitting phosphorescence at the room temperature (25° C.), less than 0.1, and further preferably is less than 0.01. Further, it is preferred that the volume ratio of the host compound of the compounds contained in the light emitting layer 3c is 50% or more.

One type of known host compound may be used as the host compound, or a plurality of types of known host compounds may be used as the host compound. By using a plurality of types of known host compounds, it is possible to adjust the transfer of electrical charges, and it is possible to improve the efficiency of the organic electroluminescence element EL-1. Further, by using a plurality of types of below-mentioned light emitting materials, it is possible to mix different colors of emission light, and thereby it is possible to obtain any emission color.

A known low-molecular compound, a high-molecular compound having a repeating unit, or a low-molecular compound having a polymerizable group such as a vinyl group or an epoxy group (a deposition polymerizable emission host) may be used as the host compound.

It is preferred that the known host compound is a compound which has hole transporting capability and electron transporting capability, which prevents increase in emission wavelength, and which has high Tg (glass transition temperature). The glass transition temperature (Tg) herein is a value obtained by using DSC (Differential Scanning Colorimetry) in conformity with JIS-K-7121.

Concrete examples (H1 to H79) of the host compound possible to be used in the present invention are shown below; however, the present invention is not limited thereto. Incidentally, in host compounds H68 to H79, x and y represent ratio of a random copolymer. Such ratio can be set to x:y=1:10, for example.

[Chemical Formula 40]

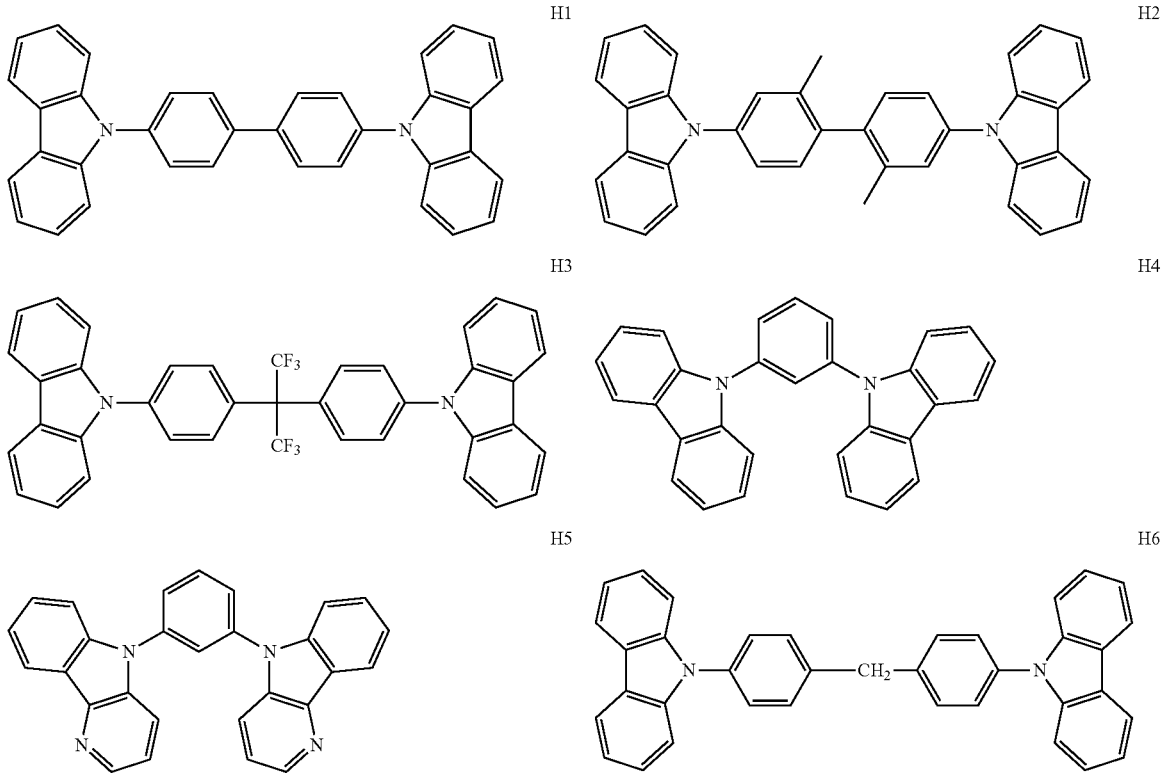

H7 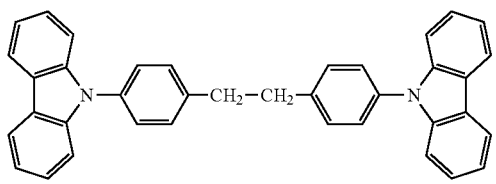
H8 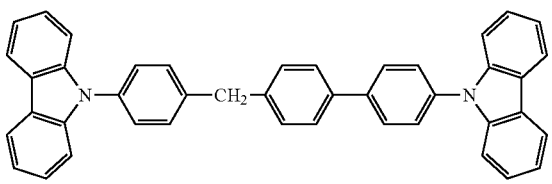
H9 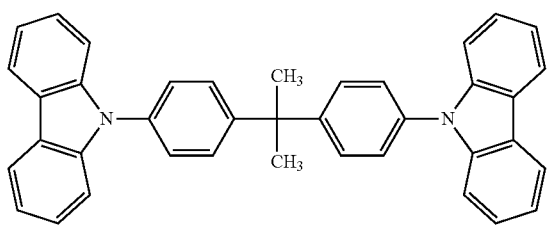
[Chemical Formula 41]
H10 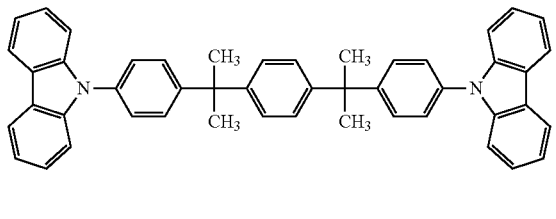
H11 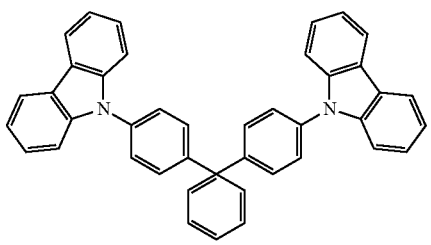
H12 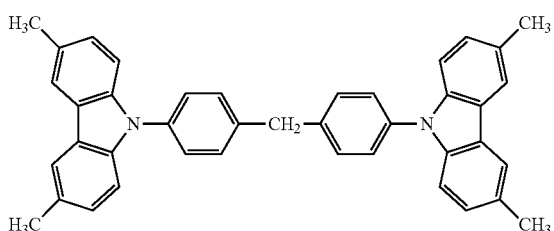
H13 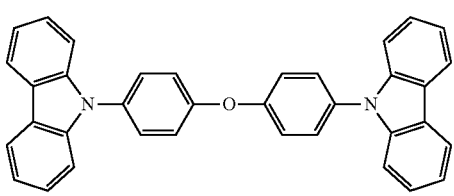
H14 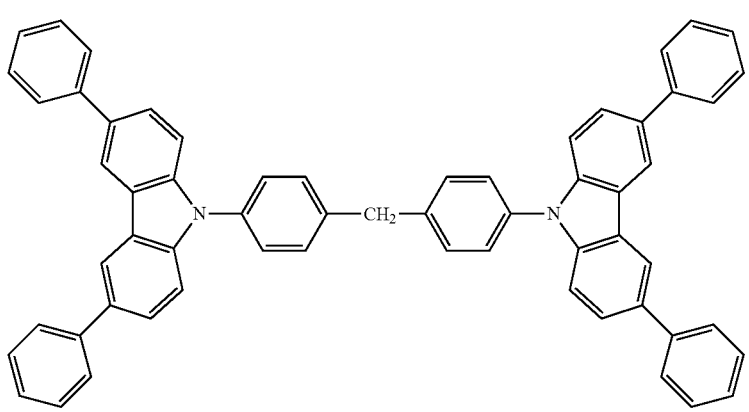
[Chemical Formula 42]

H15
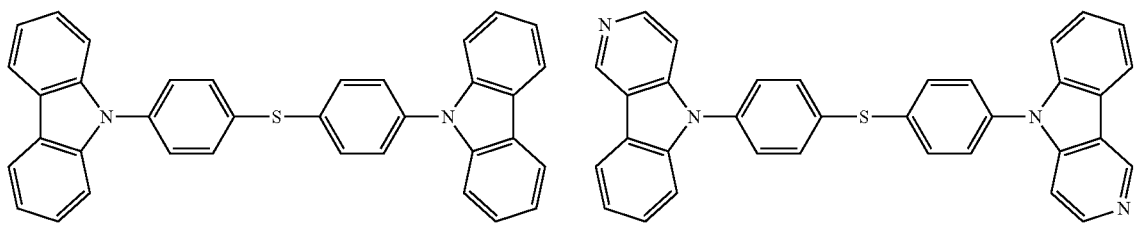
H16
H17
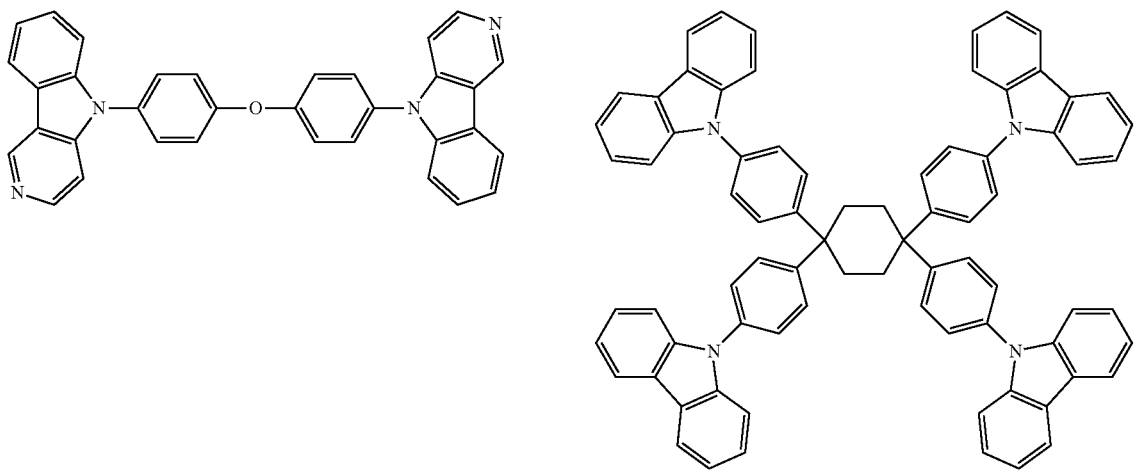
H18
H19
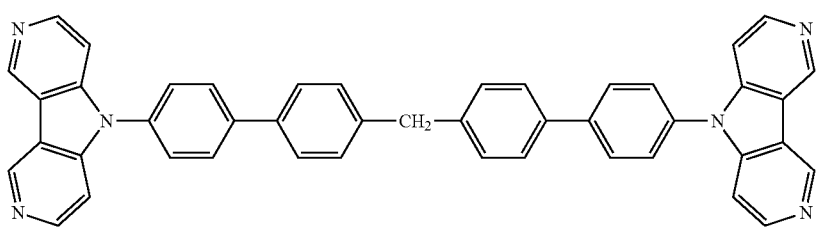
H20 H21
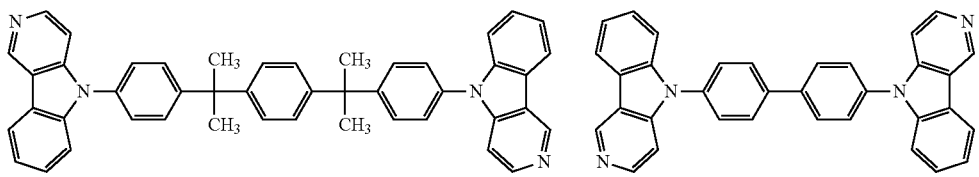
H22
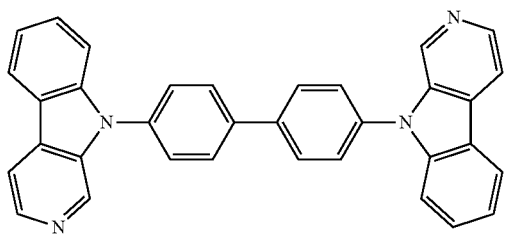
[Chemical Formula 43]

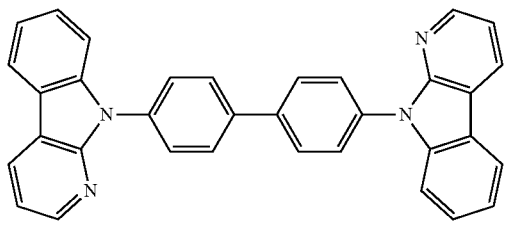
H23
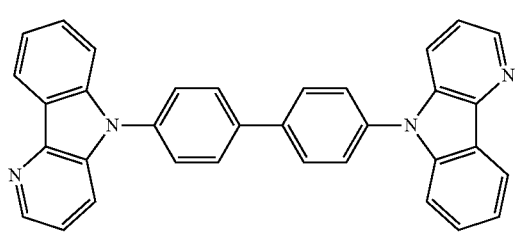
H24
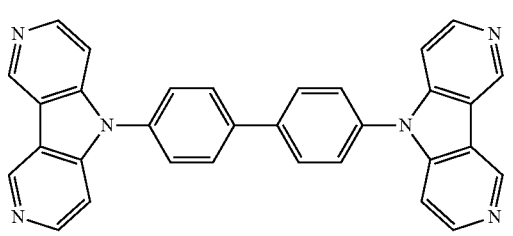
H25
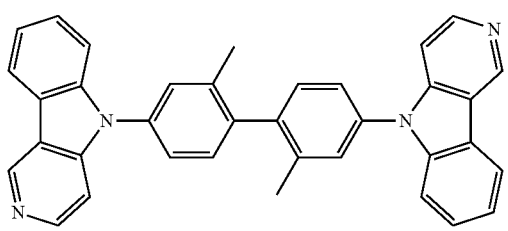
H26
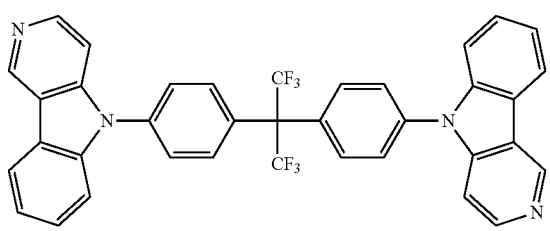
H27
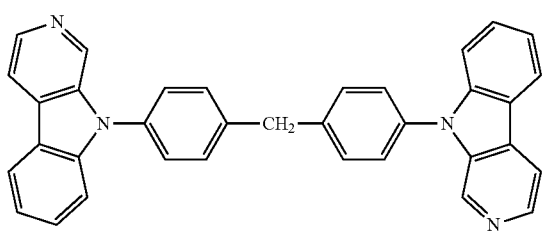
H28
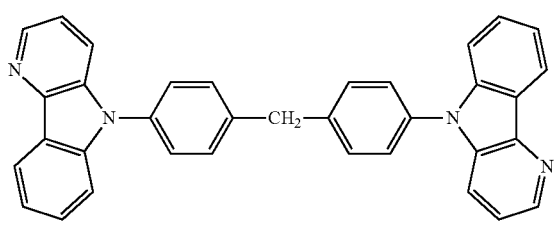
H29
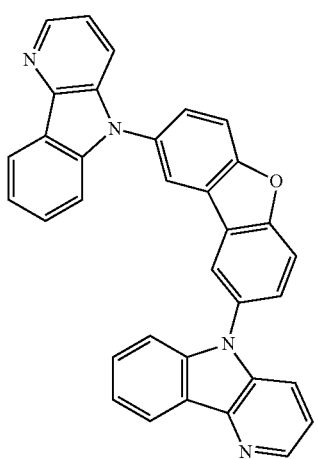
H30
[Chemical Formula 44]

-continued
H31
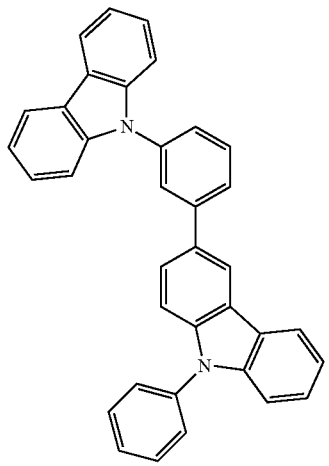
H32
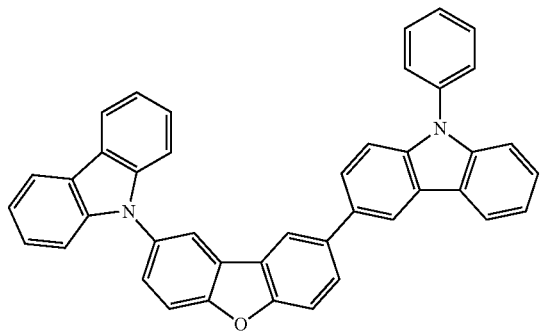
[Chemical Formula 45]
H33
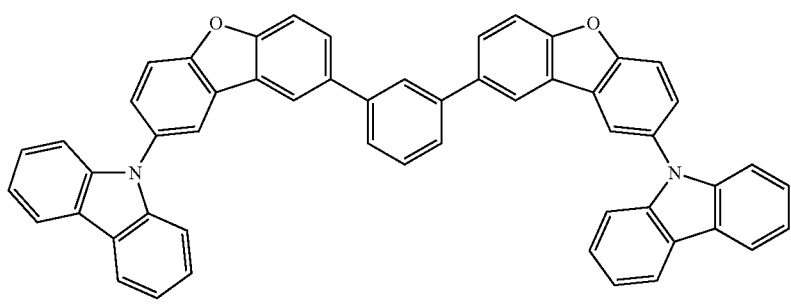
H34
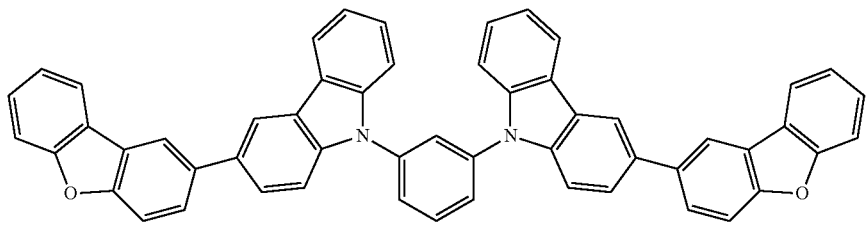
H35
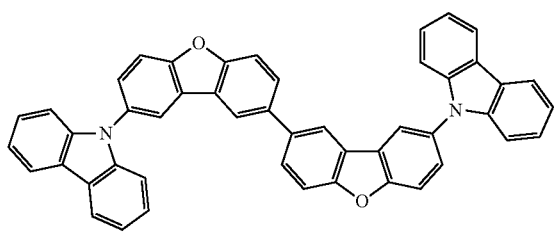
H36
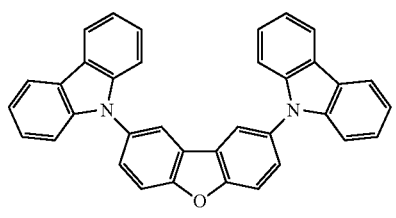
H37
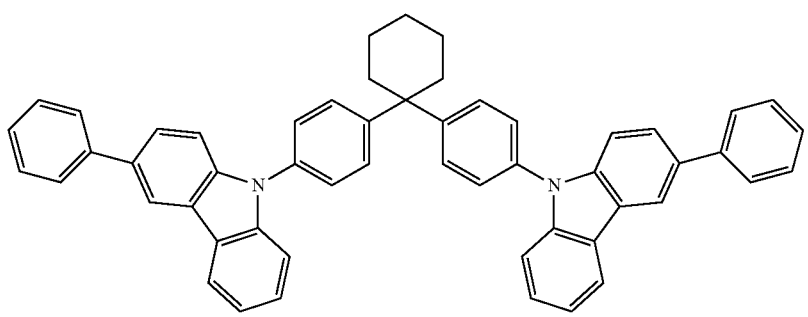

H38
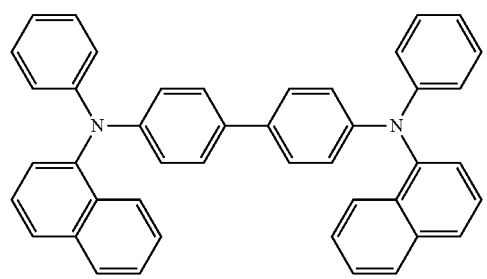
H39
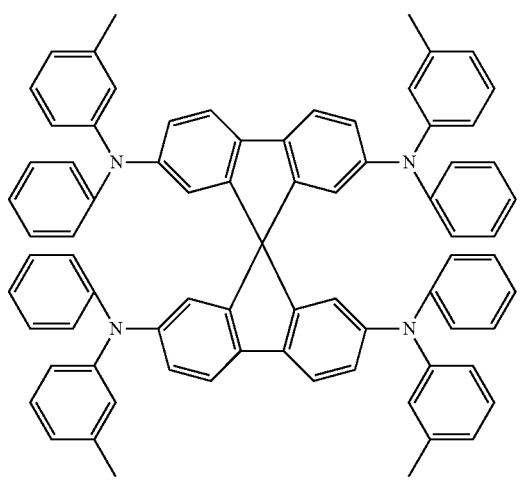
[Chemical Formula 46]
H40
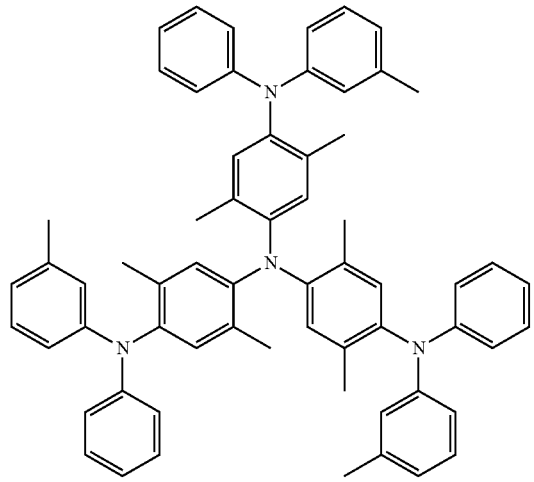
H41
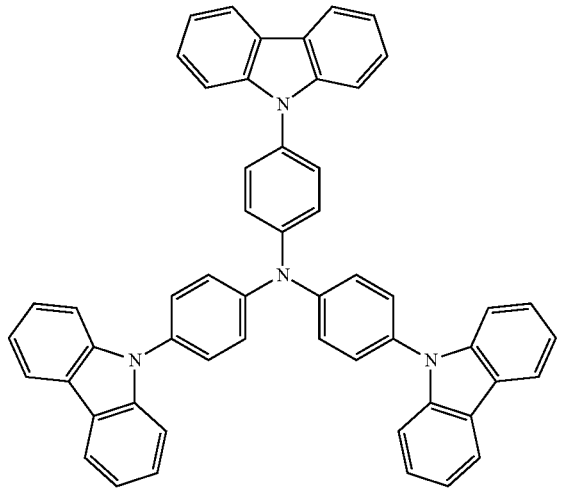
H42
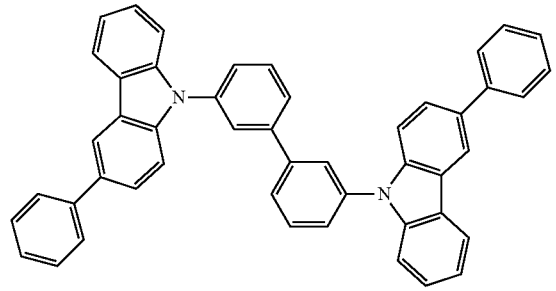
H43
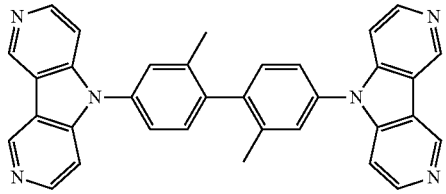

-continued
H44
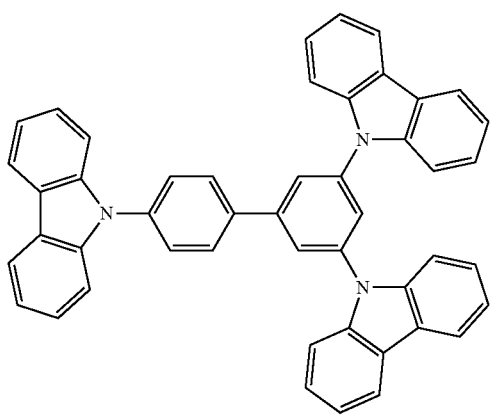
H45
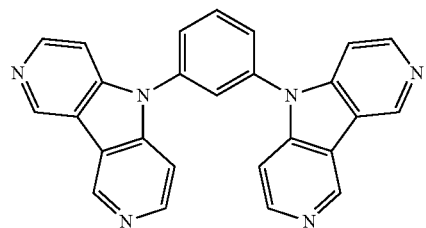
H46
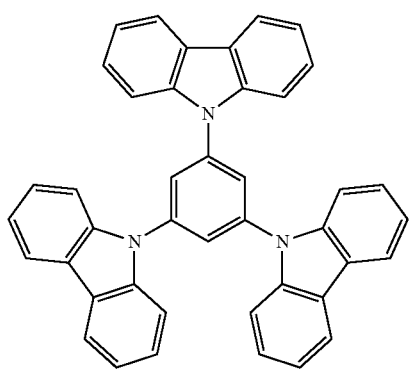
H47
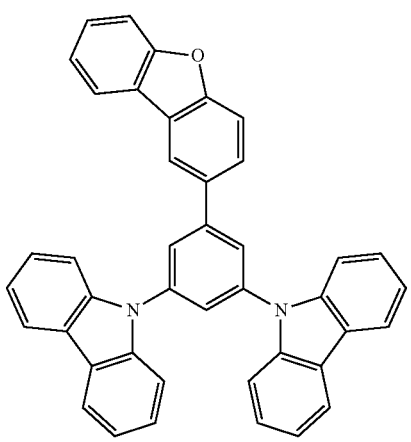
[Chemical Formula 47]
H48
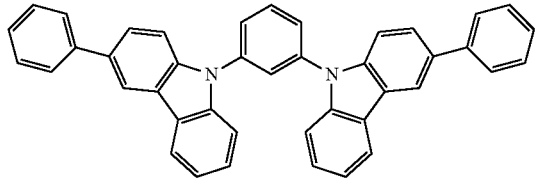
H49
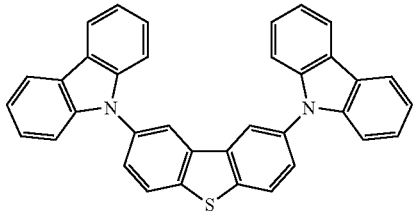
H50
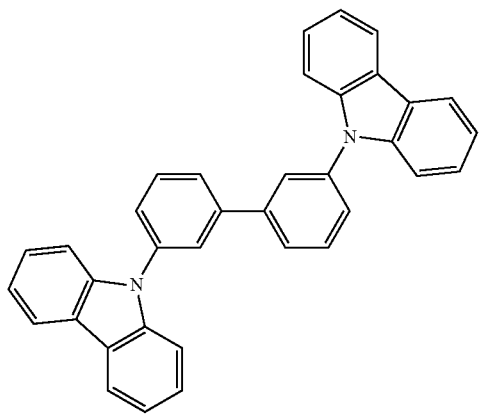
H51
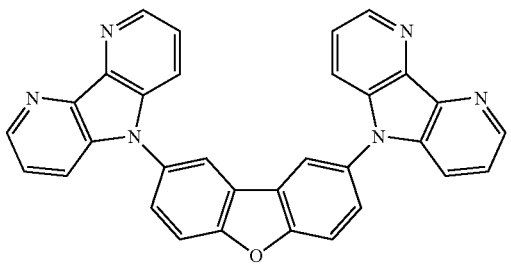

-continued
H52
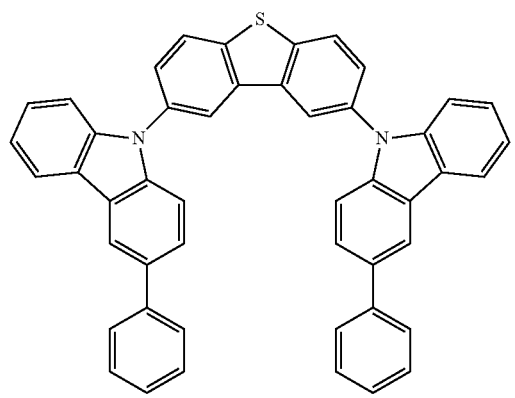
H53
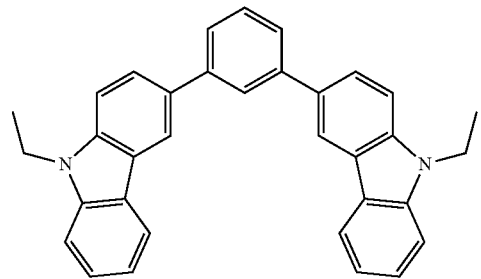
H54
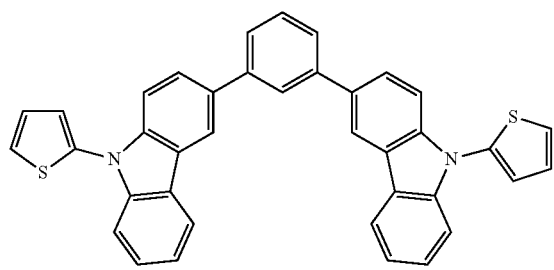
H55
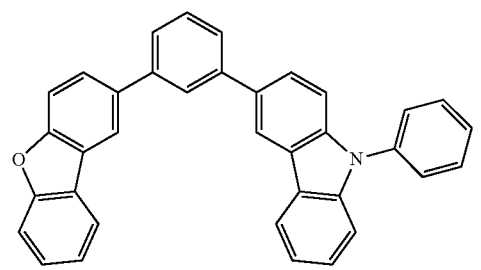
[Chemical Formula 48]
H56
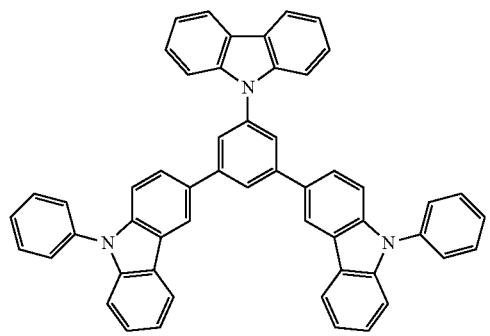
H57
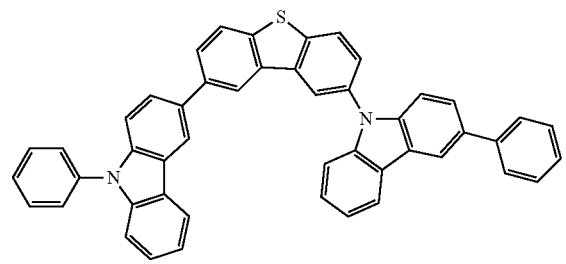
H58
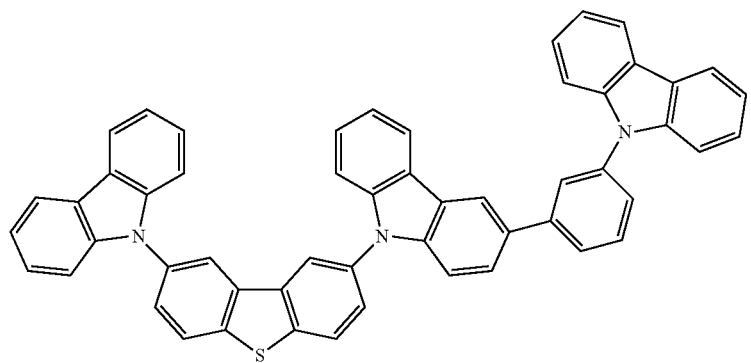

-continued
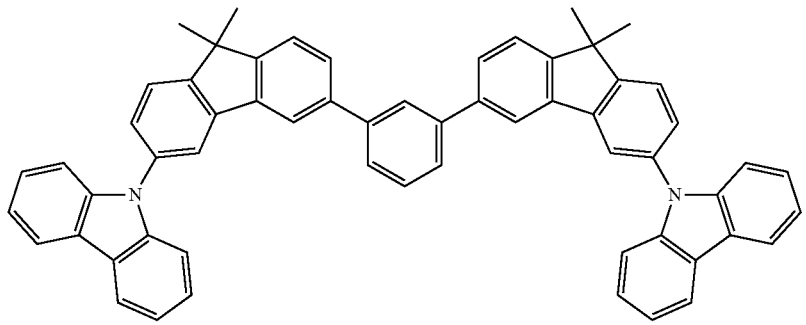
H59
[Chemical Formula 49]
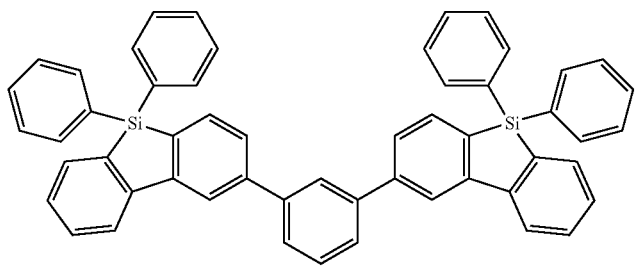
H60
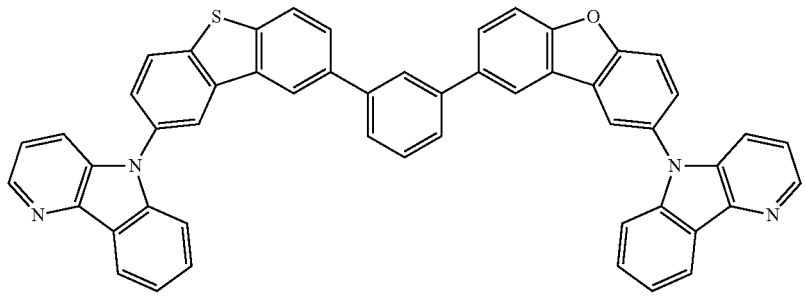
H61
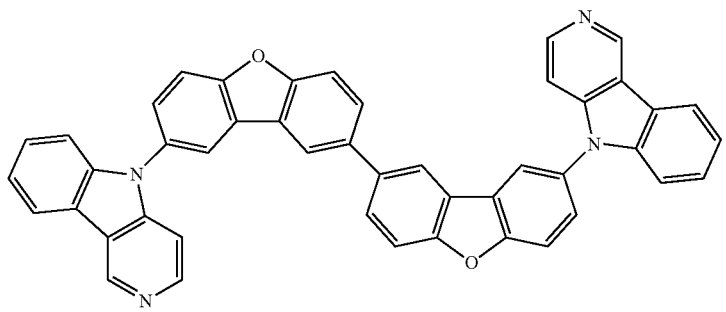
H62
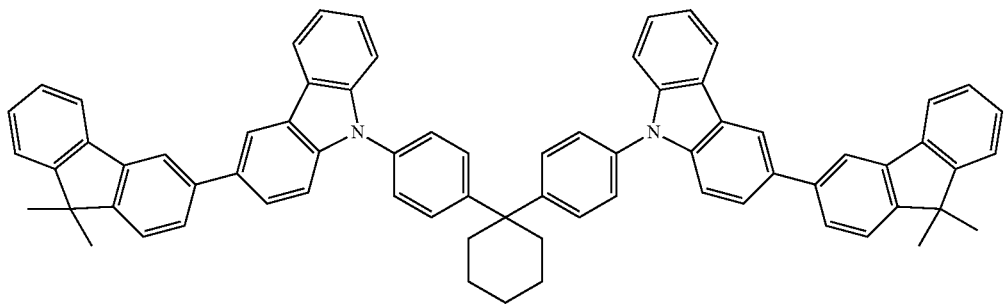
H63

H64
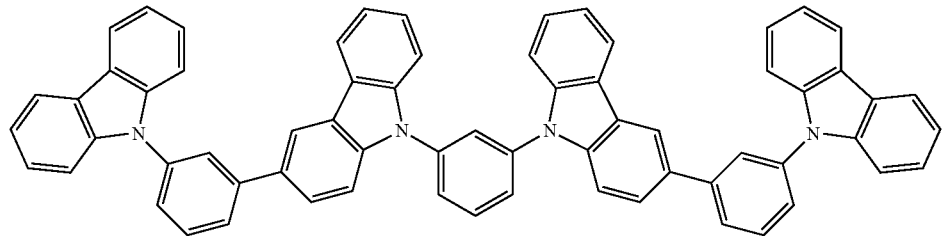
[Chemical Formula 50]
H65
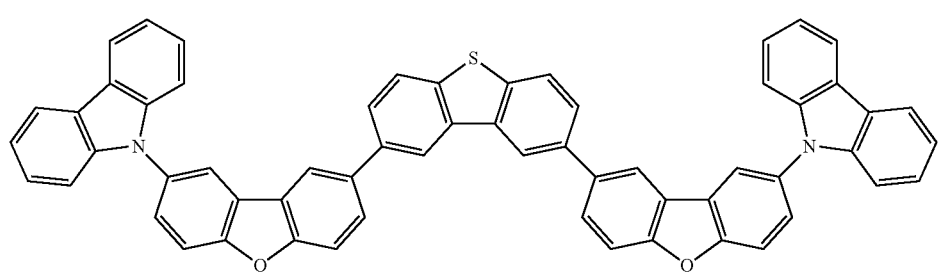
H66
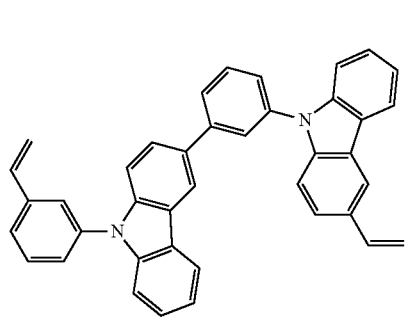
H67
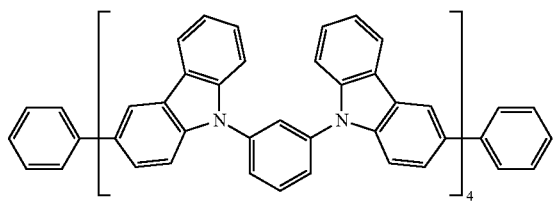
[Chemical Formula 51]
H68
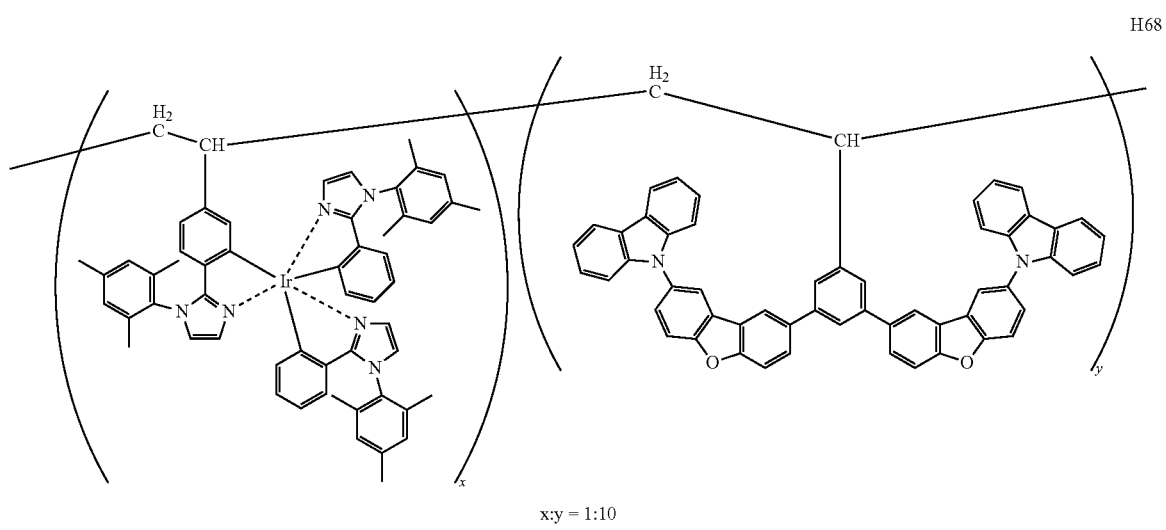
x:y = 1:10
random co-polymer
[Chemical Formula 52]

H69
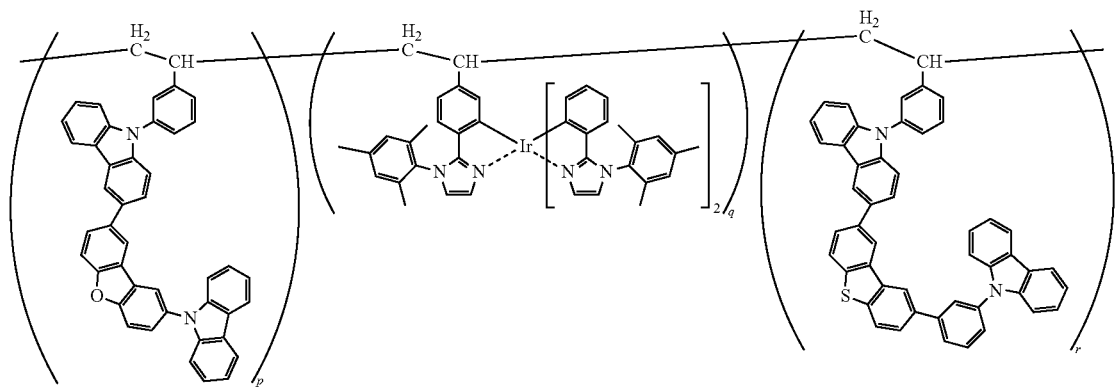
[Chemical Formula 53]
H70
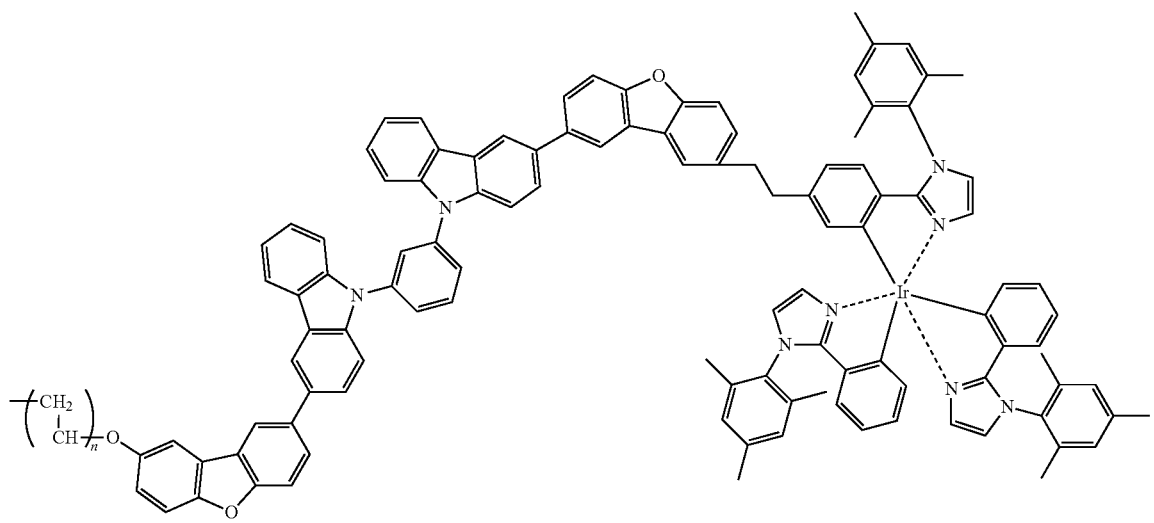
[Chemical Formula 54]
H71       H72
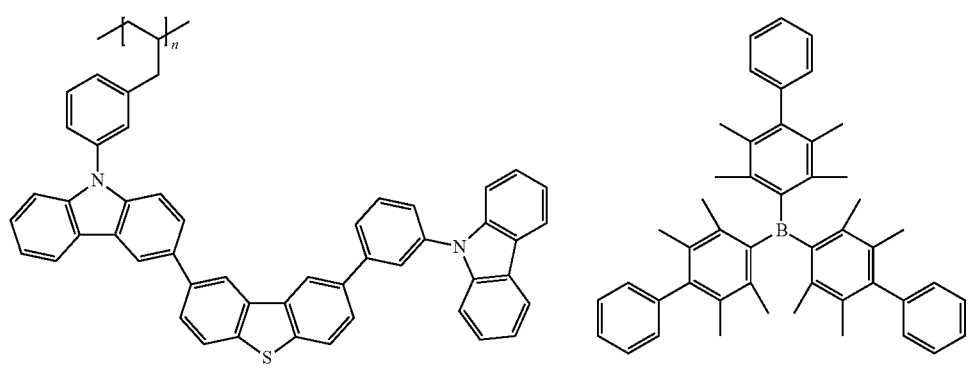

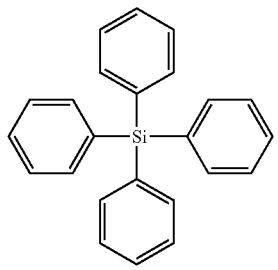
H73

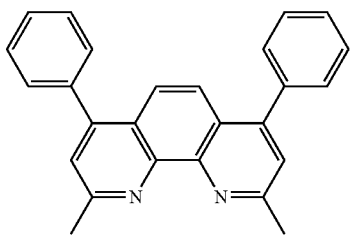
H74

-continued

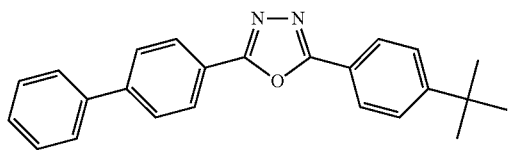
H75

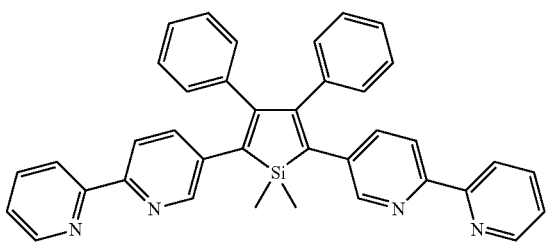
H76

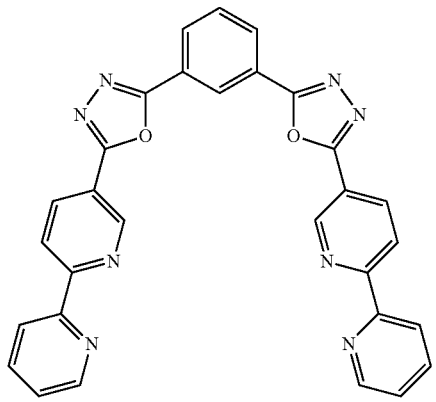
H77

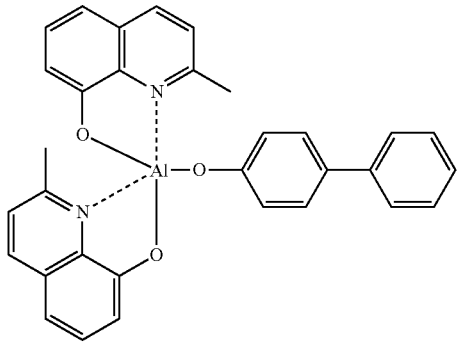
H78

H79

Concrete examples of the known host compound possible to be used are described in the following documents, for example: Japanese Unexamined Patent Application Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, 2002-308837 and the like.

(Light Emitting Material)

Examples of the light emitting material possible to be used in the present invention include a phosphorescent compound (also referred to as "phosphorescent material").

A phosphorescent compound is a compound in which light emission from an excited triplet state is observed; to be specific, a phosphorescent compound is a compound which emits phosphorescence at room temperature (25° C.) and which exhibits a phosphorescence quantum yield 0.01 or more at 25° C.; however, preferable phosphorescence quantum yield is 0.1 or more.

The phosphorescence quantum yield can be measured by a method described on page 398 of Spectroscopy II of Lecture of Experimental Chemistry, vol. 7, 4th edition) (1992, published by Maruzen Co., Ltd.). The phosphorescence quantum yield in a solution can be measured by using various solvents. In the present invention, in the case where a phosphorescent compound is used, it is only necessary to achieve the aforesaid phosphorescence quantum yield (0.01 or more) with any one arbitrary solvent.

Examples of light-emitting principle of the phosphorescent compound include the following two: one is an energy transfer type, in which carriers recombine on a host compound that transports the carriers, so as to generate an excited state of the host compound, and the energy is transferred to a phosphorescent compound to thereby emit light from the phosphorescent compound; the other is a carrier trap type, wherein a phosphorescent compound serves as a carrier trap, and carriers recombine on the phosphorescent compound to thereby emit light from the phosphorescent compound. In either case, the energy of the phosphorescent compound in excited state is required to be lower than that of the host compound.

The phosphorescent compound can be suitably selected from the known phosphorescent compounds used for the light emitting layer of a generic organic electroluminescence element; the phosphorescent compound is preferably a complex compound containing a metal of groups 8 to 10 in the periodic table of elements, and further preferably an iridium compound, an osmium compound, a platinum compound (a platinum complex compound) or a rare-earth complex, and most preferably an iridium compound.

In the present invention, at least one light emitting layer 3c may contain two or more types of phosphorescent compounds, and the ratio of concentration of the phosphorescent compounds contained in the light emitting layer 3c may vary in the direction of the film-thickness of the light emitting layer 3c.

It is preferred that the content of the phosphorescent compounds is equal to or higher than 0.1 vol. % but less than 30 vol. % of the total amount of the light emitting layer 3c.

(Compound Represented by General Formula (4))

It is preferred that the compound (i.e., the phosphorescent compound) contained in the light emitting layer 3c is a compound represented by the following General Formula (4).

It is preferred that the phosphorescent compound (also referred to as "phosphorescent metal complex") represented by General Formula (4) is contained in the light emitting layer 3c of the organic electroluminescence element EL-1 as a light-emitting dopant; however, the phosphorescent compound may also be contained in other layer(s) of the light-emitting functional layer than the light emitting layer 3c.

[Chemical Formula 55]

GENERAL FORMULA (4)

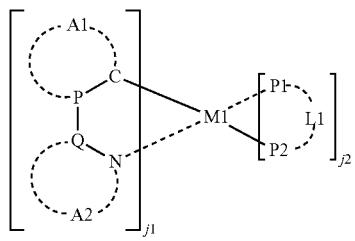

In General Formula (4), P and Q each represent a carbon atom or a nitrogen atom; A1 represents an atom group which forms an aromatic hydrocarbon ring or an aromatic heterocycle with P-C; A2 represents an atom group which forms an aromatic heterocycle with Q-N; P1-L1-P2 represents a bidentate ligand, wherein P1 and P2 each independently represent a carbon atom, a nitrogen atom or an oxygen atom, and L1 represents an atom group which forms the bidentate ligand with P1 and P2; j1 represents an integer of 1 to 3, and j2 represents an integer of 0 to 2, wherein the sum of j1 and j2 is 2 or 3; and M1 represents a transition metal element of groups 8 to 10 in the periodic table of elements.

In General Formula (4), P and Q each represent a carbon atom or a nitrogen atom.

Examples of the aromatic hydrocarbon ring which is formed by A1 with P-C in General Formula (4) include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, an anthranthrene ring and the like.

Each of these rings may further have a substituent represented by Y1 in General Formula (1).

Examples of an aromatic heterocycle which is formed by A1 with P-C in General Formula (4) include a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, a benzimidazole ring, a benzothiazole ring, a benzoxazole ring, a quinoxaline ring, a quinazoline ring, a phthalazine ring, a carbazole ring and an azacarbazole ring.

Here, the azacarbazole ring indicates a ring formed by substituting at least one of carbon atoms of a benzene ring constituting a carbazole ring with a nitrogen atom.

Each of these rings may further have a substituent represented by Y1 in General Formula (1).

Examples of the aromatic heterocycle which is formed by A2 with Q-N in General Formula (4) include an oxazole ring, an oxadiazole ring, an oxatriazole ring, an isoxazole ring, a tetrazole ring, a thiadiazole ring, a thiatriazole ring, an isothiazole ring, a pyrrole ring, a pyridine ring, a pyridazine ring, a pyrimidine ring, a pyrazine ring, a triazine ring, an imidazole ring, a pyrazole ring, a triazole ring and the like.

Each of these rings may further have a substituent represented by Y1 in General Formula (1).

In General Formula (4), P1-L1-P2 represents a bidentate ligand, P1 and P2 each independently represent a carbon atom, a nitrogen atom or an oxygen atom. L1 represents an atom group which forms the bidentate ligand with P1 and P2.

Examples of the bidentate ligand represented by P1-L1-P2 include phenylpyridine, phenylpyrazole, phenylimidazole, phenyltriazole, phenyltetrazole, pyrazabole, acetylacetone, picolinic acid and the like.

In General Formula (4), j1 represents an integer of 1 to 3, j2 represents an integer of 0 to 2, and the sum of j1 and j2 is 2 or 3, wherein it is preferred that j2 is 0.

In General Formula (4), M1 represents a transition metal element (also simply referred to as transition metal) of groups 8 to 10 in the periodic table of elements, wherein it is preferred that transition metal element is iridium.

(Compound Represented by General Formula (5))

Among the compounds represented by General Formula (4), a compound represented by the following General Formula (5) is further preferable.

[Chemical Formula 56]

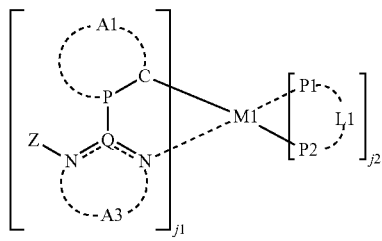

GENERAL FORMULA (5)

In General Formula (5), Z represents a hydrocarbon ring group or a heterocyclic group; P and Q each represent a carbon atom or a nitrogen atom; A1 represents an atom group which forms an aromatic hydrocarbon ring or an aromatic heterocycle with P-C; A3 represents —C(R01)=C(R02)-, —N=C(R02)-, —C(R01)=N— or —N=N—, wherein R01 and R02 each represent a hydrogen atom or a substituent; P1-L1-P2 represents a bidentate ligand, wherein P1 and P2 each independently represent a carbon atom, a nitrogen atom or an oxygen atom, L1 represents an atom group which forms the bidentate ligand with P1 and P2; j1 represents an integer of 1 to 3, and j2 represents an integer of 0 to 2, wherein the sum of j1 and j2 is 2 or 3; and M1 represents a transition metal element of groups 8 to 10 in the periodic table of elements.

Examples of the hydrocarbon ring group represented by Z in General Formula (5) include a non-aromatic hydrocarbon ring group and an aromatic hydrocarbon ring group, wherein examples of the non-aromatic hydrocarbon ring group include a cyclopropyl group, a cyclopentyl group, a cyclohexyl group and the like. These groups may each be a non-substituent or may each have a substituent described later.

Examples of the aromatic hydrocarbon ring group (also referred to as aromatic hydrocarbon group, aryl group or the like) include a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenyl group and the like.

These groups may each be a non-substituted group or may each have a substituent represented by Y1 in General Formula (1).

Examples of a heterocyclic group represented by Z in General Formula (5) include a non-aromatic heterocyclic group and an aromatic heterocyclic group; wherein examples of the non-aromatic heterocyclic group include an epoxy ring, an aziridine ring, a thiirane ring, an oxetane ring, an azetidine ring, a thietane ring, a tetrahydrofuran ring, a dioxorane ring, a pyrrolidine ring, a pyrazolidine ring, an imidazolidine ring, an oxazolidine ring, a tetrahydrothiophene ring, a sulforane ring, a thiazolidine ring, an ε-caprolactone ring, an ε-caprolactam ring, a piperidine ring, a hexahydropyridazine ring, a hexahydropyrimidine ring, a piperazine ring, a morpholine ring, a tetrahydropyrane ring, a 1,3-dioxane ring, a 1,4-dioxane ring, a trioxane ring, a tetrahydrothiopyrane ring, a thiomorpholine ring, a thiomorpholine-1,1-dioxide ring, a pyranose ring and a diazabicyclo [2,2,2]-octane ring.

These groups may each be a non-substituted group or may each have a substituent represented by Y1 in General Formula (1).

Examples of the aromatic heterocyclic group include a pyridyl group, a pyrimidinyl group, a furyl group, a pyrrolyl group, an imidazolyl group, a benzimidazolyl group, a pyrrazolyl group, a pyradinyl group, a triazolyl group (for example, a 1,2,4-triazole-1-yl group, a 1,2,3-triazole-1-yl group and the like), an oxazolyl group, a benzoxazolyl group, a triazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (indicating a ring formed by substituting one of carbon atoms constituting a carboline ring of a carbolinyl group with a nitrogen atom), a quinoxalinyl group, a pyridazinyl group, a triazinyl group, a quinazolinyl group, a phthalazinyl group and the like.

These groups may each be a non-substituted group or may each have a substituent represented by Y1 in General Formula (1).

The group represented by Z is preferably an aromatic hydrocarbon ring group or an aromatic heterocyclic group.

Examples of the aromatic hydrocarbon ring which is formed by A1 with P-C in General Formula (5) include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, an anthranthrene ring and the like.

Each of these rings may further have a substituent represented by Y1 in General Formula (1).

Examples of an aromatic heterocycle which is formed by A1 with P-C in General Formula (5) include a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, a benzimidazole ring, a benzothiazole ring, a benzoxazole ring, a quinoxaline ring, a quinazoline ring, a phthalazine ring, a carbazole ring, a carboline ring and an azacarbazole ring.

Here, the azacarbazole ring indicates a ring formed by substituting at least one of carbon atoms of a benzene ring constituting a carbazole ring with a nitrogen atom.

Each of these rings may further have a substituent represented by Y1 in General Formula (1).

The substituent represented by each of R01 and R02 in —C(R01)=C(R02)-, —N=C(R02)- and —C(R01)=N— represented by A3 in General Formula (5) is synonymous with the substituent represented by Y1 in General Formula (1).

Examples of the bidentate ligand represented by P1-L1-P2 in General Formula (5) include phenylpyridine, phenylpyrazole, phenylimidazole, phenyltriazole, phenyltetrazole, pyrazabole, acetylacetone, picolinic acid and the like.

Further, j1 represents an integer of 1 to 3, j2 represents an integer of 0 to 2, and the sum of j1 and j2 is 2 or 3, wherein it is preferred that j2 is 0.

The transition metal element (also simply referred to as transition metal) of groups 8 to 10 in the periodic table of elements represented by M1 in General Formula (5) is synonymous with the transition metal element of groups 8 to 10 in the periodic table of elements represented by M1 in General Formula (4).

(Compound Represented by General Formula (6))

A compound represented by the following General Formula (6) is one of preferable examples of the compounds represented by General Formula (5).

[Chemical Formula 57]

GENERAL FORMULA (6)

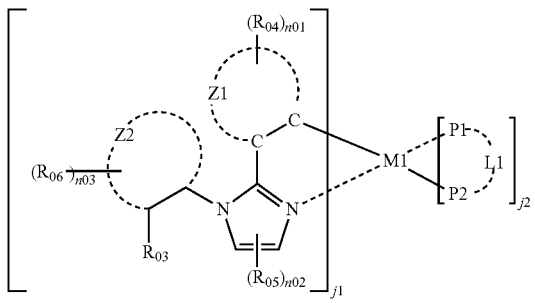

In General Formula (6), $R_{03}$ represents a substituent, $R_{04}$ represents a hydrogen atom or a substituent, and a plurality of $R_{04}$ may be bonded to each other to form a ring; n01 represents an integer of 1 to 4; $R_{05}$ represents a hydrogen atom or a substituent, and a plurality of $R_{05}$ may be bonded to each other to form a ring; n02 represents an integer of 1 to 2; $R_{06}$ represents a hydrogen atom or a substituent, and a plurality of $R_{06}$ may be bonded to each other to form a ring; n03 represents an integer of 1 to 4; Z1 represents an atom group necessary to form, along with C—C, a 6-membered aromatic hydrocarbon ring, or a 5-membered or 6-membered aromatic heterocycle; Z2 represents an atom group necessary to form a hydrocarbon ring group or a heterocyclic group; P1-L1-P2 represents a bidentate ligand, wherein P1 and P2 each independently represent a carbon atom, a nitrogen atom or an oxygen atom, and L1 represents an atom group which forms the bidentate ligand with P1 and P2; j1 represents an integer of 1 to 3, and j2 represents an integer of 0 to 2, wherein the sum of j1 and j2 is 2 or 3; and M1 represents a transition metal element of groups 8 to 10 in the periodic table of elements. $R_{03}$ and $R_{06}$ may be bonded to each other to form a ring, and the same goes for "$R_{04}$ and $R_{06}$" and "$R_{05}$ and $R_{06}$".

The substituents respectively represented by $R_{03}$, $R_{04}$, $R_{05}$, and $R_{06}$ in General Formula (6) are each synonymous with the substituent represented by Y1 in General Formula (1).

Examples of the 6-membered aromatic hydrocarbon ring which is formed by Z1 with C—C in General Formula (6) include a benzene ring and the like.

Each of these rings may further have a substituent represented by Y1 in General Formula (1).

Examples of the 5-membered or 6-membered aromatic heterocycle which is formed by Z1 with C—C in General Formula (6) include an oxazole ring, an oxadiazole ring, an oxatriazole ring, an isoxazole ring, a tetrazole ring, a thiadiazole ring, a thiatriazole ring, an isothiazole ring, a thiophene ring, furan ring, a pyrrole ring, a pyridine ring, a pyridazine ring, a pyrimidine ring, a pyrazine ring, a triazine ring, an imidazole ring, a pyrazole ring and a triazole ring.

Each of these rings may further have a substituent represented by Y1 in General Formula (1).

Examples of the hydrocarbon ring group represented by Z2 in General Formula (6) include a non-aromatic hydrocarbon ring group and an aromatic hydrocarbon ring group, wherein examples of the non-aromatic hydrocarbon ring group include a cyclopropyl group, a cyclopentyl group, a cyclohexyl group and the like. These groups may each be a non-substituent or may each have a substituent described later.

Examples of the aromatic hydrocarbon ring group (also referred to as aromatic hydrocarbon group, aryl group or the like) include a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenyl group and the like. These groups may each be a non-substituted group or may each have a substituent represented by Y1 in General Formula (1).

Examples of a heterocyclic group represented by Z2 in General Formula (6) include a non-aromatic heterocyclic group and an aromatic heterocyclic group; wherein examples of the non-aromatic heterocyclic group include an epoxy ring, an aziridine ring, a thiirane ring, an oxetane ring, an azetidine ring, a thietane ring, a tetrahydrofuran ring, a dioxorane ring, a pyrrolidine ring, a pyrazolidine ring, an imidazolidine ring, an oxazolidine ring, a tetrahydrothiophene ring, a sulforane ring, a thiazolidine ring, an ε-caprolactone ring, an ε-caprolactam ring, a piperidine ring, a hexahydropyridazine ring, a hexahydropyrimidine ring, a piperazine ring, a morpholine ring, a tetrahydropyrane ring, a 1,3-dioxane ring, a 1,4-dioxane ring, a trioxane ring, a tetrahydrothiopyrane ring, a thiomorpholine ring, a thiomorpholine-1,1-dioxide ring, a pyranose ring and a diazabicyclo [2,2,2]-octane ring. These groups may each be a non-substituted group or may each have a substituent represented by Y1 in General Formula (1).

Examples of the aromatic heterocyclic group include a pyridyl group, a pyrimidinyl group, a furyl group, a pyrrolyl group, an imidazolyl group, a benzimidazolyl group, a pyrrazolyl group, a pyradinyl group, a triazolyl group (for example, a 1,2,4-triazole-1-yl group, a 1,2,3-triazole-1-yl group and the like), an oxazolyl group, a benzoxazolyl group, a triazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (indicating a ring formed by substituting one of carbon atoms constituting a carboline ring of a carbolinyl group with a nitrogen atom), a quinoxalinyl group, a pyridazinyl group, a triazinyl group, a quinazolinyl group, a phthalazinyl group and the like.

These rings may each be a non-substituted group or may each have a substituent represented by Y1 in General Formula (1).

It is preferred that, in General Formula (6), the group formed by Z1 and Z2 is a benzene ring.

The bidentate ligand represented by P1-L1-P2 in General Formula (6) is synonymous with the bidentate ligand represented by P1-L1-P2 in General Formula (4).

The transition metal element of groups 8 to 10 in the periodic table of elements represented by M1 in General Formula (6) is synonymous with the transition metal element of groups 8 to 10 in the periodic table of elements represented by M1 in General Formula (4).

The phosphorescent compound may be suitably selected from the known phosphorescent compounds used for the light emitting layer 3c of the organic electroluminescence element EL-1.

The phosphorescent compound of the present invention is preferably a complex compound containing a metal of groups 8 to 10 in the periodic table of elements, further preferably an iridium compound, an osmium compound, a platinum compound (a platinum complex compound) or a rare-earth complex, and most preferably an iridium compound.

Concrete examples (Pt-1 to Pt-3, A-1, Ir-1 to Ir-45) of the phosphorescent compound of the present invention are shown below; however, the present invention is not limited thereto. Note that, in these compounds, m and n each represent number of replication.

[Chemical Formula 58]

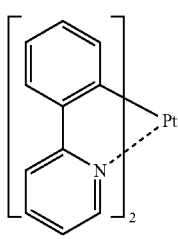

Pt-1

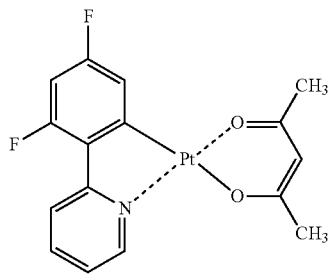

Pt-2

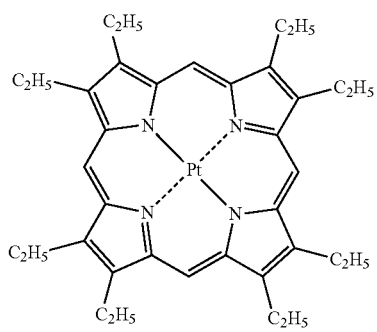

Pt-3

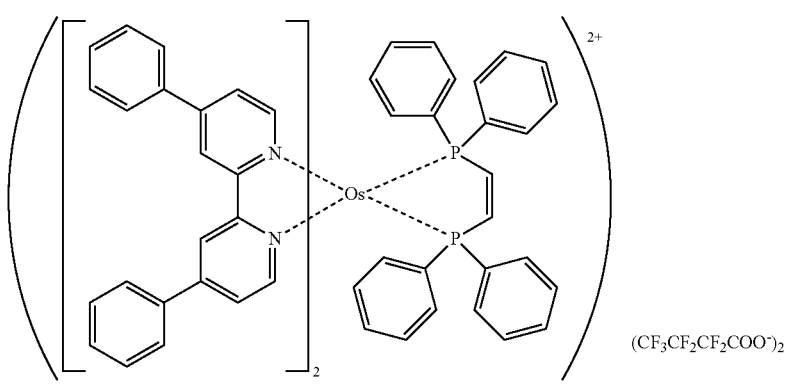

A-1

[Chemical Formula 59]

-continued
Ir-1
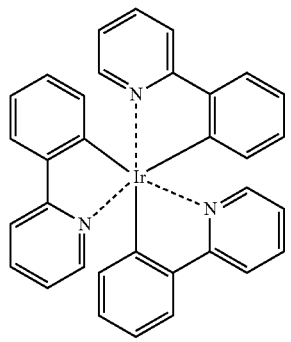
Ir-2
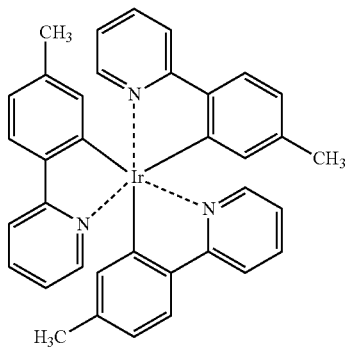
Ir-3
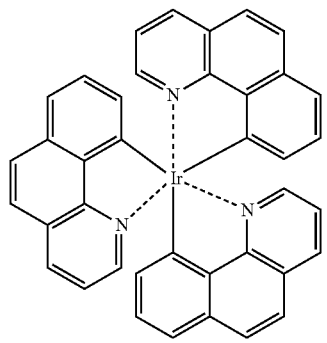
Ir-4
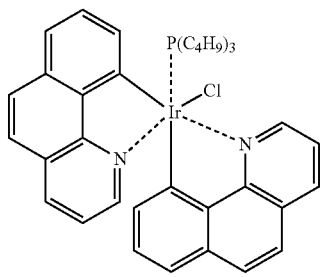
Ir-5
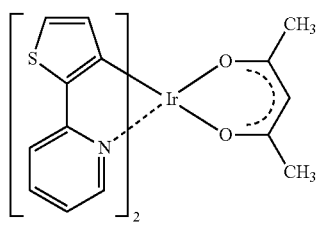
Ir-6
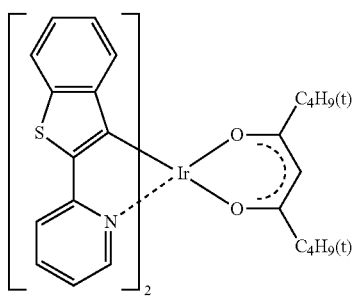
[Chemical Formula 60]
Ir-7
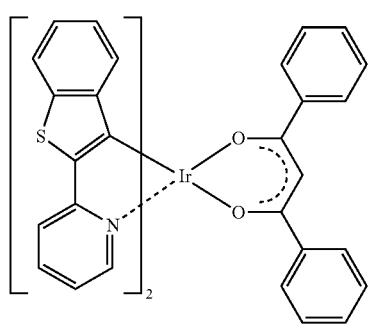
Ir-8
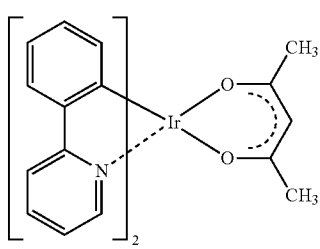

-continued
Ir-9
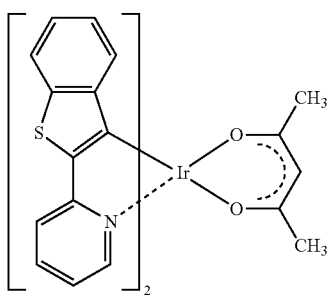
Ir-10
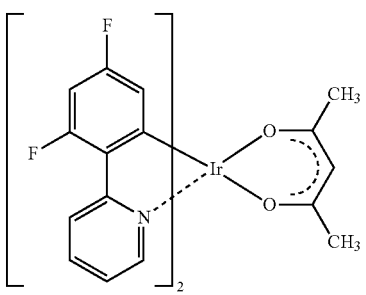
Ir-11
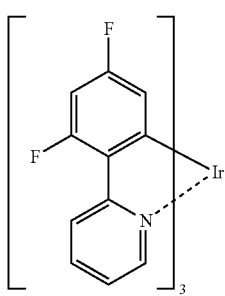
Ir-12
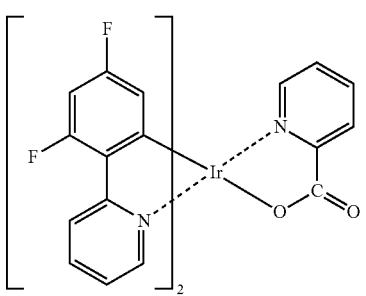
Ir-13
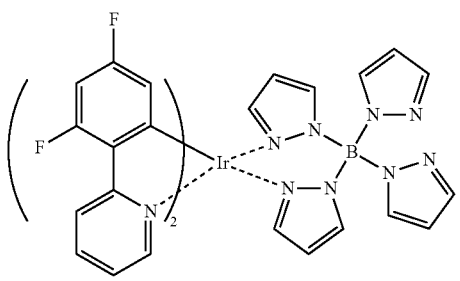
Ir-14
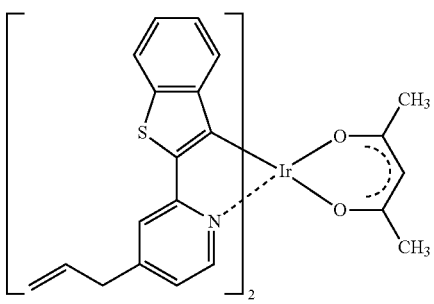
[Chemical Formula 61]
Ir-15
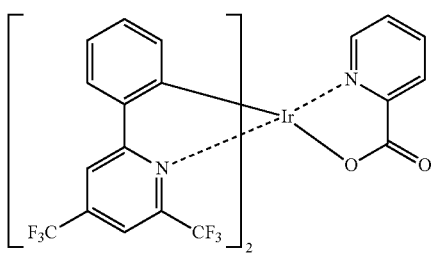
Ir-16
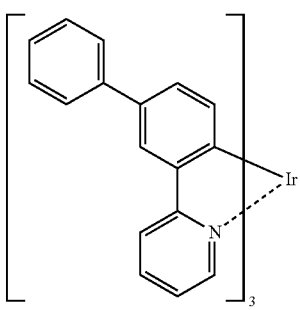
Ir-17
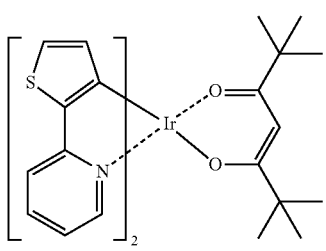
Ir-18
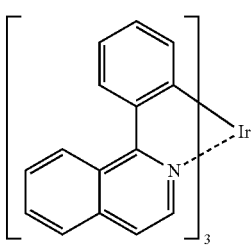

Ir-19
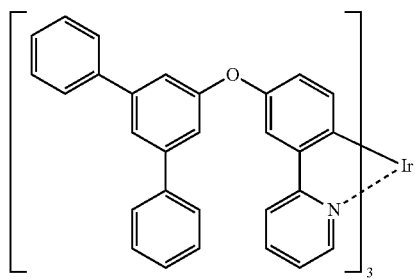
Ir-20
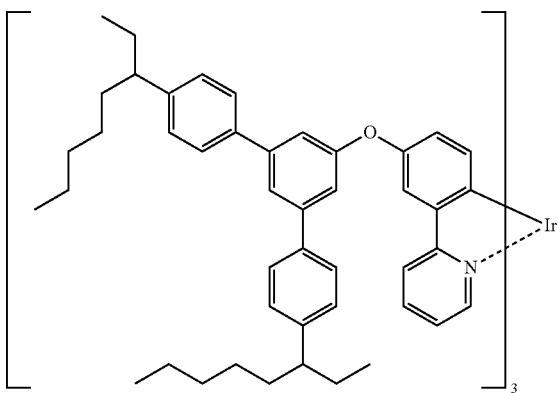
[Chemical Formula 62]
Ir-21
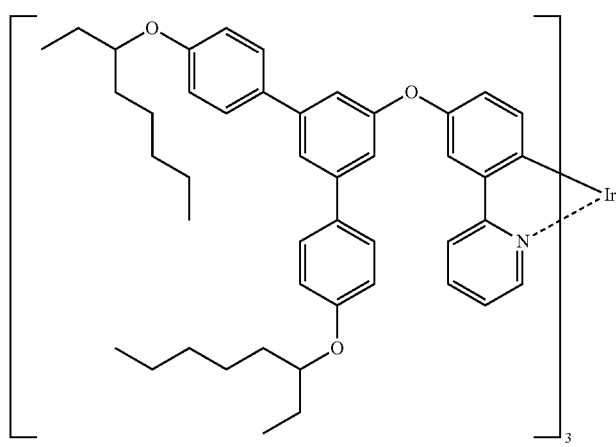
Ir-22
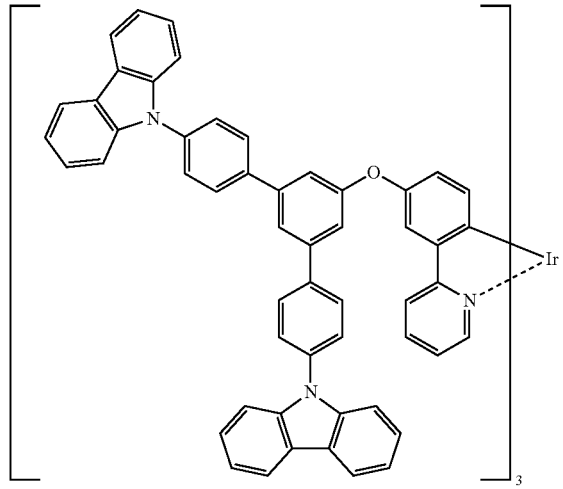
Ir-23
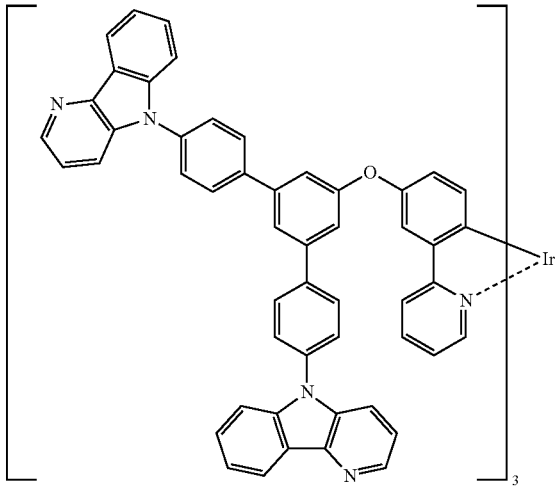
Ir-24
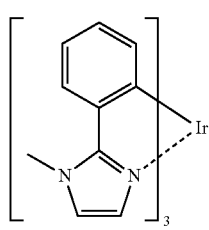
Ir-25
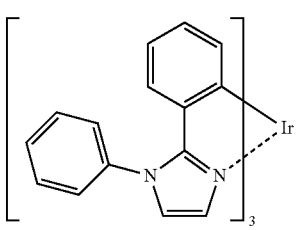

-continued
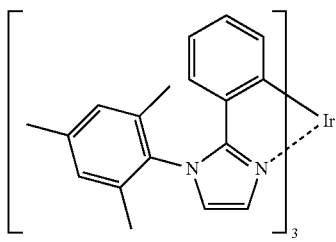
Ir-26
[Chemical Formula 63]
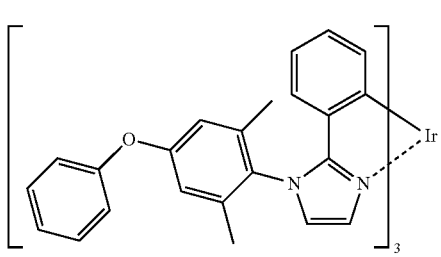
Ir-27
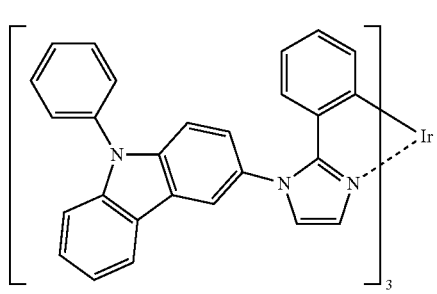
Ir-28
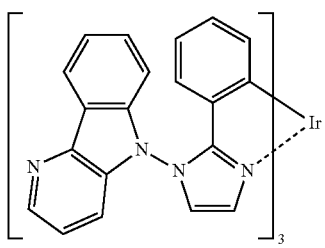
Ir-29
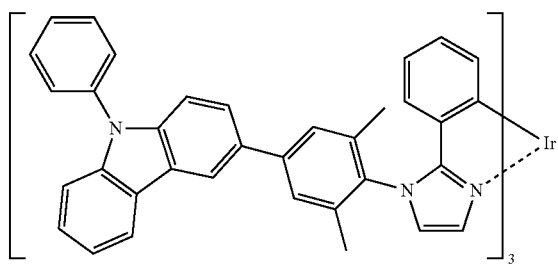
Ir-30
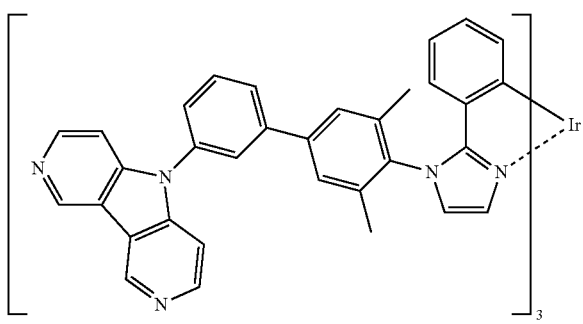
Ir-31
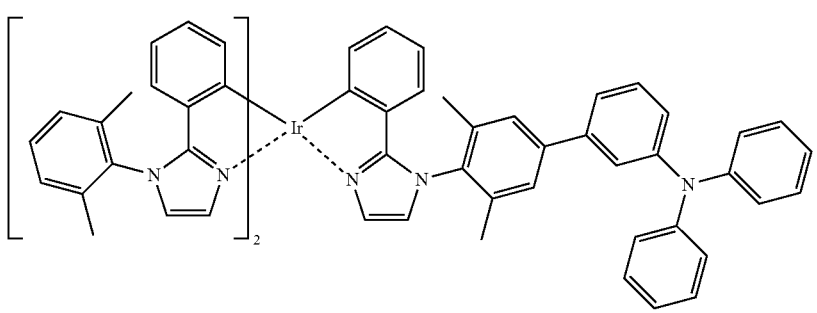
Ir-32

-continued
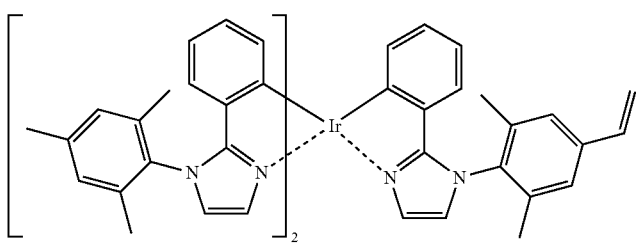
Ir-33
[Chemical Formula 64]
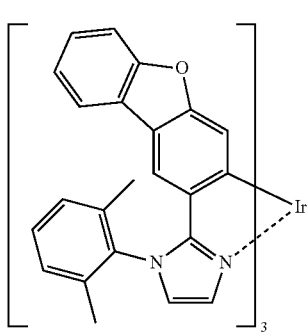
Ir-34
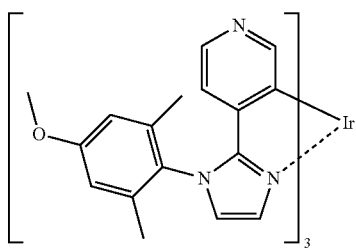
Ir-35
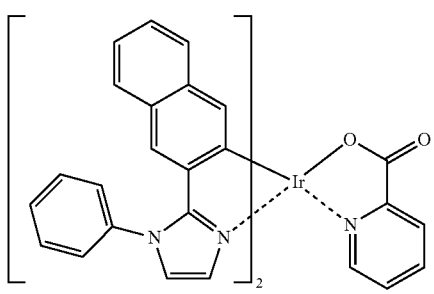
Ir-36
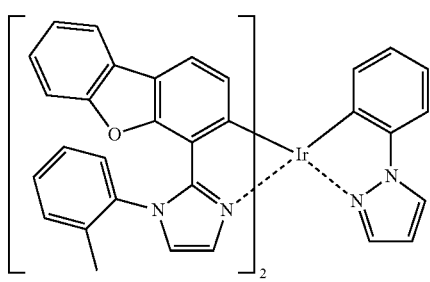
Ir-37
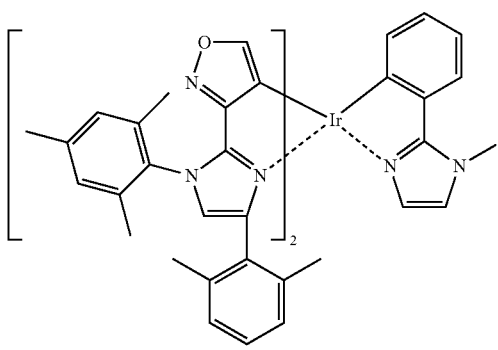
Ir-38
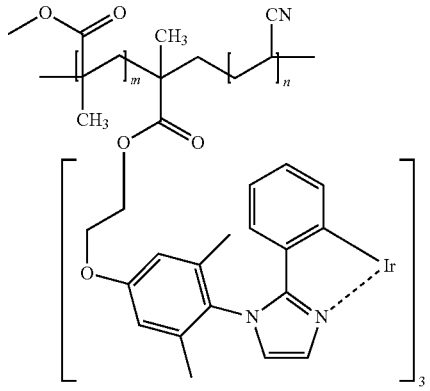
Ir-39
[Chemical Formula 65]

-continued

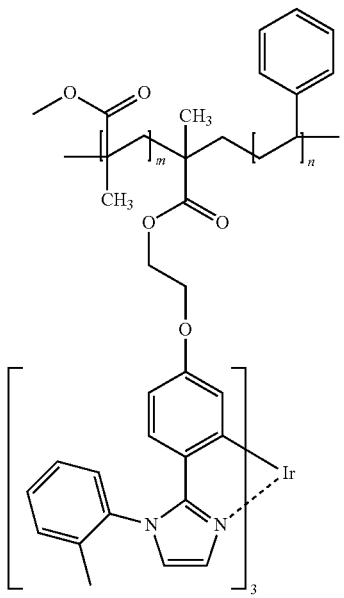
Ir-40

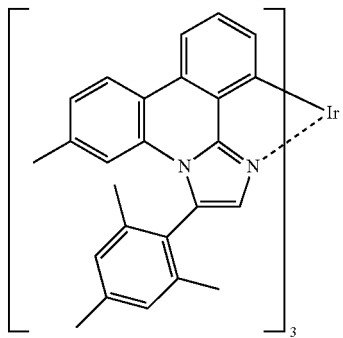
Ir-41

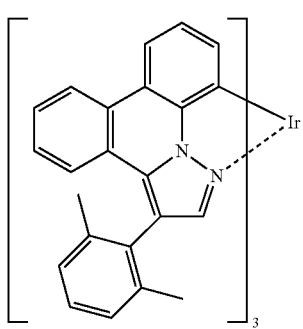
Ir-42

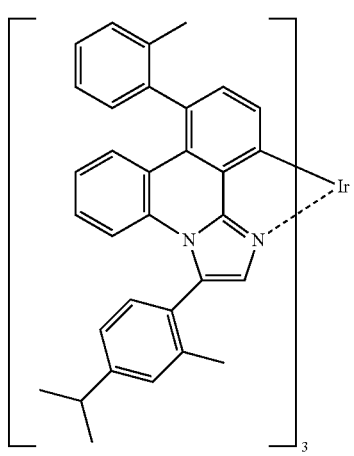
Ir-43

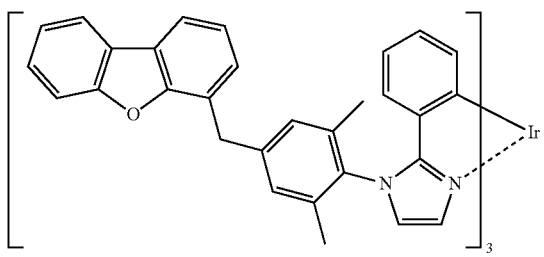
Ir-44

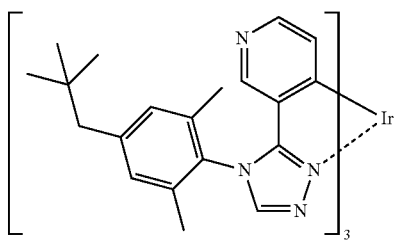
Ir-45

The aforesaid phosphorescent compounds (also referred to as phosphorescent metal complexes or the like) can be synthesized by employing methods described in documents such as Organic Letter, vol. 3, No. 16, pp. 2579-2581 (2001); Inorganic Chemistry, vol. 30, No. 8, pp. 1685-1687 (1991); J. Am. Chem. Soc., vol. 123, pp. 4304 (2001); Inorganic Chemistry, vol. 40, No. 7, pp. 1704-1711 (2001); Inorganic Chemistry, vol. 41, No. 12, pp. 3055-3066 (2002); New Journal of Chemistry, vol. 26, pp. 1171 (2002); and European Journal of Organic Chemistry, vol. 4, pp. 695-709 (2004); and reference documents described in these documents.

(Fluorescent Material)

Examples of the fluorescent material include a coumarin dye, a pyran dye, a cyanine dye, a chloconium dye, a squarylium dye, an oxobenzanthracene dye, a fluorescein dye, a rhodamine dye, a pyrylium dye, a perylene dye, a stilbene dye, a polythiophene dye, a rare earth complex based phosphor and the like.

(Injecting Layer: Hole Injecting Layer 3a and Electron Injecting Layer 3e)

An injecting layer is a layer arranged between an electrode and the light emitting layer 3c in order to decrease driving voltage and improve brightness of the emitted light;

the details of the injecting layer are described in "Electrode Material" (pp. 123-166, Part 2, Chapter 2 of "Organic EL Element and Front of Industrialization thereof" Nov. 30, 1998, published by N. T. S Co., Ltd.), and examples of the injecting layer include the hole injecting layer 3a and the electron injecting layer 3e.

The injecting layer can be provided according to necessity. If the injecting layer is the hole injecting layer 3a, the injecting layer may be arranged between the anode and the light emitting layer 3c or the hole transporting layer 3b; and if the injecting layer is the electron injecting layer 3e, the injecting layer may be arranged between the cathode and the light emitting layer 3c or the electron transporting layer 3d.

The details of the hole injecting layer 3a is also described in documents such as Japanese Unexamined Patent Application Publication Nos. 9-45479, 9-260062 and 8-288069; and concrete examples of the hole injecting layer 3a include a layer of a phthalocyanine represented by copper phthalocyanine, a layer of an oxide represented by vanadium oxide, a layer of an amorphous carbon and a layer of a polymer employing conductive polymer such as polyaniline (emeraldine), polythiophene and the like.

The details of the electron injecting layer 3e is also described in documents such as Japanese Unexamined Patent Application Publication Nos. 6-325871, 9-17574 and 10-74586; and concrete examples of the electron injecting layer 3e include a layer of a metal represented by strontium, aluminum or the like; a layer of an alkali metal halide represented by potassium fluoride; a layer of an alkali earth metal compound represented by magnesium fluoride; and a layer of an oxide represented by molybdenum oxide. It is preferred that the electron injecting layer 3e is a very thin film; specifically, it is preferred that the film-thickness of the electron injecting layer 3e is within a range from 1 nm to 10 μm depending on the material thereof.

[Hole Transporting Layer 3b]

The hole transporting layer 3b is formed of a hole transporting material having a function of transporting holes; in a broad sense, the hole injecting layer 3a and the electron blocking layer are included in the hole transporting layer 3b. The hole transporting layer 3b may either include only one layer or include a plurality of layers.

The hole transporting material is a material either having a capability of injecting or transporting holes, or having a barrier property against electrons; the hole transporting material may either be an organic material or an inorganic material. Examples of the hole transporting material include a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer, a conductive oligomer such as a thiophene oligomer, and the like.

Although the aforesaid compounds can be used as the hole transporting material, it is preferred that a porphyrin compound, an aromatic tertiary amine compound or a styrylamine compound is used as hole transporting material, and wherein it is particularly preferred that an aromatic tertiary amine compound is used as the hole transporting material.

Typical examples of the aromatic tertiary amine compound and the styrylamine compound include: N,N,N',N'-tetraphenyl-4,4'-diaminophenyl; N,N'-diphenyl-N,N'-bis(3-methylphenyl)-[1,1'-biphenyl]-4,4'-diamine (TDP); 2,2-bis (4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methyl) phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminodiphenylether; 4,4'-bis(diphenylamino) quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N, N-diphenylaminostilbene; N-phenylcarbazole; those having two condensed aromatic rings in a molecule described in U.S. Pat. No. 5,061,569, such as 4,4'-bis[N-(1-naphthyl)-N-phenylamino]biphenyl (NDP); and 4,4',4"-tris[N-(3-methylphenyl)-N-phenylamino]triphenylamine (MTDATA) in which three triphenylamine units are bonded in a star burst form described in Japanese Patent Application Laid-Open Publication No. 4-308688.

Further, a polymer material in which any of these materials is introduced into a polymer chain or a polymer material in which a polymer main chain is constituted by any of these materials may also be used. Further, inorganic compounds such as a p-type Si and a p-type SiC may also be used as the hole injecting material and the hole transporting material.

Further, it is also possible to use a so-called p-type hole transporting material described Japanese Unexamined Patent Application Publication No. 11-251067 and Applied Physics Letters 80 (2002), pp. 139 by J. Huang et. al. In the present invention, it is preferable to use these materials in order to produce a light-emitting element having high efficiency.

The hole transporting layer 3b can be formed by forming a thin film of the aforesaid hole transporting material using a known method such as a vacuum deposition method, a spin coating method, a casting method, a printing method (which includes an ink-jet method), a LB method or the like. The film-thickness of the hole transporting layer 3b is not particularly limited; however, the film-thickness of the hole transporting layer 3b is typically within a range about from 5 nm to 5 μm, preferably within a range from 5 nm to 200 nm. The hole transporting layer 3b may have a single-layer structure formed of one type of the aforesaid materials, or formed of two or more types of the aforesaid materials.

Further, it is also possible to dope impurities into the material of the hole transporting layer 3b to improve its p-property. Examples of doping impurities into the material of the hole transporting layer 3b include those described in documents such as Japanese Unexamined Patent Application Publication Nos. 4-297076, 2000-196140 and 2001-102175 and J. Appl. Phys., 95, 5773 (2004).

It is preferred to dope impurities into the material of the hole transporting layer 3b, because improved p-property of the hole transporting layer 3b makes it possible to produce an element which consumes less electric power.

(Electron Transporting Layer 3d)

The electron transporting layer 3d is formed of a material having a function to transport electrons; in a broad sense, the electron injecting layer 3e and the hole blocking layer (not shown) are included in the electron transporting layer 3d. The electron transporting layer 3d may have either a single-layer structure or a laminated structure composed of a plurality of layers.

In either an electron transporting layer 3d having a single-layer structure or an electron transporting layer 3d having a laminated structure, an electron transporting material (which also functions as a hole blocking material) constituting a layer-portion adjacent to the light emitting layer 3c may be a material having a function of transferring electrons injected from the cathode to the light emitting layer 3c. Such material can be selected from known compounds. Examples of the known compounds include a nitro-substituted fluorene derivative, a diphenylquinone derivative, a thiopyrandioxide derivative, carbodiimide, a fluorenylidenemethane derivative, anthraquinonedimethane, an anthrone derivative, an oxadiazole derivative and the like. Further, in the aforesaid oxadiazole derivative, a thiadiazole derivative formed by substituting an oxygen atom of an oxadiazole ring with a sulfur atom and a quinoxaline derivative having a quinoxaline ring which is known as an electron withdrawing group may also be used as the material of the electron transporting layer 3d. Further, a polymer material in which any of these materials is introduced into a polymer chain or a polymer material in which a polymer main chain is constituted by any of these materials may also be used as the material of the electron transporting layer 3d.

Further, metal complexes of an 8-quinolinol derivative such as tris(8-quinolinol)aluminum ($Alq_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (Znq) and the like, as well as metal complexes formed by substituting the central metal of the aforesaid metal complexes with In, Mg, Cu, Ca, Sn, Ga or Pb may also be used as the material of the electron transporting layer 3d.

Further, metal-free or metal phthalocyanine and those formed by substituting the terminal of metal-free or metal phthalocyanine with an alkyl group, a sulfonic acid group or the like may be preferably used as the material of the electron transporting layer 3d. Further, the distyrylpyrazine derivative mentioned as an example of the material for the light emitting layer 3c may also be used as the material of the electron transporting layer 3d; and, similar to the cases of the hole injecting layer 3a and the hole transporting layer 3b, inorganic semiconductors such as an n-type Si and an n-type SiC may also be used as the material of the electron transporting layer 3d.

The electron transport layer 3d can be formed by forming the aforesaid material into a thin film by a known method such as a vacuum deposition method, a spin coating method, a casting method, a printing method (which includes an ink-jet method), an LB method or the like. The film-thickness of the electron transporting layer 3d is not particularly limited; however, the film-thickness of the electron transporting layer 3d is typically within a range about from 5 nm to 5 μm, preferably within a range from 5 nm to 200 nm. The electron transporting layer 3d may have a single-layer structure formed of one kind of the aforesaid materials, or formed of two or more kinds of the aforesaid materials.

Further, it is also possible to dope impurities into the material of the electron transporting layer 3d to improve its n-property. Examples of doping impurities into the electron transporting layer 3d include those described in documents such as Japanese Unexamined Patent Application Publication Nos. 4-297076, 10-270172, 2000-196140 and 2001-102175 and J. Appl. Phys., 95, 5773 (2004). Further, it is preferred that the electron transporting layer 3d contains kalium, kalium compound and/or the like. For example, potassium fluoride or the like can be used as the kalium compound. If the n-property of the electron transporting layer 3d is improved in the aforesaid manner, it is possible to produce an element which consumes less electric power.

The material identical to the material constituting the nitrogen-containing layer 1a may be used as the material of the electron transporting layer 3d (i.e., the electron transporting compound). The material identical to the material constituting the nitrogen-containing layer 1a may also be used as the material of the electron transporting layer 3d which also functions as the electron injecting layer 3e.

[Blocking Layer: Hole Blocking Layer and Electron Blocking Layer]

As described above, a blocking layer is a layer provided according to necessity in addition to the basic constituent layers of the thin-film of the organic compound. Examples of the blocking layer include a hole blocking layer described in documents such as Japanese Unexamined Patent Application Publication Nos. 11-204258 and 11-204359 and pp. 273 of "Organic EL Element and Front of Industrialization thereof" (Nov. 30, 1998, published by N. T. S Co., Ltd.)".

The hole blocking layer has, in a broad sense, the function of the electron transporting layer 3d. The hole blocking layer is formed of a hole blocking material having a function of transporting electrons with very little capability of transporting holes; the hole blocking layer transports electrons while blocking holes, so that probability of recombination of electrons and holes can be increased. Further, the configuration of the electron transporting layer 3d (which is to be described later) can be used as the hole blocking layer according to necessity. It is preferred that the hole blocking layer is arranged adjacent to the light emitting layer 3c.

On the other hand, the electron blocking layer has, in a broad sense, the function of the hole transporting layer 3b. The electron blocking layer is made of a material having a function of transporting holes with very little capability of transporting electrons; the electron blocking layer transports holes while blocking electrons, so that probability of recombination of electrons and holes can be increased. Further, the configuration of the hole transporting layer 3b (which is to be described later) can be used as the electron blocking layer according to necessity. The film-thickness of the hole blocking layer of the present invention is preferably within a range from 3 to 100 nm, and further preferably within a range from 5 to 30 nm.

[Auxiliary Electrode 15]

The auxiliary electrode 15 is provided for reducing resistance of the transparent electrode 1, and is arranged in contact with the electrode layer 1b of the transparent electrode 1. It is preferred that the auxiliary electrode 15 is formed of a metal having low resistance, such as aurum, platinum, silver, copper, aluminum or the like. Since each of these metals has low light transmissibility, the auxiliary electrode 15 is formed into a pattern in a range where the emitted light h is not prevented from being extracted from a light extracting face 13a. Examples of the method for forming such an auxiliary electrode include a deposition method, a sputtering method, a printing method, an ink-jet method, an aerosol jet method and the like. In view of aperture ratio of light extraction, it is preferred that the line width of the auxiliary electrode 15 is 50 μm or less; while in view of electrical conductivity, it is preferred that the film-thickness of the auxiliary electrode 15 is 1μ or more.

[Sealing Material 17]

The sealing material 17 is provided to cover the organic electroluminescence element EL; the sealing material 17 may either be a plate-like (film-like) sealing member to be fixed to the side of the transparent substrate 13 by the adhesive 19, or be a sealing film. The sealing material 17 is arranged in a manner to at least cover the light-emitting functional layer 3 in a state where the end portions of both the transparent electrode 1 and the opposite electrode 5-1 of the organic electroluminescence element EL are exposed to the outside. The present invention also includes a configuration in which electrodes are arranged on the sealing material 17, and end portions of the transparent electrode 1 and the opposite electrode 5-1 of an organic electroluminescence element EL-1 are brought into conduction with the electrodes.

Concrete examples of the plate-like (film-like) sealing material 17 include a glass substrate, a polymer substrate, a metal substrate and the like; and each of these substrate materials may also be formed into a further thinner film to be used as the sealing material 17. Examples of the glass substrate include a soda-lime glass substrate, a barium/strontium-containing glass substrate, a lead glass substrate, an aluminosilicate glass substrate, a borosilicate glass substrate, a barium borosilicate glass substrate, a quartz substrate, and the like. Examples of the polymer substrate include a polycarbonate substrate, an acryl resin substrate, a polyethylene terephthalate substrate, a polyether sulfide substrate, a polysulfone substrate and the like. Examples of the metal substrate include a substrate formed of one or more kinds of metals selected from the group consisting of stainless steel, iron, copper, aluminum, magnesium, nickel, zinc, chromium, titanium, molybdenum, silicon, germanium, tantalum, and alloys thereof.

Among these materials, it is preferred that a thin film-like polymer substrate or metal substrate is used as the sealing material in order to reduce the film-thickness of the element.

Further, it is preferred that the film-like polymer substrate has an oxygen permeability of $1\times10^{-3}$ ml/(m·24 h·atm) or less measured by a method in conformity with JIS K 7126-1987, and a water vapor permeability of $1\times10^{-3}$ g/(m$^2$·24 h) or less (at temperature of 25±0.5° C. and relative humidity of (90±2) % RH) measured by a method in conformity with JIS K 7129-1992.

Further, the aforesaid substrate material may also be formed into a concave plate to be used as the sealing material 17. In such a case, the aforesaid substrate material is subjected to a sand blasting process, a chemical etching process and/or the like, and formed into a concave shape.

The adhesive 19 for fixing the plate-like sealing material 17 to the side of the transparent substrate 13 is used as a sealing agent for sealing the organic electroluminescence element EL-1 sandwiched between the sealing material 17 and the transparent substrate 13. Concrete examples of the adhesive 19 include a photo-curable or thermo-curable adhesive agent containing a reactive vinyl group such as an acrylic acid oligomer or a methacrylic acid oligomer, and a moisture curable adhesive agent such as 2-cyanoacrylate.

Concrete examples of the adhesive 19 also include an epoxy-based thermally and chemically (2-liquid type) curable adhesive agents; a hot-melt type polyamide, polyester or polyolefin adhesive agents; and a cationic curable type UV-curable epoxy adhesive.

Incidentally, since there is a possibility that the organic material constituting the organic electroluminescence element EL-1 might be degraded by heat treatment, it is preferred that the adhesive 19 is an adhesive possible to be cured in a temperature from room temperature to 80° C. Further, a drying agent may be dispersed in the adhesive 19.

The adhesive 19 may be coated onto the adhesion portion between the sealing material 17 and the transparent substrate 13 either by a commercially available dispenser, or by printing such as screen printing. The adhesive 19 may either be applied only to the edge of the sealing material 17, as shown in FIG. 2, or be applied to the whole gap between the sealing material 17 and the organic electroluminescence element EL so that no gap is left in between.

In the case where a gap is formed between the sealing material 17, the transparent substrate 13 and the adhesive 19, it is preferred that an inert gas (such as nitrogen, argon or the like) or an inert liquid (such as fluorinated hydrocarbon, silicone oil or the like) is injected, in the form of gas or liquid phase, into the gap. Alternatively, the gap may also be in a vacuum state, or may have a hygroscopic compound enclosed therein.

Examples of the hygroscopic compound include a metal oxide (such as sodium oxide, potassium oxide, calcium oxide, barium oxide, magnesium oxide and aluminum oxide), a sulfate (such as sodium sulfate, calcium sulfate, magnesium sulfate and cobalt sulfate), a metal halide (such as calcium chloride, magnesium chloride, cesium fluoride, tantalum fluoride, cerium bromide, magnesium bromide, barium iodide and magnesium iodide), a perchloric acid (such as barium perchlorate and magnesium perchlorate) and the like; wherein if the sulfate, the metal halide or the perchlorate is used, anhydrides thereof will be preferable.

On the other hand, in the case where a sealing film is used as the sealing material 17, the sealing film is formed on the transparent substrate 13 in a state where the light-emitting functional layer 3 of the organic electroluminescence element EL-1 is completely covered, and the end portions of the transparent electrode 1 and the opposite electrode 5-1 of the organic electroluminescence element EL-1 are exposed to the outside.

Such a sealing film is formed of an inorganic material or an organic material. Particularly, such a sealing film is formed of a material capable of inhibiting penetration of substances, such as moisture, oxygen and the like, which cause the light-emitting functional layer 3 of the organic electroluminescence element EL-1 to degrade. Examples of such material include silicon oxide, silicon dioxide, silicon nitride and the like. Further, in order to reduce the fragility of the sealing film, the sealing film may have a laminated structure composed of the film(s) formed of one of the aforesaid inorganic materials and the film(s) formed of an organic material.

There is no particular limitation on the method of forming the aforesaid films. For example, the aforesaid films may be formed by a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, a coating method or the like.

[Protective Film, Protective Plate]

Incidentally, although not shown in the drawings, a protective film or protective plate may be provided so that the organic electroluminescence element EL and the sealing material 17 are sandwiched between the transparent substrate 13 and the protective film or protective plate. The protective film or protective plate is provided for mechanically protecting the organic electroluminescence element EL; particularly in the case where the sealing material 17 is a sealing film, since mechanical protection to the organic electroluminescence element EL is not sufficient, it is preferred that such protective film or protective plate is provided.

A glass plate, a polymer plate, a polymer film (which is thinner than the polymer plate), a metal plate, a metal film (which is thinner than the metal plate), a polymer material film or a metal material film may be used as the aforesaid protective film or protective plate. Among these options, the polymer film is preferably used in order to reduce the weight and thickness.

[Method for Producing Organic Electroluminescence Element EL-1]

As one example, a method for producing the organic electroluminescence element EL shown in FIG. 2 will be described below.

First, the nitrogen-containing layer 1a containing nitrogen atom is formed on the transparent substrate 13 by a suitable method, such as deposition or the like, so that the film-thickness of the nitrogen-containing layer 1a becomes 1 μm or less, preferably 10 nm to 100 nm. Next, the electrode layer 1b formed of silver (or an alloy having silver as a main component) is formed on the nitrogen-containing layer 1a by a suitable method, such as deposition or the like, so that the film-thickness of the electrode layer 1b becomes 12 nm or less, preferably 4 nm to 9 nm, and thereby the transparent electrode 1 (which is the anode) is formed.

Next, the hole injecting layer 3a, the hole transporting layer 3b, the light emitting layer 3c and the electron transporting layer 3d are formed, in this order, on the electrode layer 1b to thereby formed the light-emitting functional layer 3. Examples of the method for forming each of these layers include a spin coating method, a casting method, an ink-jet method, a deposition method, a printing method and the like; however, a vacuum deposition method or a spin coating method is particularly preferable because by such method, it is easy to form a uniform film and unlikely to cause pinholes. Further, these layers may each be formed by a different film-forming method. When the deposition method is used to form each of these layers, the deposition conditions vary depending on the type of the compound used; generally, it is preferred that the board heating temperature is selected in a range from 50° C. to 450° C., the vacuum degree is selected in a range from $10^{-6}$ Pa to $10^{-2}$ Pa, the deposition rate is selected in a range from 0.01 nm/sec to 50 nm/sec, the substrate temperature is selected in a range from −50° C. to 300° C., and the film-thickness is selected in a range from 0.1 μm to 5 μm.

After the light-emitting functional layer 3 has been formed in the aforesaid manner, the opposite electrode 5-1 (which is the cathode) is formed on the light-emitting functional layer 3 by a deposition method, a sputtering method or the like. At this time, the opposite electrode 5-1 is patterned into a shape such that the opposite electrode 5-1 is insulated from the transparent electrode 1 by the light-emitting functional layer 3, and the end portion of the opposite electrode 5-1 is drawn out to the edge of the transparent substrate 13 from the upper portion of the light-emitting functional layer 3. Thus, the organic electroluminescence element EL-1 is obtained. Thereafter, the sealing material 17 is formed in a manner in which at least the light-emitting functional layer 3 is covered in a state where the end portions of both the transparent electrode 1 and the opposite electrode 5-1 of the organic electroluminescence element EL are exposed to the outside.

By performing the above process, a desired organic electroluminescence element EL is obtained on the transparent substrate 13. It is preferred that, when producing the organic electroluminescence element EL-1, the layers from the light-emitting functional layer 3 to the opposite electrode 5-1 are continuously formed with one vacuuming operation; however, it is also possible to take out the transparent substrate 13 from the vacuum atmosphere during production to perform different film-forming method. In such a case, necessary considerations (such as performing the production process in dry inert gas atmosphere) should be taken into account.

In the case where a DC voltage is applied to the organic electroluminescence element EL-1 obtained in the aforesaid manner, light emission can be observed if a voltage of about 2 V to 40 V is applied wherein the electrode "+" is connected to the transparent electrode 1 (which is the anode) and the electrode "−" is connected to the opposite electrode 5-1 (which is the cathode). Also, an AC voltage may be applied to the organic electroluminescence element EL-1, wherein the AC voltage may have any waveform.

<Advantage of Organic Electroluminescence Element EL-1>

The organic electroluminescence element EL-1 described above has a configuration in which the transparent electrode 1, which has both the electrical conductivity and the light transmissibility, of the present invention is used as the anode, and the light-emitting functional layer 3 is sandwiched between the transparent electrode 1 and the opposite electrode 5-1 (which is the cathode). Thus, it is possible to increase brightness by applying sufficient voltage between the transparent electrode 1 and the opposite electrode 5-1 to achieve high brightness light-emitting of the organic electroluminescence element EL-1 while increasing extraction efficiency of the emitted light h from the side of the transparent electrode 1. Further, it is also possible to increase the light-emitting lifetime by reducing the driving voltage for obtaining a given brightness.

<<4. Second Example of Organic Electroluminescence Element>>

<Configuration of Organic Electroluminescence Element>

Figure 3:
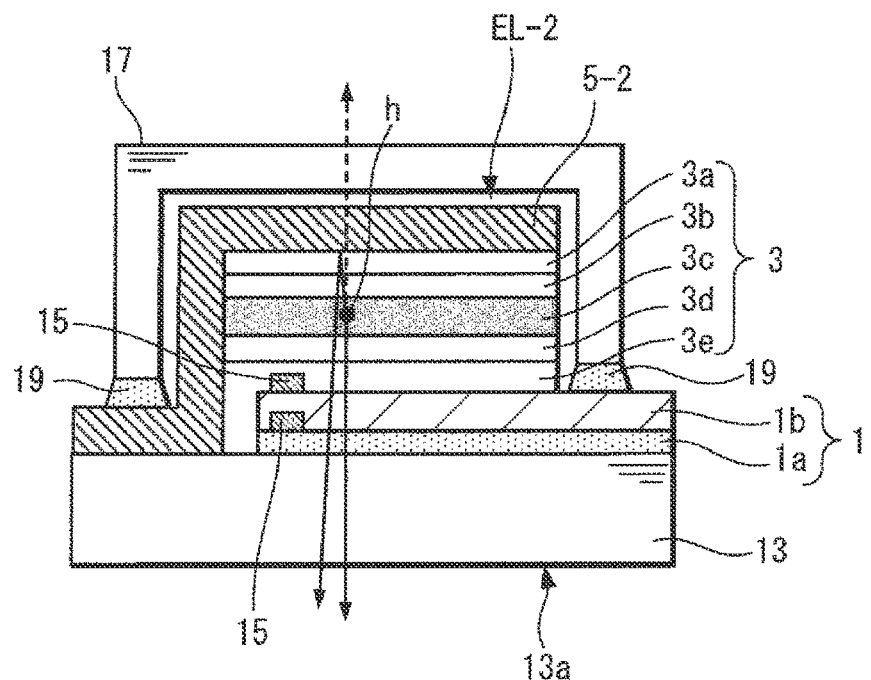
FIG. 3 is a view showing a cross-sectional configuration of a second example of the organic electroluminescence element that uses the transparent electrode according to the present invention.

As an example of the electronic device of the present invention, FIG. 3 shows a cross-sectional configuration of a second example of the organic electroluminescence element using the aforesaid transparent electrode. An organic electroluminescence element EL-2 of the second example shown in FIG. 3 differs from the organic electroluminescence element EL-1 of the first example shown in FIG. 2 in that the transparent electrode 1 is used as the cathode. In the following paragraphs, components identical to those of the first example will not be described repeatedly, and description will be focused on characteristic configurations of the organic electroluminescence element EL-2 of the second example.

The organic electroluminescence element EL-2 shown in FIG. 3 is arranged on the transparent substrate 13; similar to the first example, the feature of the organic electroluminescence element EL-2 is that the aforesaid transparent electrode 1 according to the present invention is used as the transparent electrode 1 arranged on the transparent substrate 13. Thus, the organic electroluminescence element EL-2 is configured so that the emitted light h is extracted at least from the side of the transparent substrate 13. However, the transparent electrode 1 is used as the cathode. Thus, an opposite electrode 5-2 is used as the anode.

Similar to the first example, the layer-structure of the organic electroluminescence element EL-2 is not particularly limited, but may be a generic layer-structure. As one example of the second example, the configuration shown here is formed by laminating the electron injecting layer 3e/the electron transporting layer 3d/the light emitting layer 3c/the hole transporting layer 3b/the hole injecting layer 3a in this order from upper face of the transparent electrode 1 which functions as the cathode. However, among these layers, the light emitting layer 3c formed of an organic material is indispensable.

Note that, in the light-emitting functional layer 3, similar to the first example, various configurations can be adopted according to necessity, in addition to these layers. In such a configuration, similar to the first example, only a part where the light-emitting functional layer 3 is sandwiched by the transparent electrode 1 and the opposite electrode 5-2 is a light-emitting region of the organic electroluminescence element EL-2.

Further, similar to the first example, in the aforesaid layer-structure, in order to reduce the resistance of the transparent electrode 1, the auxiliary electrode 15 may be provided in contact with the electrode layer 1b of the transparent electrode 1.

Here, the opposite electrode 5-2 used as the anode is formed of a metal, an alloy, an organic or inorganic conductive compound, or a mixture of these materials. To be specific, the opposite electrode 5-2 is formed of a metal (such as gold (Au) and the like), copper iodide (CuI), an oxide semiconductor (such as ITO, ZnO, $TiO_2$, $SnO_2$ and the like) or the like.

The opposite electrode 5-2 described above can be formed by forming a thin-film with the aforesaid conductive material by a method such as deposition, sputtering or the like. The sheet resistance of the opposite electrode 5-2 is preferably several hundred Ω/sq. or less; and the film-thickness of the opposite electrode 5-2 is generally within a range from 5 nm to 5 μm, preferably within a range from 5 nm to 200 nm.

Incidentally, in the case where the organic electroluminescence element EL-2 is to be configured so that the emitted light h is also extracted from the side of the opposite electrode 5-2, the opposite electrode 5-2 may be formed by a conductive material with good light transmissibility selected from the aforesaid conductive materials.

In order to prevent the deterioration of the light-emitting functional layer 3, the organic electroluminescence element EL-2 having the aforesaid configuration is sealed by a sealing material 17 in the same manner as the first example.

The detailed configuration of the components of the main layers, except for the opposite electrode 5-2 used as the anode, that compose the organic electroluminescence element EL-2 described above, and the method of producing the organic electroluminescence element EL-2 are identical to those of the first example. Thus, the detailed description will not be repeated.

<Advantage of Organic Electroluminescence Element EL-2>

The organic electroluminescence element EL-2 described above has a configuration in which the transparent electrode 1, which has both the electrical conductivity and the light transmissibility, of the present invention is used as the cathode, and the light-emitting functional layer 3 and the opposite electrode 5-2 (which is the anode) are formed above the transparent electrode 1. Thus, similar to the first example, it is possible to increase brightness by applying sufficient voltage between the transparent electrode 1 and the opposite electrode 5-1 to achieve high brightness light-emitting of the organic electroluminescence element EL-2 while increasing extraction efficiency of the emitted light h from the side of the transparent electrode 1. Further, it is also possible to increase the light-emitting lifetime by reducing the driving voltage for obtaining a given brightness.

<<5. Third Example of Organic Electroluminescence Element>>

<Configuration of Organic Electroluminescence Element>

Figure 4:
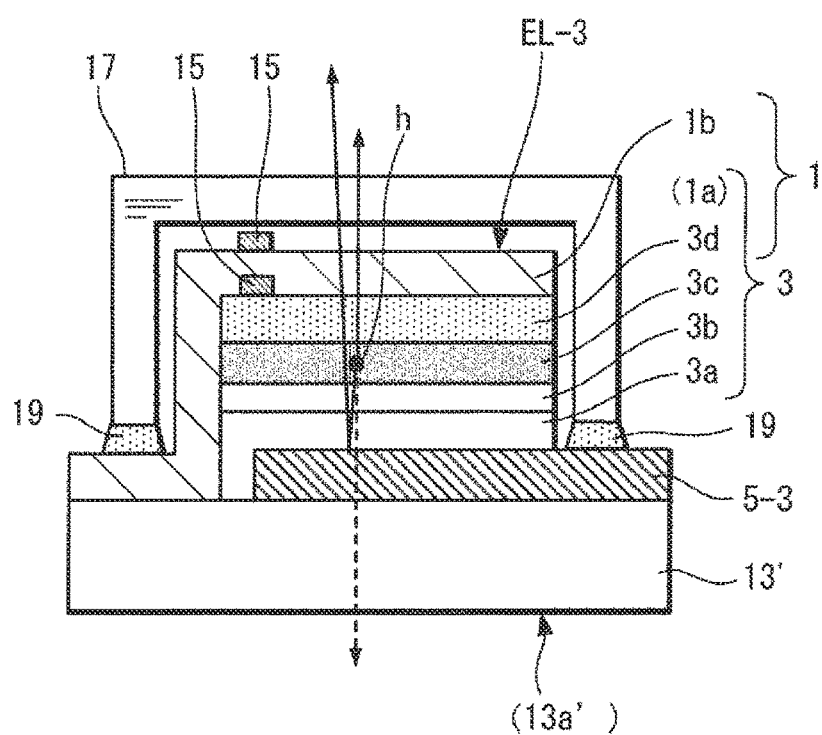
FIG. 4 is a view showing a cross-sectional configuration of a third example of the organic electroluminescence element that uses the transparent electrode according to the present invention.

As an example of the electronic device of the present invention, FIG. 4 shows a cross-sectional configuration of a third example of the organic electroluminescence element using the aforesaid transparent electrode. An Organic electroluminescence element EL-3 of the third example shown in FIG. 4 differs from the organic electroluminescence element EL-1 of the first example shown in FIG. 2 in that an opposite electrode 5-3 is arranged on the side of a substrate 13', and the light-emitting functional layer 2 and the transparent electrode 1 are laminated, in this order, on the upper face of the opposite electrode 5-3. In the following paragraphs, components identical to those of the first example will not be described repeatedly, and description will be focused on Characteristic configurations of the organic Electroluminescence element EL-3 of the third example.

An organic electroluminescence element EL-3 shown in FIG. 4 is arranged on the substrate 13', and is formed by Laminating the opposite electrode 5-3 (which is the anode), the light-emitting functional layer 3, and the transparent electrode 1 (which is the cathode), in this order, from the side of the substrate 13'. It is characterized that, among these layers, the aforesaid transparent electrode 1 of the present invention is used as the transparent electrode 1. Thus, in the organic electroluminescence element EL-3, the emitted light h is extracted at least from the side of the transparent electrode 1, which is the side opposite to side of the substrate 13.

Similar to the first example, the layer-structure of the organic electroluminescence element EL-3 is not particularly limited, but may have a generic layer-structure. As one example of the second example, the configuration shown here is formed by laminating the hole injecting layer 3a/the hole transporting layer 3b/the light emitting layer 3c/the electron transporting layer 3d, in this order, from upper face of the opposite electrode 5-3 which functions as the cathode. However, among these layers, the light emitting layer 3c formed by using an organic material is indispensable. Further, since the electron transporting layer 3d also serves as the electron injecting layer 3e, the electron transporting layer 3d is provided as an electron transporting layer 3d having electron injection performance.

Particularly, as a characteristic configuration of the organic electroluminescence element EL-3 of the third example, the electron transporting layer 3d having electron injection performance is provided as a nitrogen-containing layer 1a of the transparent electrode 1. In other words, in the third example, the transparent electrode 1 used as the cathode is composed of the nitrogen-containing layer 1a, and the electrode layer 1b, wherein the nitrogen-containing layer 1a also serves as the electron transporting layer 3d having electron injection performance.

It is important that such an electron transporting layer 3d is formed by using material identical to the material constituting the nitrogen-containing layer 1a of the transparent electrode 1 described before.

Note that, in the light-emitting functional layer 3, similar to the first example, various configurations can be adopted according to necessity, in addition to these layers; however, nether the electron injecting layer nor the hole blocking layer is provided between the electron transporting layer 3d, which also serves as the nitrogen-containing layer 1a of the transparent electrode 1, and the electrode layer 1b of the transparent electrode 1. In such a configuration, similar to the first example, only a part where the light-emitting functional layer 3 is sandwiched by the transparent electrode 1 and the opposite electrode 5-3 is a light-emitting region of the organic electroluminescence element EL-3.

Further, similar to the first example, in the aforesaid layer-structure, in order to reduce the resistance of the transparent electrode 1, the auxiliary electrode 15 may be provided in contact with the electrode layer 1*b* of the transparent electrode 1.

Further, the opposite electrode 5-3 used as the anode is formed of a metal, an alloy, an organic or inorganic conductive compound, or a mixture of these materials. To be specific, the opposite electrode 5-3 is formed of a metal (such as gold (Au) and the like), copper iodide (CuI), an oxide semiconductor (such as ITO, ZnO, TiO2, SnO2 and the like) or the like.

The opposite electrode 5-3 described above can be produced by forming a thin-film with the aforesaid conductive material by a method such as deposition, sputtering or the like. The sheet resistance of the opposite electrode 5-3 is preferably several hundred Ω/sq. or less; and the film-thickness of the opposite electrode 5-1 is generally within a range from 5 nm to 5 μm, preferably within a range from 5 nm to 200 nm.

Incidentally, in the case where the organic electroluminescence element EL-3 is to be configured so that the emitted light h is also extracted from the side of the opposite electrode 5-3, the opposite electrode 5-3 may be formed by a conductive material with good light transmissibility selected from the aforesaid conductive materials. In such a case, a substrate identical to the transparent substrate 13 described in the first example is used as the substrate 13', and a surface of the substrate 13' facing outside is a light extracting face 13*a'*.

<Advantage of Organic Electroluminescence Element EL-3>

In the organic electroluminescence element EL-3 described above, the electron transporting layer 3*d* having electron injection performance, which constitutes the uppermost portion of the light-emitting functional layer 3, serves as the nitrogen-containing layer 1*a*, and the electrode layer 1*b* is formed on the upper face of the nitrogen-containing layer 1*a*; thereby the transparent electrode 1 composed of the nitrogen-containing layer 1*a* and the electrode layer 1*b*, which is formed on the upper face of the nitrogen-containing layer 1*a*, serves as the cathode. Thus, similar to the first and second examples, it is possible to increase brightness by applying sufficient voltage between the transparent electrode 1 and the opposite electrode 5-3 to achieve high brightness light-emitting of the organic electroluminescence element EL-3 while increasing extraction efficiency of the emitted light h from the side of the transparent electrode 1. Further, it is also possible to increase the light-emitting lifetime by reducing the driving voltage for obtaining a given brightness. Further, in the aforesaid configuration, if the opposite electrode 5-3 has light transmissibility, the emitted light h can also be extracted from the opposite electrode 5-3.

Described in the third example is a configuration in which the nitrogen-containing layer 1*a* of the transparent electrode 1 also serves as the electron transporting layer 3*d* having electron injection performance. However, the nitrogen-containing layer 1*a* may also serve as an electron injecting layer, or serve as an electron transporting layer 3*d* having no electron injection performance; further, in the case where the nitrogen-containing layer 1*a* is formed as an extremely thin film so that light-emitting function is not affected, the nitrogen-containing layer 1*a* may have neither electron transporting performance nor electron injection performance. FIG. 4 shows a configuration in which the nitrogen-containing layer 1*a* is formed only on the light emitting layer 3*c*; however, in the case where the light-emitting function is not affected, the nitrogen-containing layer 1*a* may be formed on the whole surface adjacent to the electrode layer 1*b*, so that the whole electrode layer 1*b* has electrical conductivity.

Further, in the case where the nitrogen-containing layer 1*a* of the transparent electrode 1 is formed as an extremely thin film so that light-emitting function is not affected, the opposite electrode formed on the side of the substrate 13' may be used as the cathode, and the transparent electrode 1 formed on the light-emitting functional layer 3 may be used as the anode. In such a case, the light-emitting functional layer 3 is formed by laminating, for example, the electron injecting layer 3*e*/the electron transporting layer 3*d*/the light emitting layer 3*c*/the hole transporting layer 3*b*/the hole injecting layer 3*a*, in this order, from the side of the opposite electrode (the cathode) formed on the substrate 13'. Further, as the anode, the transparent electrode 1 constituted by a laminated structure composed of the extremely thin nitrogen-containing layer 1*a* and the electrode layer 1*b* is formed on the top of aforesaid structure.

<<6. Applications of Organic Electroluminescence Element>>

As mentioned above, since the organic electroluminescence elements having the aforesaid configurations are each a planar light-emitting body, they can be used as various kinds of luminescent light sources. Examples of the various kinds of luminescent light sources include, but not limited to, an illumination device (such as a home lighting fixture, a car lighting fixture or the like), a backlight for timepiece or liquid crystal, an illumination for billboard, a light source for traffic light, a light source for optical storage medium, a light source for electrophotographic copier, a light source for optical communication processor and a light source for optical sensor; particularly, the light emitting source can be effectively used as a backlight for a liquid crystal display device combined with a color filter, and as a light source for illumination.

Further, the organic electroluminescence element according to the present invention may either be used as a kind of lamp such as an illuminating source, an exposing source or the like, or be used as a projection device where an image is projected, a display device (a display) where a still image or dynamic image is directly viewed, or the like. In such a case, as the size of the illumination devices and displays becomes large in recent years, the area of the light-emitting face may be increased by a method of so-called "tiling", in which light-emitting panels each having an organic electroluminescence element are planarly connected with each other.

In the case where the organic electroluminescence element is used as a display device for replaying dynamic image, the driving method may either be a simple matrix driving method (i.e., passive matrix driving method) or an active matrix driving method. Further, it is possible to produce a color or full color display device by using two or more organic electroluminescence elements of the present invention each having different emission color.

As an example of the applications, an illumination device will be described below, and thereafter an illumination device whose light-emitting face is made large by tiling will be described.

<<7. Illumination Device 1>>

The illumination device of the present invention has an aforesaid organic electroluminescence element.

The organic electroluminescence element used in the illumination device according to the present invention may also have a design in which each of the organic electroluminescence elements having the aforesaid configurations is provided with a resonator structure. Examples of the intended use of the organic electroluminescence element configured as the resonator structure include, but not limited to, a light source for an optical storage medium, a light source for an electrophotographic copier, a light source for an optical communication processor, a light source for an optical sensor, and the like. Further, the illumination device may also be used for the aforesaid purpose by laser-oscillating.

Incidentally, the material used in the organic electroluminescence element of the present invention may be used for an organic electroluminescence element which substantially emits while light (also referred to as a "white organic electroluminescence element"). For example, it is possible to cause a plurality of emission colors to be simultaneously emitted by a plurality of light emitting materials so as to obtain a white light emission by mixed color. The combination of the plurality of emission colors may be a combination including three light emission maximum wavelengths of three primary colors of blue, green and red, or a combination including two light emission maximum wavelengths using the complementary color relationship such as blue and yellow, bluish-green and orange, or the like.

Further, the combination of light emitting materials for obtaining a plurality of emission colors may be a combination of a plurality of materials which emit a plurality of phosphorescent lights or fluorescent lights, or a combination of a light emitting material which emits phosphorescent light or fluorescent light and a dye material which emits light with the light emitted from the light emitting material as exciting light; however, in a white organic electroluminescence element, the combination of light emitting materials for obtaining a plurality of emission colors may also be a combinations of a plurality of light-emitting dopants.

In such a white organic electroluminescence element, the organic electroluminescence element itself emits white light, in contrast to a configuration in which a plurality of organic electroluminescence elements each emitting different color are parallelly arranged in array to obtain white-light emission. Thus, almost all layers constituting the element can be formed without mask, and it is possible to form an electrode film, for example, on one surface by a deposition method, a casting method, a spin coating method, an ink-jet method, a printing method or the like, so that productivity can be improved.

The light emitting material used in the light emitting layer of such a white organic electroluminescence element is not particularly limited; for example, if the light emitting material is used for the back light of a liquid crystal display element, arbitrary light emitting materials may be selected from the metal complexes of the present invention or known light emitting materials and combined to obtain white light in a manner in which the light is matched to the wavelength range corresponding to CF (color filter) characteristics.

By using the white organic electroluminescence element described above, it is possible to produce an illumination device which substantially emits white light.

<<8. Illumination Device 2>>

Figure 5:
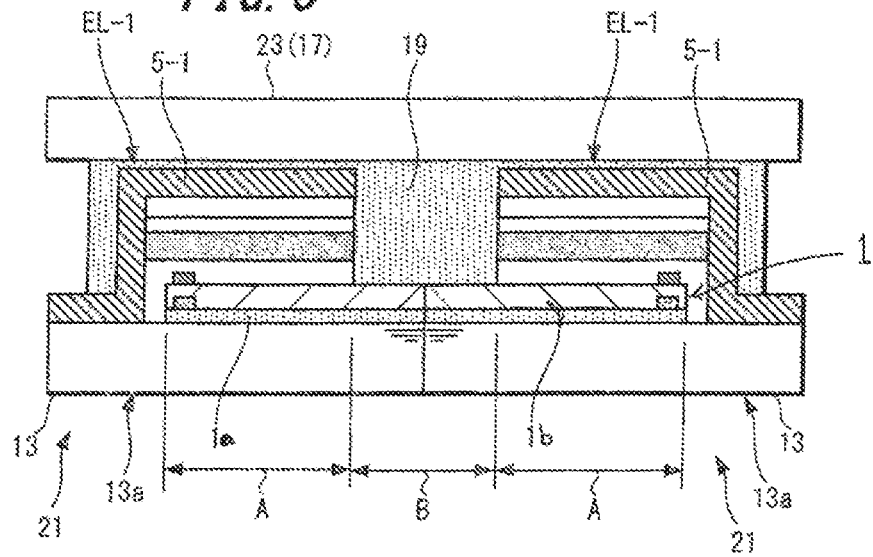
FIG. 5 is a view showing a cross-sectional configuration of an illumination device whose light-emitting face is made large by using a plurality of organic electroluminescence elements.

FIG. 5 shows a cross-sectional configuration of an illumination device whose light-emitting face is made large by using a plurality of organic electroluminescence elements each having aforesaid configuration. The illumination device shown in FIG. 5 has a configuration in which the area of the light-emitting face is increased by arranging (i.e., so-called "tiling") a plurality of light-emitting panels 21 on a supporting substrate 23, wherein each light-emitting panel 21 is formed by, for example, arranging the organic electroluminescence element EL-1 on the transparent substrate 13. The supporting substrate 23 may also serves as the sealing material 17; the light-emitting panels 21 are tiled in a state where the organic electroluminescence elements EL-1 are sandwiched between the supporting substrate 23 and the transparent substrates 13 of the light-emitting panels 21. The adhesive 19 may be filled between the supporting substrate 23 and the transparent substrates 13, and thereby the organic electroluminescence elements EL-1 are sealed. Incidentally, the end portion of the transparent electrode 1 (which is the anode) and the end portion of the opposite electrode 5-1 (which is the cathode) are exposed from the periphery of the light-emitting panels 21. However, only the exposed portion of the opposite electrode 5-1 is shown in FIG. 5.

In the illumination device having such a configuration, the center of each light-emitting panel 21 is a light-emitting region A, and the region between adjacent light-emitting panels 21 is a light non-emitting region B. Thus, a light extraction member for increasing the amount of the light extracted from the light non-emitting region B may be arranged in the light non-emitting region B of the light extracting face 13a. A light-collecting sheet, a light-diffusing sheet or the like can be used as the light extraction member.

Example 1

<<Preparation of Transparent Electrode>>

As described below, transparent electrodes of Samples No. 1 to 21 were prepared so that the area of the conductive region of each transparent electrode became 5 cm×5 cm. In each of Samples No. 1 to 4, a transparent electrode having a single-layer structure was prepared, and in each of Samples No. 5 to 21, a transparent electrode having a laminated structure was prepared, wherein the laminated structure was composed of a ground layer, and an electrode layer formed on the top of the ground layer.

<Preparation of Transparent Electrodes of Samples No. 1 to 4>

In each of Samples No. 1 to 4, the transparent electrode having a single-layer structure was prepared in the following manner. First, a transparent base material made of alkali-free glass was fixed to a base material holder of a commercially available vacuum deposition device, and then the base material holder was mounted on a vacuum chamber of the vacuum deposition device. Further, silver (Ag) was placed in a tungsten resistance heating board, and then the tungsten resistance heating board was mounted inside the vacuum chamber. Next, the pressure of the vacuum chamber was reduced to $4 \times 10^{-4}$ Pa, and then the resistance heating board was electrically heated to form a transparent electrode having a single-layer structure composed of silver at a deposition rate of 0.1 nm/sec to 0.2 nm/sec. The film-thicknesses of the transparent electrodes of Sample No. 1 to 4 are in a range of 5 nm to 15 nm, and are shown in Table 1.

<Preparation of Transparent Electrode of Sample No. 5>

SiO2 was previously deposited on a transparent base material made of alkali-free glass by a sputtering method to form a ground layer having a film-thickness of 25 nm, and then an electrode layer composed of silver (Ag) was deposited on the ground layer so as to obtain a transparent electrode, wherein the film-thickness of the electrode layer was 8 nm. Deposition of the electrode layer composed of silver (Ag) was performed in the same manner as Samples No. 1 to 4.

<Preparation of Transparent Electrode of Sample No. 6>

A transparent base material made of alkali-free glass was fixed to a base material holder of a commercially available vacuum deposition device, below-mentioned spiro-DPVBi was placed into a tantalum resistance heating board, and both the base material holder and the heating board were mounted on a first vacuum chamber. Further, silver (Ag) was placed in a tungsten resistance heating board, and the tungsten resistance heating board was mounted inside a second vacuum chamber.

[Chemical Formula 66]

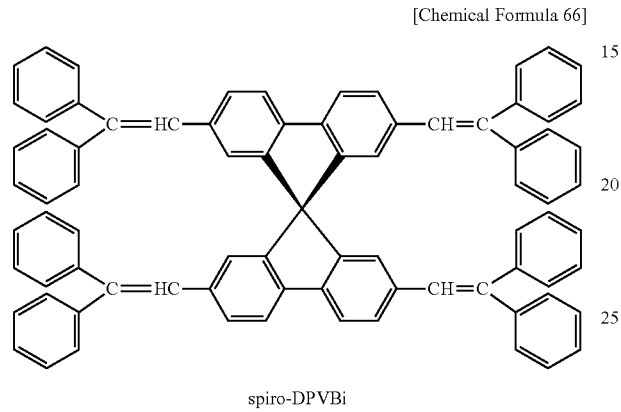

spiro-DPVBi

In such state, first, the pressure of the first vacuum chamber was reduced to $4\times10^{-4}$ Pa, and then the heating board having spiro-DPVBi placed therein was electrically heated to form a nitrogen-containing layer (as a ground layer) composed of spiro-DPVBi on the base material at a deposition rate of 0.1 nm/sec to 0.2 nm/sec, wherein the film-thickness of the nitrogen-containing layer was 25 nm.

Next, the base material, on which the layers up to the nitrogen-containing layer (i.e., the ground layer) had been formed, was transferred to the second vacuum chamber while maintaining the vacuum state. After the pressure of the second vacuum chamber was reduced to $-4\times10^{-4}$ Pa, the heating board having silver placed therein was electrically heated. Thus, an electrode layer composed of silver and having a film-thickness of 8 nm was formed at a deposition rate of 0.1 nm/sec to 0.2 nm/sec, and thereby a transparent electrode having a laminated structure composed of a nitrogen-containing layer and an electrode layer adjacent to the nitrogen-containing layer was obtained.

<Preparation of Transparent Electrodes of Samples No. 7 to 15>

The transparent electrode of each of Samples No. 7 to 15 was prepared by the same method as the transparent electrode of Sample No. 5 except that material of the nitrogen-containing layer (i.e., the ground layer) and the film-thickness of the electrode layer were changed to those described in Table 1.

The material (TPD) of the nitrogen-containing layer of Sample No. 7 is a compound containing nitrogen and having the following structure. Further, the material (porphyrin derivative) of the nitrogen-containing layer of Sample No. 8 is a compound having a heterocycle with a nitrogen atom as a hetero atom, and having the following structure.

[Chemical Formula 67]

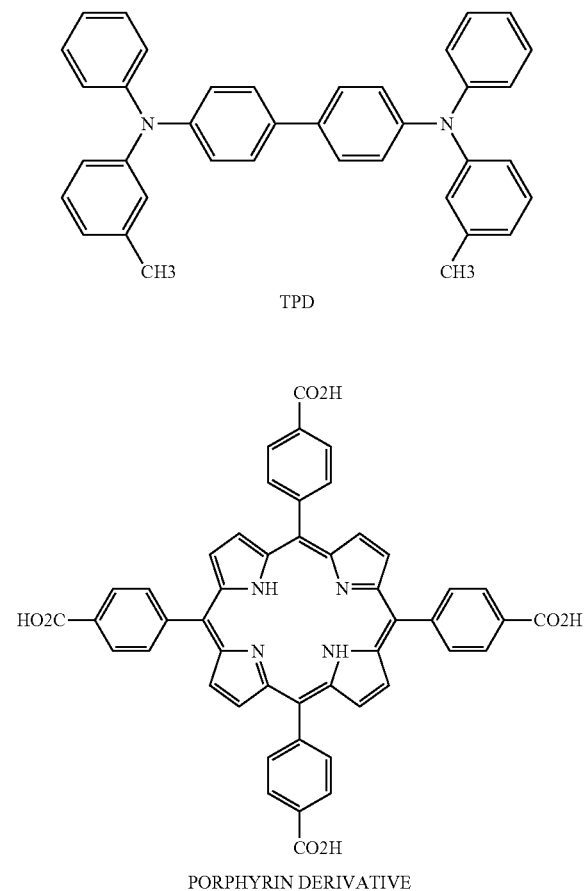

TPD

PORPHYRIN DERIVATIVE

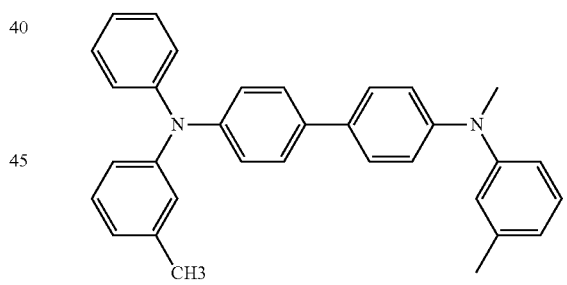

Further, as described below, the material (a compound 99) of the nitrogen-containing layer of Sample No. 9, the material (a compound 94) of the nitrogen-containing layer of Sample No. 10, the material (a compound 10) of the nitrogen-containing layer of each of Sample No. 11 to 14, and the material (a compound 112) of the nitrogen-containing layer of Sample No. 15 respectively have structures shown as the material of the aforesaid nitrogen-containing layer 1a. Among these compounds, the compound 99 corresponds to General Formula (1), the compound 94 corresponds to General Formula (2), the compound 10 has a pyridine group and corresponds to General Formula (3), and the compound 112 corresponds to General Formula (1).

[Chemical Formula 68]

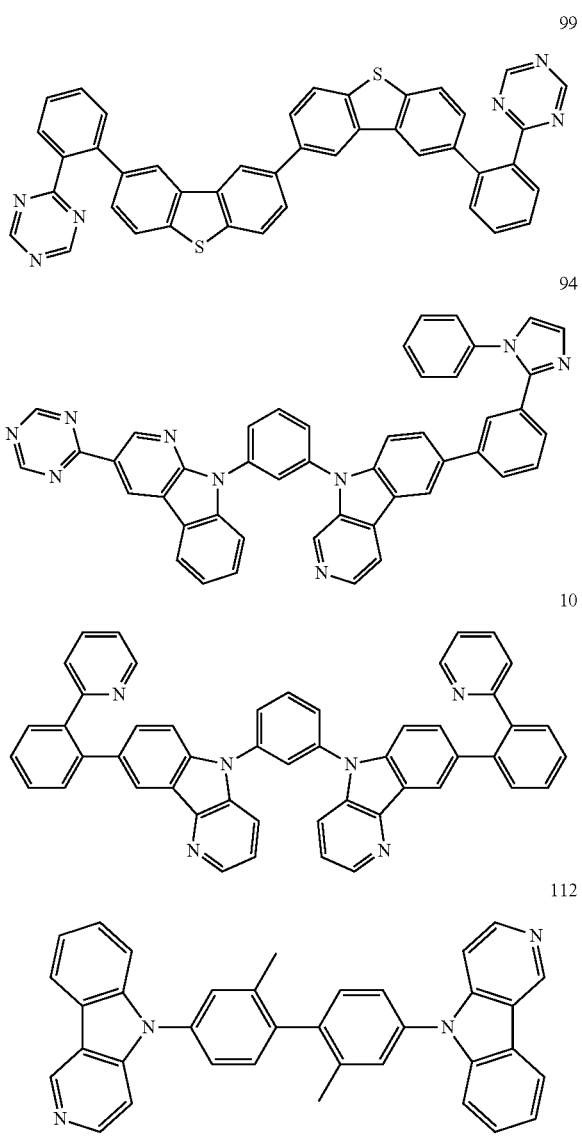

<Preparation of Transparent Electrode of Sample No. 16>

First, as a ground layer, a nitrogen-containing layer using the compound 112 was formed by using a coating method on a transparent base material made of alkali-free glass. In such a case, a coating liquid obtained by dissolving 0.75 g of the compound 112 into 100 g of 2,2,3,3-tetrafluoro-1-propanol was coated on the base material by a spin coater in a condition of: 1500 rpm, 30 seconds. Then, the base material was heated at a temperature of 120° C. (temperature of the surface of the substrate) for 30 minutes to obtain a nitrogen-containing layer consisting of the compound 112. In the same conditions, a nitrogen-containing layer consisting of the compound 112 was formed on a separately-prepared base material by a coating method. The film-thickness of the nitrogen-containing layer coated on the separately-prepared base material was measured, and the result of the measurement was 25 nm.

First, a base material having a nitrogen-containing layer (ground layer) formed thereon was fixed to a base material holder of a commercially available vacuum deposition device, silver was placed in a tungsten resistance heating board, and the base material holder and the tungsten resistance heating board were mounted on the vacuum chamber of the vacuum deposition device. Next, the pressure of the vacuum chamber was reduced to $4 \times 10^{-4}$ Pa, and then the heating board having silver placed therein was electrically heated to form an electrode layer consisting of silver at a deposition rate of 0.1 nm/sec to 0.2 nm/sec, wherein the film-thickness of the electrode layer was 8 nm. By performing the above process, a transparent electrode having a laminated structure composed of a nitrogen-containing layer and an electrode layer adjacent to the nitrogen-containing layer was obtained.

<Preparation of Transparent Electrode of Sample No. 17>

A transparent base material made of alkali-free glass was fixed to a base material holder of a commercially available vacuum deposition device, the compound 10 was placed into a tantalum resistance heating board, and the base material holder and the tantalum resistance heating board were mounted on a first vacuum chamber of the vacuum deposition device; similarly, silver and copper were respectively placed into two tantalum resistance heating boards, and the two tantalum resistance heating boards was mounted on a second vacuum chamber of the vacuum deposition device.

First, the pressure of the first vacuum chamber was reduced to $4 \times 10^{-4}$ Pa, and then the heating board having the compound 10 placed therein was electrically heated to form a nitrogen-containing layer consisting of the compound 10 on the base material at a deposition rate of 0.1 nm/sec to 0.2 nm/sec, wherein the film-thickness of the nitrogen-containing layer was 25 nm.

Next, the base material, on which the layers up to the nitrogen-containing layer had been formed, was transferred to the second vacuum chamber while maintaining the vacuum state. After the pressure of the second vacuum chamber was reduced to $-4 \times 10^{-4}$ Pa, the heating board having silver placed therein and the heating board having copper placed therein were each independently electrically heated to form an electrode layer consisting of silver and copper and having a film-thickness of 5 nm, wherein the deposition rates were adjusted so that ratio of copper to silver became 5% by weight. By performing the above process, a transparent electrode having a laminated structure composed of a nitrogen-containing layer and an electrode layer adjacent to the nitrogen-containing layer was obtained.

<Preparation of Transparent Electrode of Sample No. 18>

The transparent electrode of Sample No. 18 was prepared by the same method as the transparent electrode of Sample No. 17 except that the film-thickness of the electrode layer was changed to 8 nm.

<Preparation of Transparent Electrode of Sample No. 19>

The transparent electrode of Sample No. 19 was prepared by the same method as the transparent electrode of Sample No. 13 except that the base material was changed from alkali-free glass to PET.

<Preparation of Transparent Electrode of Sample No. 20>

The transparent electrode of Sample No. 20 was prepared by the same method as the transparent electrode of Sample No. 15 except that the base material was changed from alkali-free glass to PET.

<Preparation of Transparent Electrode of Sample No. 21>

The transparent electrode of Sample No. 21 was prepared by the same method as the transparent electrode of Sample No. 16 except that the base material was changed from alkali-free glass to PET.

TABLE 1

CONFIGURATION OF EXAMPLE TRANSPARENT ELECTRODE

| | | GROUND LAYER | | | |
|---|---|---|---|---|---|
| SAMPLE | BASE MATERIAL | MATERIAL | FILM-THICKNESS (nm) | FILM-FORMING METHOD | ELECTRODE LAYER MATERIAL |
| 1 | ALKALI-FREE GLASS | — | — | — | Ag |
| 2 | ↓ | — | — | — | ↓ |
| 3 | ↓ | — | — | — | ↓ |
| 4 | ↓ | — | — | — | ↓ |
| 5 | ↓ | SiO2 | 25 | SPUTTERING | ↓ |
| 6 | ↓ | spiro-DPVBi | ↓ | DEPOSITION | ↓ |
| 7 | ↓ | TPD | ↓ | ↓ | ↓ |
| 8 | ↓ | PORPHYRIN DERIVATIVE | ↓ | ↓ | ↓ |
| 9 | ↓ | COMPOUND99 | ↓ | ↓ | ↓ |
| 10 | ↓ | COMPOUND94 | ↓ | ↓ | ↓ |
| 11 | ↓ | COMPOUND10 | ↓ | ↓ | ↓ |
| 12 | ↓ | ↓ | ↓ | ↓ | ↓ |
| 13 | ↓ | ↓ | ↓ | ↓ | ↓ |
| 14 | ↓ | ↓ | ↓ | ↓ | ↓ |
| 15 | ↓ | COMPOUND112 | ↓ | ↓ | ↓ |
| 16 | ↓ | ↓ | ↓ | COATING | ↓ |
| 17 | ↓ | COMPOUND10 | ↓ | DEPOSITION | AgCu |
| 18 | ↓ | ↓ | ↓ | ↓ | ↓ |
| 19 | PET | ↓ | ↓ | ↓ | Ag |
| 20 | ↓ | COMPOUND112 | ↓ | ↓ | ↓ |
| 21 | ↓ | ↓ | ↓ | COATING | ↓ |

| | CONFIGURATION OF EXAMPLE TRANSPARENT ELECTRODE ELECTRODE LAYER | | RESULT OF EVALUATION | | |
|---|---|---|---|---|---|
| SAMPLE | FILM-THICKNESS (nm) | FILM-FORMING METHOD | TRANSMISSION (% at 550 nm) | SHEET RESISTANCE (Ω/sq.) | REMARK |
| 1 | 5 | DEPOSITION | 30% | UNMEASURABLE | COMPARISON |
| 2 | 8 | ↓ | 45% | 512 | COMPARISON |
| 3 | 10 | ↓ | 38% | 41 | COMPARISON |
| 4 | 15 | ↓ | 22% | 10 | COMPARISON |
| 5 | 8 | ↓ | 44% | 549 | COMPARISON |
| 6 | ↓ | ↓ | 47% | 518 | COMPARISON |
| 7 | ↓ | ↓ | 52% | 35 | PRESENT INVENTION |
| 8 | ↓ | ↓ | 57% | 28 | PRESENT INVENTION |
| 9 | ↓ | ↓ | 62% | 15 | PRESENT INVENTION |
| 10 | ↓ | ↓ | 65% | 10 | PRESENT INVENTION |
| 11 | 3 | ↓ | 60% | 38 | PRESENT INVENTION |
| 12 | 5 | ↓ | 69% | 9 | PRESENT INVENTION |
| 13 | 8 | ↓ | 70% | 6 | PRESENT INVENTION |
| 14 | 10 | ↓ | 60% | 4 | PRESENT INVENTION |
| 15 | 8 | ↓ | 64% | 11 | PRESENT INVENTION |
| 16 | ↓ | ↓ | 61% | 15 | PRESENT INVENTION |
| 17 | 5 | ↓ | 57% | 11 | PRESENT INVENTION |
| 18 | 8 | ↓ | 68% | 8 | PRESENT INVENTION |
| 19 | ↓ | ↓ | 65% | 11 | PRESENT INVENTION |
| 20 | ↓ | ↓ | 59% | 16 | PRESENT INVENTION |
| 21 | ↓ | ↓ | 56% | 20 | PRESENT INVENTION |

<Evaluation of Each Sample of Example 1, Part 1>

Light transmittance of the transparent electrode of each of Samples No. 1 to 21 prepared above was measured. The measurement of the light transmittance was performed by a spectrophotometer (U-3300, manufactured by Hitachi Co., Ltd.) using a base material identical to the sample as a baseline. The results of the measurement are shown in Table 1.

<Evaluation of Each Sample of Example 1, Part 2>

Sheet resistance of the transparent electrode of each of Samples No. 1 to 21 prepared above was measured. The measurement of the sheet resistance was performed by a 4-terminal 4-probe constant current applying method using a resistivity meter (MCP-T610, manufactured by Mitsubishi Chemical Corporation). The results of the measurement are shown in Table 1.

<Evaluation Results of Example 1>

As can be obviously known from Table 1, the transparent electrode of each of Samples No. 7 to 21 having the configuration of the present invention (i.e., a configuration in which an electrode layer having silver (Ag) as a main component is formed adjacent to a nitrogen-containing layer which is formed by using a compound containing nitrogen atom) has a light transmittance of 50% or higher, and a sheet resistance of 40 Ω/sq. or less. In contrast, the transparent electrode of each of Samples No. 1 to 6 having no configuration of the present invention either has a light transmittance of less than 50%, or has a sheet resistance of 500 Ω/sq. or higher.

Based on the above description, it is confirmed that the transparent electrode having the configuration of the present invention has higher light transmittance and higher electrical conductivity.

Example 2

Figure 6:
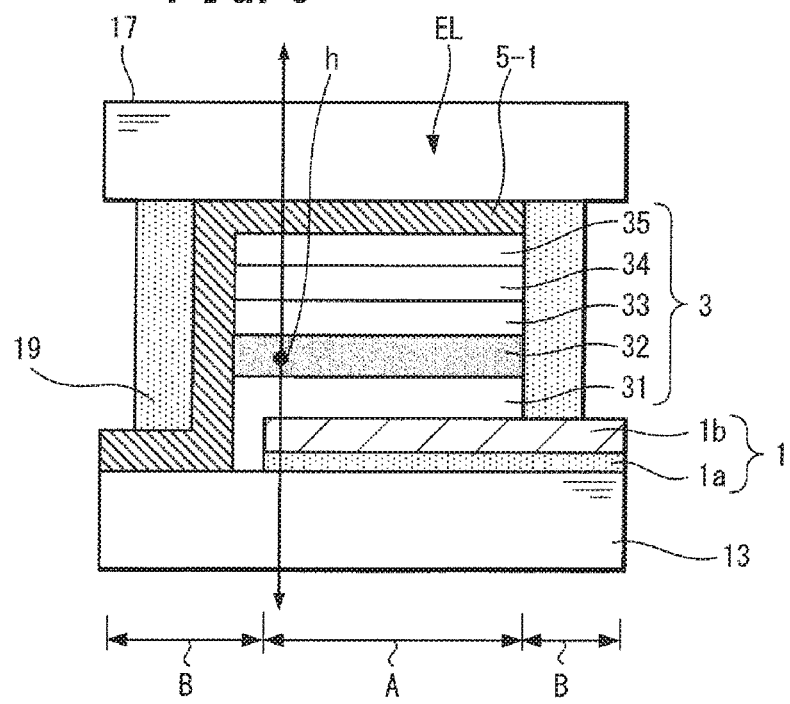
FIG. 6 is a view showing a cross-sectional configuration of an organic electroluminescence element prepared in an example.

In Example 2, a dual emission type organic electroluminescence element using the transparent electrode of each of Samples No. 1 to 21 prepared in Example 1 as the anode was prepared. The process of the preparation will be described below with reference to FIG. 6.

First, a transparent substrate 13, on which a transparent electrode 1 of each of Samples No. 1 to 21 prepared in Example 1 had been formed, was fixed to a substrate holder of a commercially available vacuum deposition device, and a deposition mask was mounted so as to face the surface where the transparent electrode 1 had been formed. Further, respective materials for forming the light-emitting functional layer 3 were filled into respective heating boards provided in the vacuum deposition device, wherein the amounts of the respective materials filled into respective heating boards were optimized for forming the respective layers. Incidentally, the heating boards were each a heating board made of a material for tungsten resistance heating.

Next, the pressure of a deposition chamber of the vacuum deposition device was reduced to $4 \times 10^{-4}$ Pa, and the heating boards having respective materials placed therein were electrically heated sequentially, and thereby the respective layers were formed as follows.

First, a heating board having α-NPD represented by the following structural formula, as a hole transporting/injecting material, placed therein was electrically heated to form a hole transporting/injecting layer 31 (which serves both as a hole injecting layer and as a hole transporting layer) consisting of α-NPD on the electrode layer 1b, which constitutes the transparent electrode 1. At this time, the deposition rate was 0.1 nm/sec to 0.2 nm/sec, and the film-thickness of the hole transporting/injecting layer 31 was 20 nm.

[Chemical Formula 69]

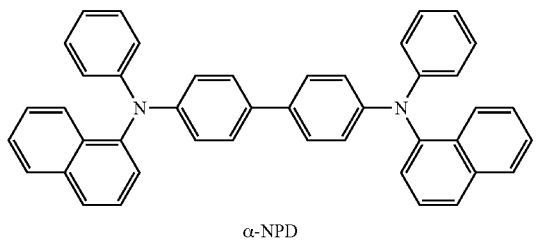

α-NPD

Next, a heating board having a host material H4 represented by a structural formula shown before placed therein and a heating board having a phosphorescent compound Ir-4 represented by a structural formula shown before placed therein were each independently electrically heated to form, on the hole transporting/injecting layer 31, an light emitting layer 32 consisting of the host material H4 and the phosphorescent compound Ir-4. At this time, the deposition rates of the two compounds were adjusted by adjusting the currents of the two heating boards so that the ratio of (host H4):(phosphorescent compound Ir-4)=10:6. Further, the film-thickness was 30 nm.

Next, a heating board having BAlq, as a hole blocking material, represented by the following formula placed therein was electrically heated to form, on the light emitting layer 32, a hole blocking layer 33 consisting of BAlq. At this time, the deposition rate was 0.1 nm/sec to 0.2 nm/sec, and the film-thickness was 10 nm.

[Chemical Formula 70]

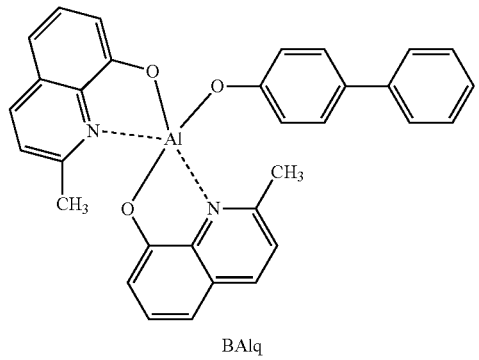

BAlq

Thereafter, a heating board having the compound 10, as an electron transporting material, represented by a structural formula shown before placed therein and a heating board having potassium fluoride placed therein were each independently electrically heated to form, on the hole blocking layer 33, an electron transporting layer 34 consisting of the compound 10 and potassium fluoride. At this time, the deposition rates of the two compounds were adjusted by adjusting the currents of the two heating boards so that the ratio of (the compound 10):(potassium fluoride)=75:25. Further, the film-thickness was 30 nm.

Next, a heating board having potassium fluoride, as an electron injecting material, placed therein was electrically heated to form, on the electron transporting layer 34, an electron injecting layer 35 consisting of potassium fluoride. At this time, the deposition rate was in a range of 0.01 nm/sec to 0.02 nm/sec, and the film-thickness was 1 nm.

Thereafter, the transparent substrate 13, on which the layers up to the electron injecting layer 35 had been formed, was transferred from the deposition chamber of the vacuum deposition device into a treatment chamber of a sputtering device while maintaining the vacuum state, wherein the treatment chamber of sputtering device has a target of ITO, as an opposite electrode material, amounted thereon. Thereafter, in the treatment chamber, the light transmissive opposite electrode 5-1 consisting of ITO and having a film-thickness of 150 nm was formed as the cathode at a film-forming rate of 0.3 nm/sec to 0.5 nm/sec. By performing the above process, the organic electroluminescence element EL was formed on the transparent substrate 13.

Thereafter, the organic electroluminescence element EL was covered by the sealing material 17 formed of a glass substrate and having a thickness of 300 μm, and, in a state where the organic electroluminescence element EL was enclosed by the sealing material 17, the gap between the sealing material 17 and the transparent substrate 13 was filled with the adhesive 19 (sealing material). An epoxy-based light curable adhesive (Lux track LC0629B, manufactured by Toa Gosei Co. Ltd.) was used as the adhesive 19.

Ultraviolet light was irradiated from the side of the glass substrate (i.e., the side of the sealing material 17) onto the adhesive 19 filled into the gap between the sealing material 17 and the transparent substrate 13 to thereby cure the adhesive 19 so as to seal the organic electroluminescence element EL.

Incidentally, in the formation of the organic electroluminescence element EL, a deposition mask was used to form each of the layers; in the transparent substrate 13 which had a size of (5 cm f 5 cm), the central area (4.5 cm×4.5 cm) was formed as a light-emitting region A, and a light non-emitting region B having a width of 0.25 cm was formed surrounding the light-emitting region A. Further, the transparent electrode 1 (which is the anode) and the opposite electrode 5-1 (which is the cathode) were formed into a shape such that the end portions of the transparent electrode 1 and the opposite electrode 5-1 were drawn out to the edge of the transparent substrate 13 in a state where the transparent electrode 1 and the opposite electrode 5-1 were insulated from each other by the light-emitting functional layer 3, which was configured by the layers from the hole transporting/injecting layer 31 to the electron injecting layer 35.

In such a manner, the organic electroluminescence element EL was arranged on the transparent substrate 13, and the both were sealed by the sealing material 17 and the adhesive 19, so that the light-emitting panel of each of Samples No. 1 to 21 was obtained. In each of the light-emitting panels, each emitted light h of different color emitted from the light emitting layer 32 were extracted from both the side of the transparent electrode 1 (i.e., the side of the transparent substrate 13) and the side of the opposite electrode 5-1 (i.e., the side of the sealing material 17).

<Evaluation of Each Sample of Example 2, Part 1>

Light transmittance of the organic electroluminescence element EL prepared using each of Samples No. 1 to 21 was measured. The measurement of the light transmittance was performed using a spectrophotometer (U-3300, manufactured by Hitachi Co., Ltd.) using a base material identical to the sample as a baseline. The results of the measurement are shown in Table 2.

<Evaluation of Each Sample of Example 2, Part 2>

Driving voltage of the organic electroluminescence element EL prepared using each of Samples No. 1 to 21 was measured. The results of the measurement are shown in Table 2. In the measurement of the driving voltage, front brightness on the side of the transparent electrode 1 (i.e., the side of the transparent substrate 13) of each organic electroluminescence element EL and front brightness on the side of the opposite electrode 5-1 (i.e., the side of the sealing material 17) of each organic electroluminescence element EL were measured, and the voltage at the time when the sum of the both front brightnesses was equal to 1000 cd/m$^2$ was measure as the driving voltage. Incidentally, the brightness was measured using a spectroradiometer CS-1000 (manufactured by Konica Minolta Sensing Inc.). The smaller the value of the obtained driving voltage is, the more preferable the result is.

TABLE 2

CONFIGURATION OF EXAMPLE TRANSPARENT ELECTRODE

| | | GROUND LAYER | | | ELECTRODE LAYER | | |
|---|---|---|---|---|---|---|---|
| SAMPLE | BASE MATERIAL | MATERIAL | FILM-THICKNESS (nm) | FILM-FORMING METHOD | MATERIAL | FILM-THICKNESS (nm) | FILM-FORMING METHOD |
| 1 | ALKALI-FREE GLASS | — | — | — | Ag | 5 | DEPOSITION |
| 2 | ↓ | — | — | — | ↓ | 8 | ↓ |
| 3 | ↓ | — | — | — | ↓ | 10 | ↓ |
| 4 | ↓ | — | — | — | ↓ | 15 | ↓ |
| 5 | ↓ | SiO2 | 25 | SPUTTERING | ↓ | 8 | ↓ |
| 6 | ↓ | spiro-DPVBi | ↓ | DEPOSITION | ↓ | ↓ | ↓ |
| 7 | ↓ | TPD | ↓ | ↓ | ↓ | ↓ | ↓ |
| 8 | ↓ | PORPHYRIN DERIVATIVE | ↓ | ↓ | ↓ | ↓ | ↓ |
| 9 | ↓ | COMPOUND99 | ↓ | ↓ | ↓ | ↓ | ↓ |
| 10 | ↓ | COMPOUND94 | ↓ | ↓ | ↓ | ↓ | ↓ |
| 11 | ↓ | COMPOUND10 | ↓ | ↓ | ↓ | 3 | ↓ |
| 12 | ↓ | ↓ | ↓ | ↓ | ↓ | 5 | ↓ |
| 13 | ↓ | ↓ | ↓ | ↓ | ↓ | 8 | ↓ |
| 14 | ↓ | ↓ | ↓ | ↓ | ↓ | 10 | ↓ |
| 15 | ↓ | COMPOUND112 | ↓ | ↓ | ↓ | 8 | ↓ |
| 16 | ↓ | ↓ | ↓ | COATING | ↓ | ↓ | ↓ |
| 17 | ↓ | COMPOUND10 | ↓ | DEPOSITION | AgCu | 5 | ↓ |
| 18 | ↓ | ↓ | ↓ | ↓ | ↓ | 8 | ↓ |
| 19 | PET | ↓ | ↓ | ↓ | Ag | ↓ | ↓ |
| 20 | ↓ | COMPOUND112 | ↓ | ↓ | ↓ | ↓ | ↓ |
| 21 | ↓ | ↓ | ↓ | COATING | ↓ | ↓ | ↓ |

| SAMPLE | CONFIGURATION OF EXAMPLE ELECTRONIC DEVICE | ELEMENT TRANSMISSION (% at 550 nm) | DRIVING VOLTAGE (V) | REMARK |
|---|---|---|---|---|
| 1 | ORGANIC ELECTRO-LUMINESCENCE ELEMENT | 24% | NO LIGHT EMISSION | COMPARISON |

TABLE 2-continued

| | | | | |
|---|---|---|---|---|
| 2 | ↓ | 36% | NO LIGHT EMISSION | COMPARISON |
| 3 | ↓ | 30% | 5.0 | COMPARISON |
| 4 | ↓ | 18% | 3.5 | COMPARISON |
| 5 | ↓ | 35% | NO LIGHT EMISSION | COMPARISON |
| 6 | ↓ | 37% | NO LIGHT EMISSION | COMPARISON |
| 7 | ↓ | 47% | 4.3 | PRESENT INVENTION |
| 8 | ↓ | 51% | 4.1 | PRESENT INVENTION |
| 9 | ↓ | 56% | 3.6 | PRESENT INVENTION |
| 10 | ↓ | 59% | 3.5 | PRESENT INVENTION |
| 11 | ↓ | 54% | 4.8 | PRESENT INVENTION |
| 12 | ↓ | 62% | 3.5 | PRESENT INVENTION |
| 13 | ↓ | 63% | 3.3 | PRESENT INVENTION |
| 14 | ↓ | 54% | 3.2 | PRESENT INVENTION |
| 15 | ↓ | 58% | 3.5 | PRESENT INVENTION |
| 16 | ↓ | 55% | 3.6 | PRESENT INVENTION |
| 17 | ↓ | 60% | 3.5 | PRESENT INVENTION |
| 18 | ↓ | 61% | 3.4 | PRESENT INVENTION |
| 19 | ↓ | 59% | 3.5 | PRESENT INVENTION |
| 20 | ↓ | 53% | 3.6 | PRESENT INVENTION |
| 21 | ↓ | 50% | 3.8 | PRESENT INVENTION |

<Evaluation Results of Example 2>

As can be obviously known from Table 2, the organic electroluminescence element in which the transparent electrode 1 of each of Samples No. 7 to 21 having the configuration of the present invention was used as the anode thereof had a light transmittance of 47% or higher, and a driving voltage of 4.8 V or less. In contrast, the organic electroluminescence element in which a transparent electrode of each of Samples No. 1 to 6 having no configuration of the present invention was used as the anode thereof either had a light transmittance of 38% or lower, or did not emit light although a voltage dad been applied.

Based on the above description, it is confirmed that the organic electroluminescence element using the transparent electrode having the configuration of the present invention can emit light with higher brightness with lower driving voltage. Further, based on the above description, it is confirmed that it is expected to reduce driving voltage and improve light-emitting lifetime for obtaining a given brightness.

EXPLANATION OF REFERENCE NUMERALS 1 transparent electrode
1a nitrogen-containing layer
1b electrode layer
EL, EL-1, EL-2, EL-3 organic electroluminescence element (electronic device)

The invention claimed is:
1. A transparent electrode comprising:
   a transparent base material;
   a nitrogen-containing layer consisting of a single compound containing nitrogen atom, wherein the nitrogen-containing layer is formed on the transparent base material; and
   an electrode layer formed on the nitrogen-containing layer and in contact with the nitrogen-containing layer, by using silver or an alloy having silver as a main component, the electrode layer having a first surface and a second surface on an opposite side of the first surface and configured such that the first surface is in contact with the nitrogen-containing layer and the second surface serves to face an opposite electrode,
   wherein the nitrogen-containing layer is in contact with the transparent base material, and
   the single compound containing nitrogen atom has a heterocycle with a nitrogen atom as a hetero atom.
2. The transparent electrode according to claim 1, wherein the single compound containing nitrogen atom includes a pyridine group.
3. The transparent electrode according to claim 1, wherein the single compound containing nitrogen atom is a compound represented by General Formula (1),

$$(Ar1)_{n1}\text{-}Y1 \qquad \text{General Formula (1)}$$

where
n1 represents an integer of 1 or greater, Y1 represents a substituent if n1 is equal to 1, or a bond or an n1-valent linking group if n1 is equal to or greater than 2;
Ar1 represents a group represented by below-mentioned General Formula (A), and if n1 is equal to or greater than 2, a plurality of pieces of Ar1 may either be the same, or be different from each other;
the compound represented by General Formula (1) has, in the molecule, at least two condensed aromatic heterocycles each formed by condensing three or more rings,

GENERAL FORMULA (A)

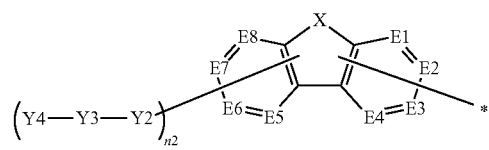

where
X represents —N(R)—, —O—, —S— or —Si(R)(R')—, and E1 to E8 each represent —C(R1)= or —N=, wherein R, R' and R1 each represent a hydrogen atom, a substituent or a linking site with Y1;
* represents a linking site with Y1, and Y2 represents a bond or a divalent linking group;
Y3 and Y4 each represent a group derived from a 5-membered or 6-membered aromatic ring, wherein at least one of Y3 and Y4 represents a group derived from an aromatic heterocycle containing a nitrogen atom as a ring constituent atom: and n2 represents an integer of 1 to 4.

4. The transparent electrode according to claim 3, wherein the compound represented by General Formula (1) is a compound represented by General Formula (2),

GENERAL FORMULA (2)

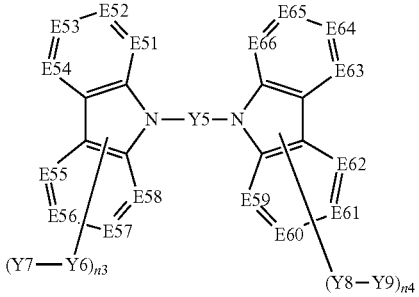

where
Y5 represents a divalent linking group which is an arylene group, a heteroarylene group or a combination of the arylene group and the heteroarylene group;
E51 to E66 each represent —C(R3)= or —N=, wherein R3 represents a hydrogen atom or a substituent; Y6 to Y9 each represent a group derived from an aromatic hydrocarbon ring or a group derived from an aromatic heterocycle, wherein at least one of Y6 and Y7 and at least one of Y8 and Y9 each represent a group derived from an aromatic heterocycle containing a nitrogen atom; and
n3 and n4 each represent an integer of 0 to 4, wherein the sum of n3 and n4 is 2 or more.

5. The transparent electrode according to claim 4, wherein the compound represented by General Formula (2) is a compound represented by General Formula (3),

GENERAL FORMULA (3)

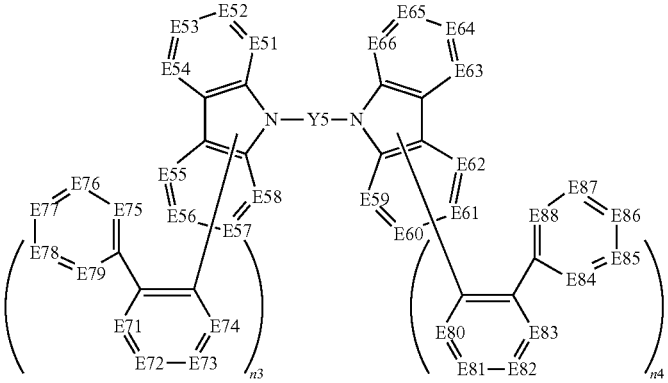

where
Y5 represents a divalent linking group which is an arylene group, a heteroarylene group or a combination of the arylene group and the heteroarylene group;
E51 to E66 and E71 to E88 each represent —C(R3)= or —N=, wherein R3 represents a hydrogen atom or a substituent, and wherein at least one of E71 to E79 and at least one of E80 to E88 each represent —N=; and
n3 and n4 each represent an integer of 0 to 4, wherein the sum of n3 and n4 is 2 or more.

6. The transparent electrode according to claim 1, wherein the film-thickness of the electrode layer is in a range between 4 nm to 9 nm.

7. The transparent electrode according to claim 1, wherein the transparent base material comprises a glass or resin layer formed with an inorganic material coat, an organic material coat, or a hybrid coat.

8. The transparent electrode according to claim 1, wherein the nitrogen-containing layer has neither electron transporting performance nor electron injection performance.

9. The transparent electrode according to claim 1, wherein the heterocycle of the single compound containing nitrogen atom is aziridine, azirine, azetidine, azete, azolidine, azole, piperidine, pyridine, azepane, azepine, imidazole, pyrazole, oxazole, thiazole, imidazoline, pyrazine, morpholine, thiazine, indole, isoindole, benzimidazole, purine, quinoline, isoquinoline, quinoxaline, cinnoline, pteridine, acridine, carbazole, benzo-C-cinnoline, porphyrin, chlorine, or choline.

10. An electronic device comprising:
the transparent electrode described in claim 1; and
a functional layer on the electrode layer of the transparent electrode.

11. The electronic device according to claim 10, wherein the electronic device is an organic electroluminescence element.

12. The electronic device according to claim 11, wherein the electrode layer is sandwiched by the functional layer and the nitrogen-containing layer.

* * * * *